US010236387B2

(12) United States Patent
Shionoiri et al.

(10) Patent No.: US 10,236,387 B2
(45) Date of Patent: Mar. 19, 2019

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Yutaka Shionoiri, Isehara (JP); Shuhei Nagatsuka, Atsugi (JP); Hideki Uochi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/262,660

(22) Filed: Sep. 12, 2016

(65) Prior Publication Data
US 2017/0084754 A1    Mar. 23, 2017

(30) Foreign Application Priority Data

Sep. 18, 2015 (JP) ................................ 2015-185539
Sep. 25, 2015 (JP) ................................ 2015-187874

(51) Int. Cl.
*H01L 29/786* (2006.01)
*H01L 27/12* (2006.01)
(Continued)

(52) U.S. Cl.
CPC .... *H01L 29/78648* (2013.01); *H01L 21/4825* (2013.01); *H01L 21/4842* (2013.01); *H01L 21/565* (2013.01); *H01L 21/78* (2013.01); *H01L 22/14* (2013.01); *H01L 23/3114* (2013.01); *H01L 23/4952* (2013.01);
(Continued)

(58) Field of Classification Search
CPC ............. H01L 29/7869; H01L 27/1225; H01L 27/124; H01L 29/78696; H01L 29/6696
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Tony Tran
(74) *Attorney, Agent, or Firm* — Robinson Intellectual Property Law Office; Eric J. Robinson

(57) ABSTRACT

In a logic circuit including transistors with the same conductivity, a reduction in output voltage is prevented with use of at least three transistors and a capacitor. With use of an oxide semiconductor in a semiconductor layer of the transistor, a logic circuit with high output voltage and high withstand voltage is achieved. With use of the logic circuit, a semiconductor device with high output voltage and high withstand voltage is achieved.

14 Claims, 41 Drawing Sheets

(51) Int. Cl.
  *H01L 21/78* (2006.01)
  *H01L 21/48* (2006.01)
  *H01L 21/56* (2006.01)
  *H01L 23/544* (2006.01)
  *H01L 21/66* (2006.01)
  *H01L 23/495* (2006.01)
  *H01L 23/31* (2006.01)
  *H01L 27/32* (2006.01)
  *H05B 33/08* (2006.01)

(52) U.S. Cl.
  CPC .. *H01L 23/49513* (2013.01); *H01L 23/49555* (2013.01); *H01L 23/544* (2013.01); *H01L 27/124* (2013.01); *H01L 27/1225* (2013.01); *H01L 27/1255* (2013.01); *H01L 29/7869* (2013.01); *H01L 27/3262* (2013.01); *H01L 2223/54486* (2013.01); *H05B 33/089* (2013.01); *H05B 33/0815* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,547,771 B2 | 10/2013 | Koyama |
| 8,988,152 B2 * | 3/2015 | Ohmaru ............. H01L 27/1225 326/119 |
| 9,083,335 B2 | 7/2015 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 * | 10/2006 | Kimura ................. G09G 3/20 315/169.3 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0049806 A1 * | 2/2013 | Koyama ........... H03K 19/09441 326/68 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-639117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID DIGEST '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID DIGEST '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review, B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "SPINEL YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-267.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 17A1
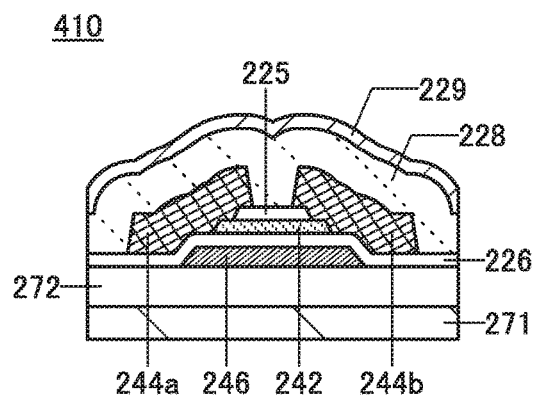
FIG. 17A2
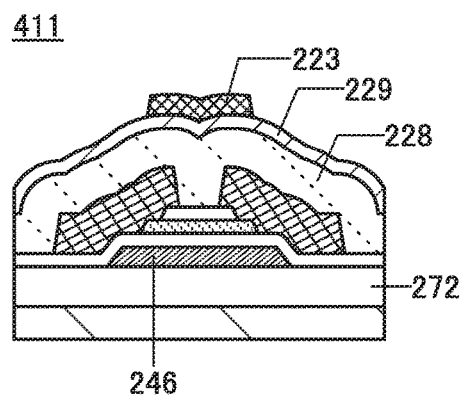
FIG. 17B1
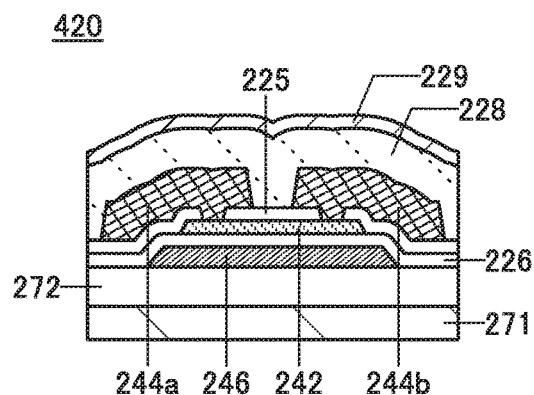
FIG. 17B2
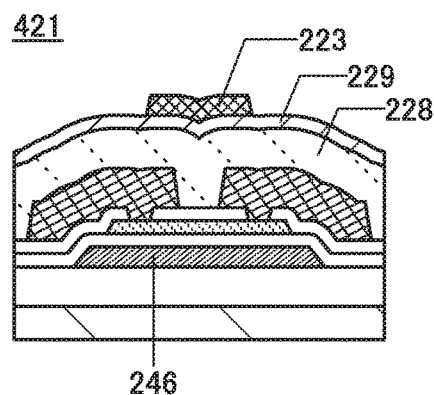
FIG. 17C1
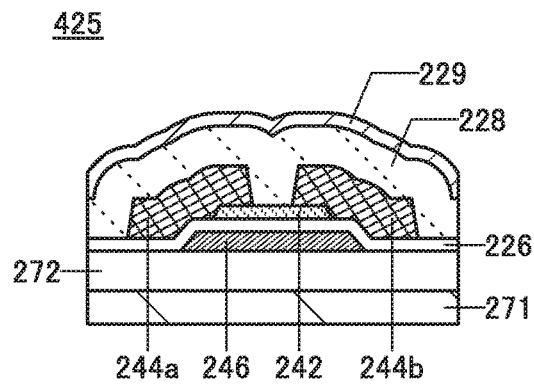
FIG. 17C2
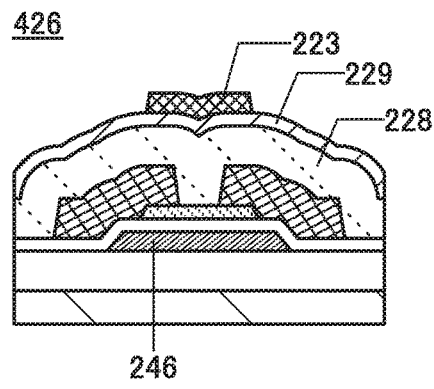

FIG. 18A1
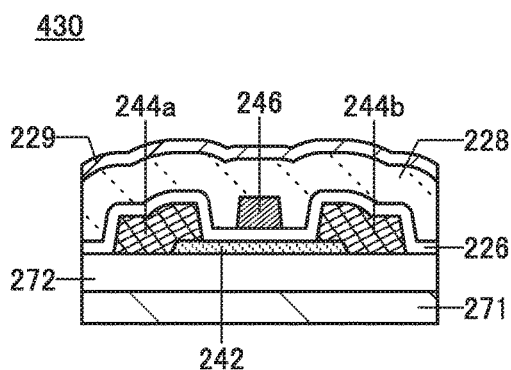
FIG. 18A2
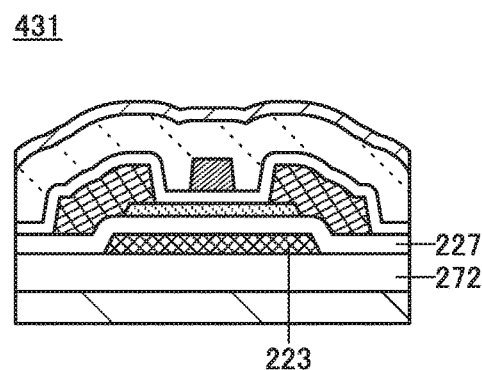
FIG. 18A3
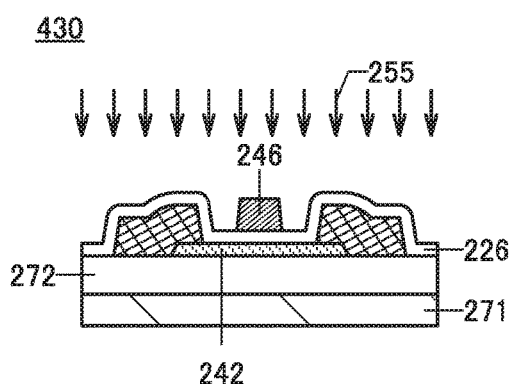
FIG. 18B1
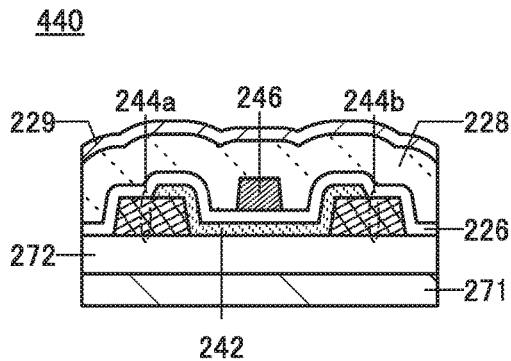
FIG. 18B2
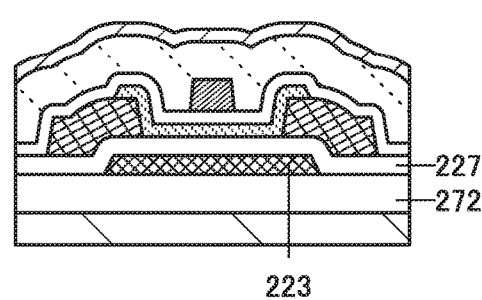

FIG. 19A1
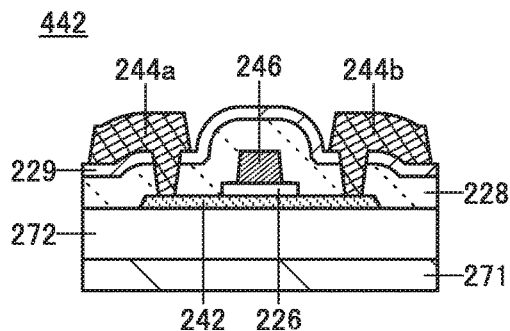
FIG. 19A2
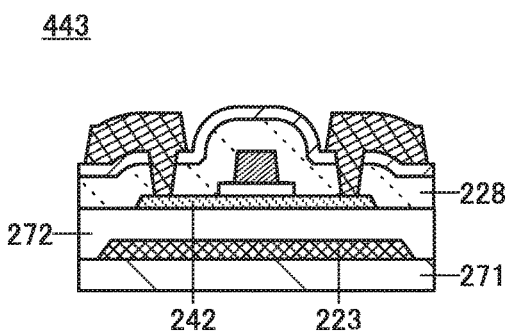
FIG. 19A3
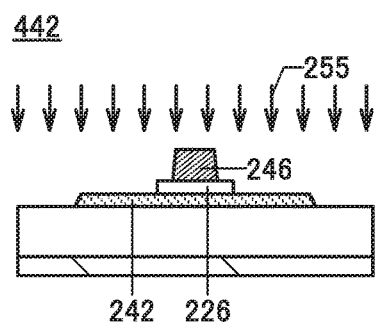
FIG. 19B1
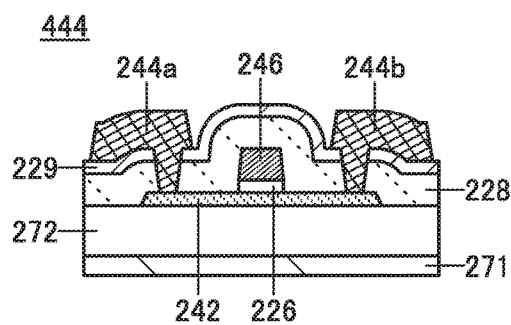
FIG. 19B2
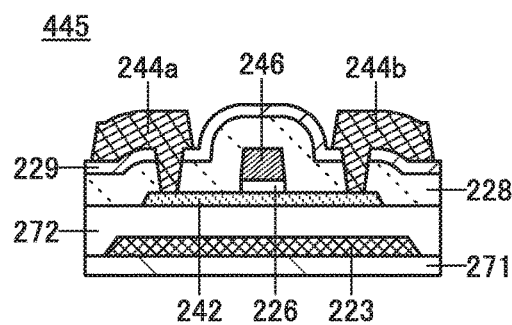
FIG. 19C1
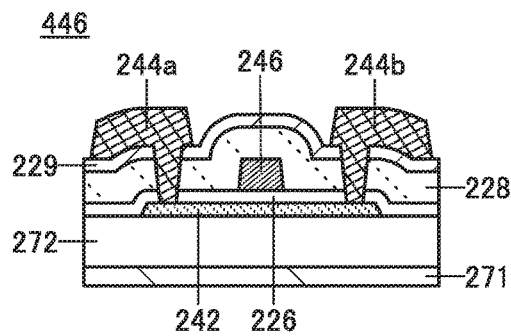
FIG. 19C2
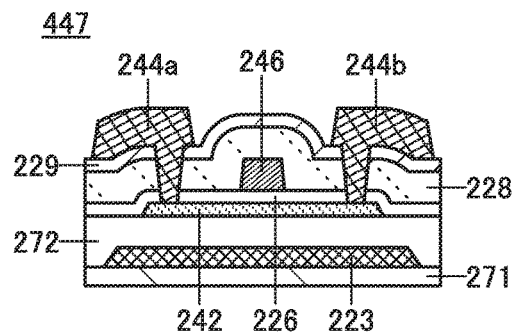

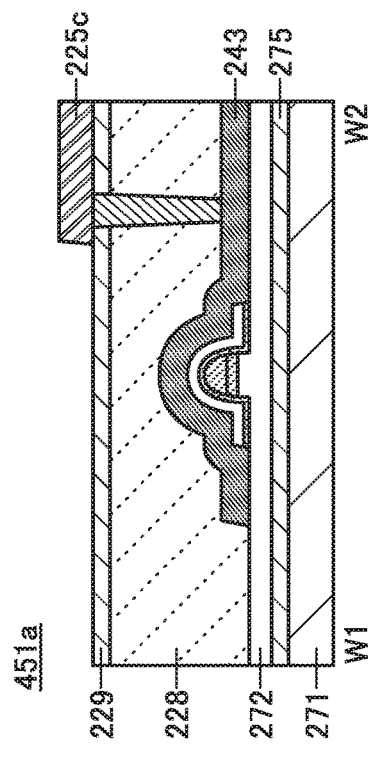
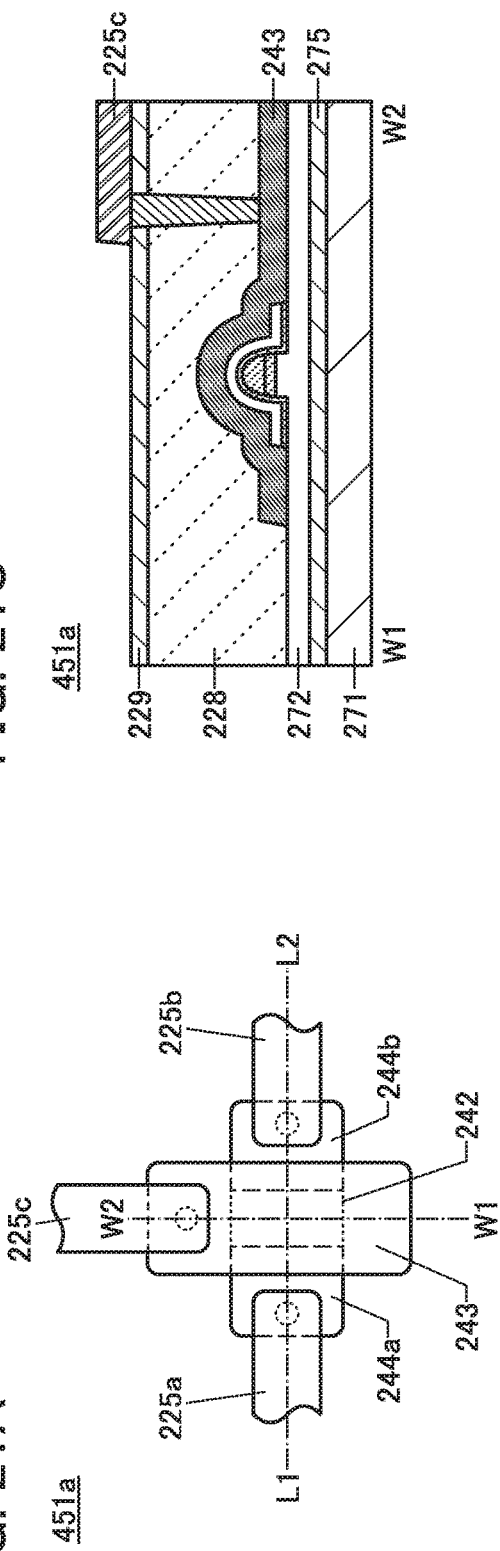
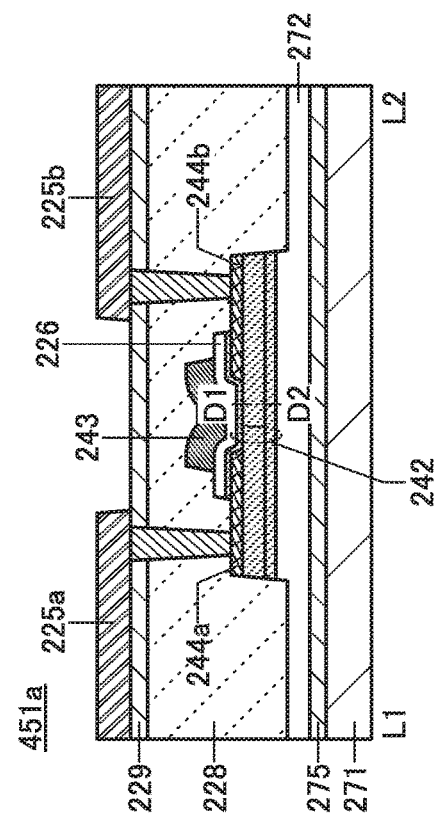

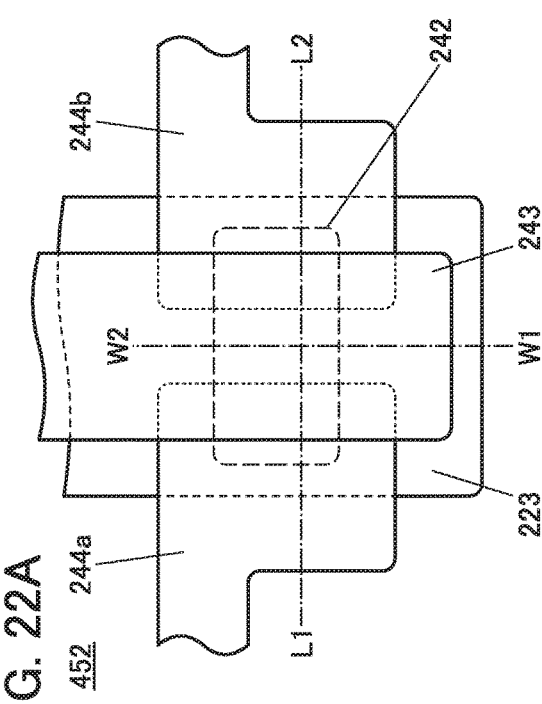
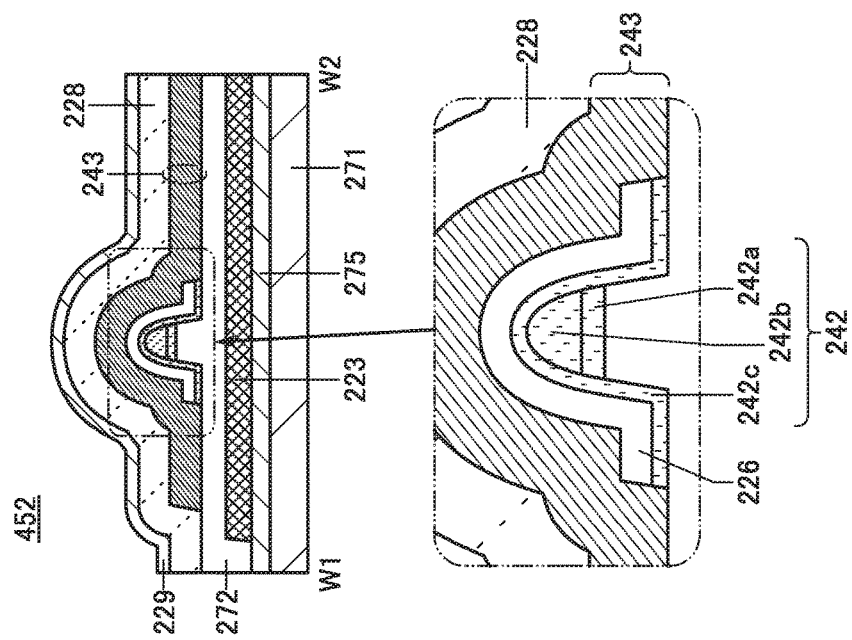
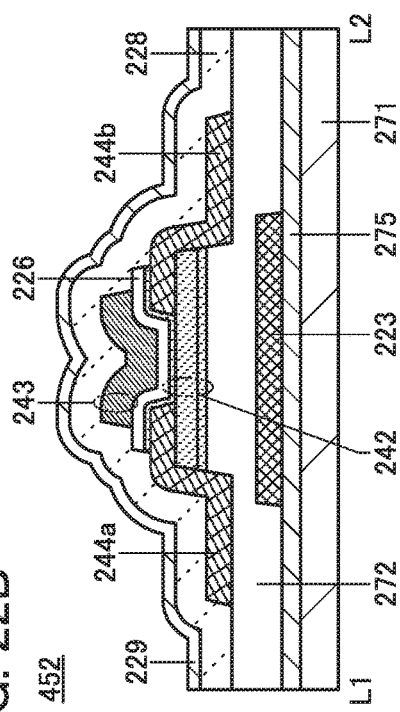
FIG. 22A
FIG. 22B
FIG. 22C

454a

454a

454a

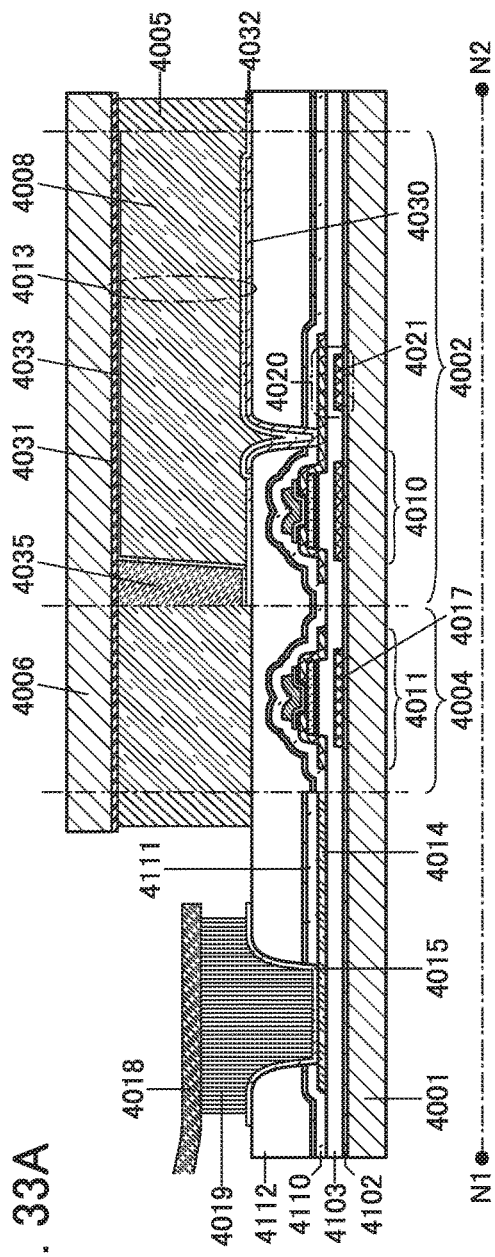
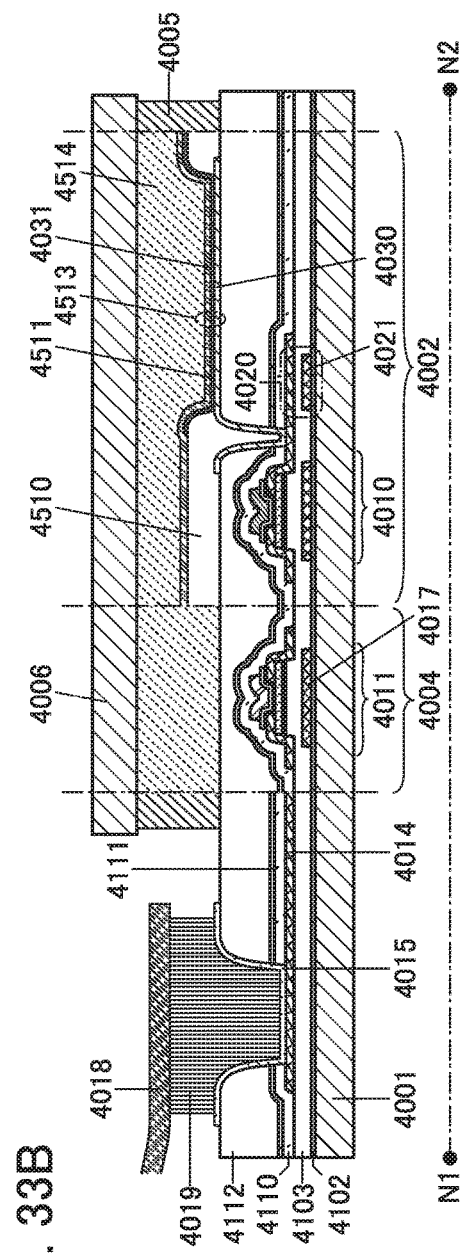
FIG. 33A
FIG. 33B

1100

1200

SEMICONDUCTOR DEVICE AND ELECTRONIC DEVICE

BACKGROUND OF THE INVENTION

1. Field of the Invention

One embodiment of the invention disclosed in this specification and the like relates to an object, a method, or a manufacturing method. In addition, one embodiment of the invention disclosed in this specification and the like relates to a process, a machine, manufacture, or a composition of matter. In particular, one embodiment of the invention disclosed in this specification and the like relates to a semiconductor device and an electronic device including the semiconductor device.

In this specification and the like, a semiconductor device generally means a device that can function by utilizing semiconductor characteristics. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

In recent years, transistors including an oxide semiconductor (OS) for a semiconductor layer where a channel is formed (the transistor is also referred to as "OS transistor") have attracted attention. An oxide semiconductor can be formed by a sputtering method or the like, and thus, for example, can be used for a semiconductor layer of a transistor in a large display device. In addition, there is an advantage that capital investment can be reduced because the OS transistor can be utilized for part of retrofitted production equipment for a transistor including amorphous silicon in a semiconductor layer where a channel is formed.

The OS transistor is known to have an extremely low leakage current in an off state. For example, a low-power-consumption CPU and the like utilizing the characteristics that a leakage current of the OS transistor is extremely low is disclosed (see Patent Document 1).

REFERENCE

Patent Document

[Patent Document 1] Japanese Published Patent Application No. 2012-257187

SUMMARY OF THE INVENTION

However, it is known that a p-channel transistor is hardly formed with the OS transistor. Thus, for forming a logic circuit using only OS transistors, it is necessary to form a logic circuit configured with transistors with the same conductivity, i.e., transistors included in the logic circuit are all either p-channel transistors or n-channel transistors (the logic circuit is referred to as unipolar logic circuit in this specification and the like).

Even if the p-channel transistor can be formed, the number of manufacturing steps is increased by formation of a p-channel transistor and an n-channel transistor over one substrate, which causes an increase in manufacturing cost and a reduction in productivity of semiconductor devices. Thus, it is preferable that thin-film transistors formed over one substrate have the same conductivity. Note that in the unipolar logic circuit configured with transistors with the same conductivity, there is a problem that the output voltage decreases by a threshold voltage (also referred to as $V_{th}$) of the transistors.

An object of one embodiment of the present invention is to provide a semiconductor device or the like allowing high productivity. Another object of one embodiment of the present invention is to provide a semiconductor device or the like with low power consumption. Another object is to provide a highly reliable semiconductor device or the like. Another embodiment of the present invention is to provide a semiconductor device including a unipolar logic circuit or the like, whose output voltage hardly decreases. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

In the logic circuit configured with transistors having the same conductivity, a reduction in output voltage is prevented with use of at least three transistors and a capacitor. Furthermore, with use of an oxide semiconductor for a semiconductor layer of a transistor, a logic circuit with high output voltage and high withstand voltage is achieved. Furthermore, with use of the logic circuit, a semiconductor device with high output voltage and high withstand voltage is achieved.

One embodiment of the present invention is a semiconductor device including a first transistor, a second transistor, a third transistor, and a capacitor, in which the first transistor includes a first gate and a second gate, in which one of a source and a drain of the first transistor is electrically connected to a first wiring, in which the other of the source and the drain of the first transistor is electrically connected to the first gate of the first transistor, in which the second gate of the first transistor is electrically connected to a fourth wiring, in which one of a source and a drain of the second transistor is electrically connected to the other of the source and the drain of the first transistor, in which the other of the source and drain of the second transistor is electrically connected to a second wiring, in which one of a source and a drain of the third transistor is electrically connected to a third wiring, in which the other of the source and the drain of the third transistor is electrically connected to one of electrodes of the capacitor, in which a gate of the third transistor is electrically connected to the third wiring, and in which the other electrode of the capacitor is electrically connected to the other of the source and the drain of the first transistor.

Another embodiment of the present invention is a semiconductor device including a first transistor, a second transistor, a third transistor, and a capacitor, in which the first transistor and the third transistor each include a first gate and a second gate, in which one of a source and a drain of the first transistor is electrically connected to a first wiring, in which the other of the source and the drain of the first transistor is electrically connected to the first gate of the first transistor, in which the second gate of the first transistor is electrically connected to a fourth wiring, in which one of a source and a drain of the second transistor is electrically connected to the other of the source and the drain of the first transistor, in which the other of the source and the drain of the second transistor is electrically connected to a second wiring, in which one of a source and a drain of the third transistor is electrically connected to a third wiring, in which the other of the source and the drain of the third transistor is electrically connected to one of electrodes of the capacitor, in which the first gate of the third transistor is electrically connected to the third wiring, in which the second gate of the third transistor is electrically connected to the other of the source and the drain of the third transistor, and in which the other electrode of the capacitor is electrically connected to the other of the source and the drain of the first electrode.

Another embodiment of the present invention is a semiconductor device including a first transistor, a second transistor, a third transistor, a fourth transistor, and a capacitor, in which the first transistor includes a first gate and a second gate, in which one of a source and a drain of the first transistor is electrically connected to a first wiring, in which the other of the source and the drain of the first transistor is electrically connected to the first gate of the first transistor, in which the second gate of the first transistor is electrically connected to a second wiring, in which one of a source and a drain of the second transistor is electrically connected to the other of the source and the drain of the first transistor, in which the other of the source and the drain of the second transistor is electrically connected to a third wiring, in which one of a source and a drain of the third transistor is electrically connected to a fourth wiring, in which the other of the source and the drain of the third transistor is electrically connected to one of electrodes of the capacitor, in which a gate of the third transistor is electrically connected to the fourth wiring, in which the other electrode of the capacitor is electrically connected to the other of the source and the drain of the first transistor, in which one of a source and a drain of the fourth transistor is electrically connected to the other of the source and the drain of the third transistor, in which the other of the source and the drain of the fourth transistor is electrically connected to the second wiring, and in which a gate of the fourth transistor is electrically connected to a gate of the second transistor.

One of the first gate and the second gate of the first transistor can function as a gate, and the other can function as a back gate. One of the first gate and the second gate of the third transistor can function as a gate, and the other can function as a back gate.

At least one of the first transistor and the second transistor is preferably a transistor including an oxide semiconductor in a semiconductor layer in which a channel is formed.

A semiconductor device or the like with high productivity can be provided. Alternatively, a semiconductor device or the like with low power consumption can be provided. Alternatively, a highly reliable semiconductor device or the like can be provided. Alternatively, a semiconductor device or the like including a unipolar logic circuit whose output voltage hardly decreases can be provided. Alternatively, a novel semiconductor device or the like can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 17A1, 17A2, 17B1, 17B2, 17C1, and 17C2 each illustrate an example of a transistor.
FIGS. 18A1, 18A2, 18A3, 18B1, and 18B2 each illustrate an example of a transistor.
FIGS. 19A1, 19A2, 19A3, 19B1, 19B2, 19C1, and 19C2 each illustrate an example of a transistor.
FIGS. 21A to 21C illustrate an example of a transistor.
FIGS. 22A to 22C illustrate an example of a transistor.
FIGS. 33A and 33B each illustrate an example of a display device.

DETAILED DESCRIPTION OF THE INVENTION

Figure 1A:
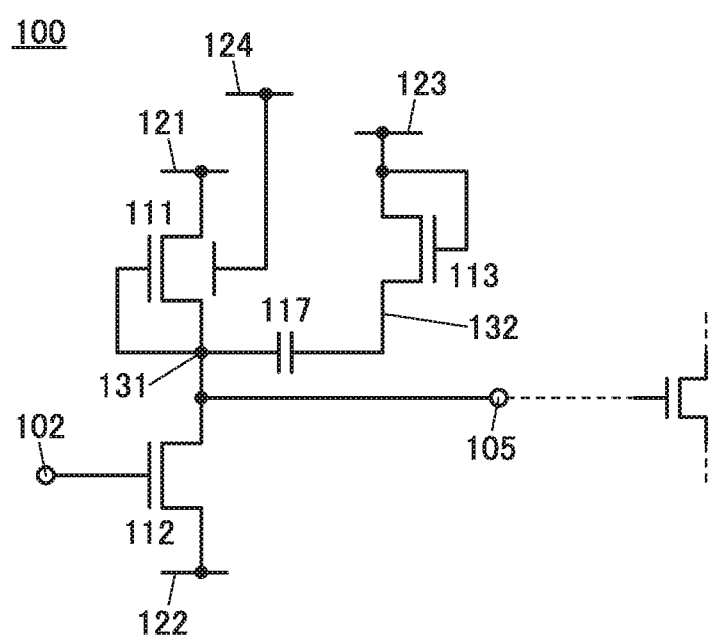
FIGS. 1A and 1B are each a circuit diagram illustrating a semiconductor device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like disclosed in the drawings and the like.

In the drawings, some components might not be illustrated for easy understanding of the invention. In addition, some hidden lines and the like might not be shown.

Note that ordinal numbers such as "first" and "second" and the like in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of the source and the drain might be switched depending on operation conditions, e.g., when a transistor having a different polarity is employed or a direction of current flow is changed in circuit operation. Thus, the terms "source" and "drain" can be switched in this specification.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (also referred to as an "effective channel width") is different from a channel width shown in a top view of a transistor (also referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

A transistor described in this specification and the like refers to an enhancement (normally-off) field-effect transistor unless otherwise specified.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" or "orthogonal" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In the specification and the like, the terms "identical," "the same," "equal," "uniform," and the like (including synonyms thereof) used in describing calculation values and actual measurement values allow for a margin of error of ±20% unless otherwise specified.

In this specification, in the case where an etching step is performed after a photolithography process, a resist mask formed in the photolithography process is removed after the etching step, unless otherwise specified.

In this specification and the like, a high power supply potential $V_{DD}$ (hereinafter also simply referred to as $V_{DD}$ or H potential) is a power supply potential higher than a low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

A voltage usually refers to a potential difference between a given potential and a reference potential (e.g., a ground potential (GND potential) or a source potential). Potentials are relative values, and a potential supplied to a wiring or the like is sometimes changed depending on the reference potential. Thus, a voltage can be referred to as a potential and vice versa in some cases. In this specification and the like, $V_{SS}$ is referred to as a reference potential unless otherwise specified.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, trigonal and rhombohedral crystal systems are included in a hexagonal crystal system.

(Embodiment 1)

In this embodiment, a semiconductor device 100 of one embodiment of the present invention will be described with reference to drawings. FIG. 1A is a circuit diagram illustrating a structure of the semiconductor device 100.

<Structure Example of Semiconductor Device 100>

The semiconductor device 100 includes transistors 111 to 113 and a capacitor 117. The transistors 111 to 113 are each an n-channel transistor including a source, a drain, and a gate. The transistor 111 includes a back gate in addition to the gate. The transistor 112 and/or the transistor 113 can be provided with a back gate.

The gate and the back gate are located so that a channel formation region in a semiconductor layer is sandwiched therebetween. Thus, the back gate can function in a manner similar to that of the gate. The potential of the back gate may be the same as that of the gate or may be a ground (GND) potential or a predetermined potential. By changing the potential of the back gate independently of the potential of the gate, the threshold voltage of the transistor can be changed. In this specification and the like, one of the gate and the back gate is referred to as a "first gate", and the other is referred to as a "second gate".

In the semiconductor device 100, one of the source and the drain of the transistor 111 is electrically connected to a wiring 121, and the other of the source and the drain is electrically connected to a node 131. One of the first gate and the second gate of the transistor 111 is electrically connected to the node 131, and the other of the first gate and the second gate is electrically connected to a wiring 124. One of the source and the drain of the transistor 112 is electrically connected to the node 131, and the other of the source and the drain is electrically connected to a wiring 122. The gate of the transistor 112 is electrically connected to a terminal 102. One of the source and the drain of the transistor 113 is electrically connected to a wiring 123, and the other of the source and the drain is electrically connected to a node 132. The gate of the transistor 113 is electrically connected to the one of the source and the drain of the transistor 113. One of electrodes of the capacitor 117 is electrically connected to the node 131, and the other electrode is electrically connected to the node 132. The node 131 is electrically connected to a terminal 105. The terminal 105 is connected to an element with high input impedance, such as a capacitor or a gate of the transistor.

Figure 2A:
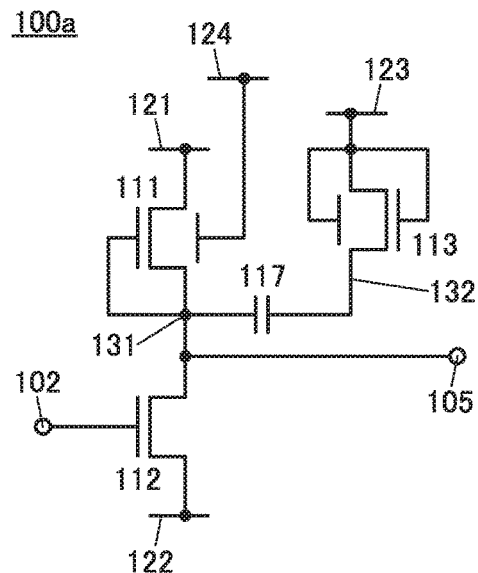
FIGS. 2A to 2D are each a circuit diagram illustrating a semiconductor device.

As shown in a semiconductor device 100a of a circuit diagram in FIG. 2A, the transistor 113 may be provided with a back gate, and the back gate may be electrically connected to the one of the source and the drain of the transistor 113.

Figure 2B:
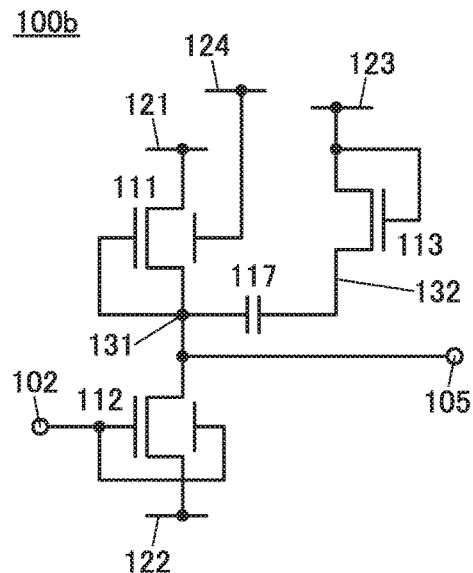

As shown in a semiconductor device 100b of a circuit diagram in FIG. 2B, the transistor 112 may be provided with a back gate, and the back gate may be electrically connected to the gate of the transistor 112.

Figure 2C:
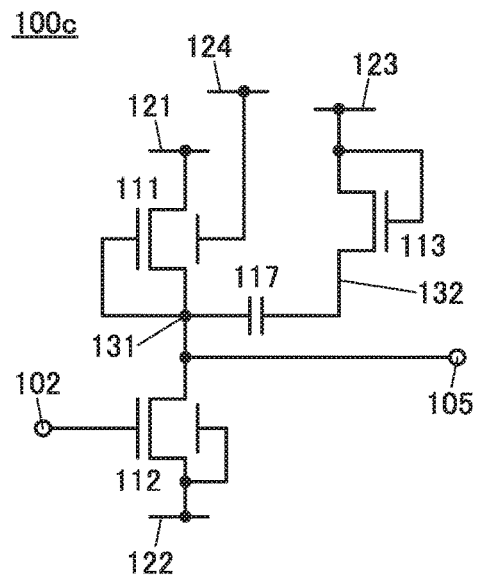

As shown in a semiconductor device 100c of a circuit diagram in FIG. 2C, the transistor 112 may be provided with a back gate, and the back gate may be electrically connected to the other of the source and the drain of the transistor 112.

Figure 2D:
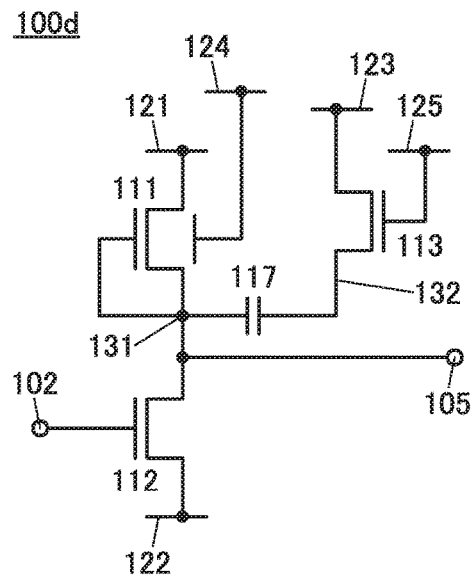

As shown in a semiconductor device 100d of a circuit diagram in FIG. 2D, the gate of the transistor 113 may be connected to a wiring 125 instead of being connected to the one of the source and the drain of the transistor 113. With a potential supplied to the wiring 125, turning on/off the transistor 113 can be controlled, so that the node 132 can be set to have a given potential.

In the transistor provided with the back gate in addition to the gate, a region where carrier flows is enlarged in the film thickness direction when the transistor is in an on state; that is, the number of transferred carriers is increased. As a result, the on-state current and the field-effect mobility of the transistor are increased. Thus, when the transistor includes the back gate, the area occupied by the transistor can be small for required on-state current. Furthermore, the semiconductor layer is covered with the gate and the back gate, the influence of external electric field on the channel formation region can be reduced, and the reliability of the semiconductor device can be improved. Note that the back gate will be described below in detail.

There is no particular limitation on a semiconductor material used for a semiconductor layer where a channel is formed in each of the transistors 111 to 113. A transistor in which a semiconductor layer including a channel is formed using an oxide semiconductor (the transistor is also referred to as "OS transistor") is preferably used as the transistors 111 to 113. The oxide semiconductor has a band gap of 2 eV or more; therefore, a transistor including an oxide semiconductor in a semiconductor layer in which a channel is formed has an extremely low off-state current. An OS transistor has high withstand voltage between its source and drain. With use of the OS transistor, a semiconductor device with high output voltage and high withstand voltage can be provided. In particular, it is preferable that an OS transistor be used for at least one of the transistor 111 and the transistor 112 or be used for both of them.

It is preferable that the capacitance of the capacitor 117 be larger than that generated between the gate and the source of the transistor 113. Furthermore, it is preferable that the capacitance generated between the gate and the source of the transistor 113 be larger than that generated between the gate and the source of the transistor 111.

<Operation Example of Semiconductor Device 100>

The semiconductor device 100 can function as an inverter circuit. Specifically, when the H potential is inputted to the terminal 102, the L potential is outputted from the terminal 105, and when the L potential is inputted to the terminal 102, the H potential is outputted from the terminal 105.

An operation example of the semiconductor device 100 is described with reference to a timing chart in FIG. 3 and circuit diagrams shown in FIGS. 4A and 4B, FIGS. 5A and 5B, and FIG. 6. In this embodiment, the threshold voltages of the transistors 111 to 113 are the same as each other. In addition, $V_{th}$ is higher than 0 V and lower than the value, $(V_{DD}-V_{SS})/2$. The H potential $(V_{DD})$ is supplied to the wiring 121, and the L potential $(V_{SS})$ is supplied to the wiring 122. To the wiring 124, an inverted signal of a signal inputted to the terminal 102 is inputted. For example, when the H potential is inputted to the terminal 102, the L potential is inputted to the wiring 124.

Figure 1B:
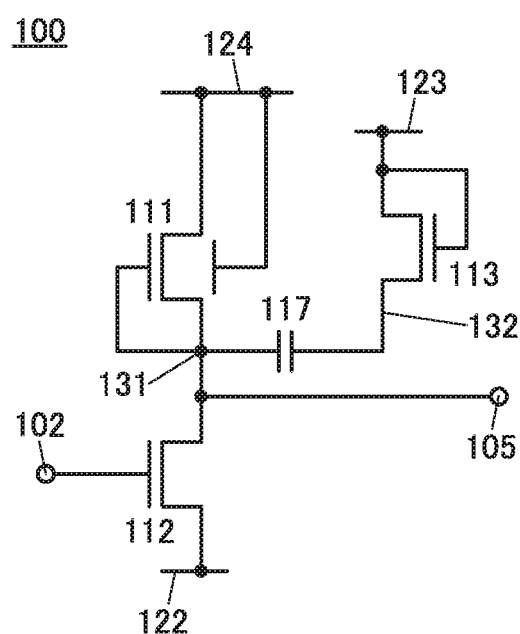

Note that an inverted signal of a signal inputted to the terminal 102 may be inputted to the wiring 121. In this case, the wiring 121 may be omitted, and the one of the source and the drain of the transistor 111 may be electrically connected to the wiring 124 (see FIG. 1B).

Figure 4A:
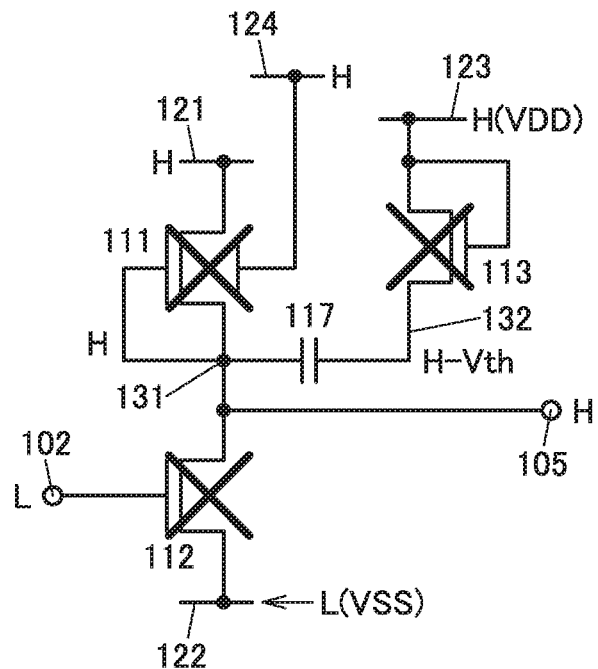
FIGS. 4A and 4B are each a circuit diagram illustrating operation of a semiconductor device.
Figure 4B:
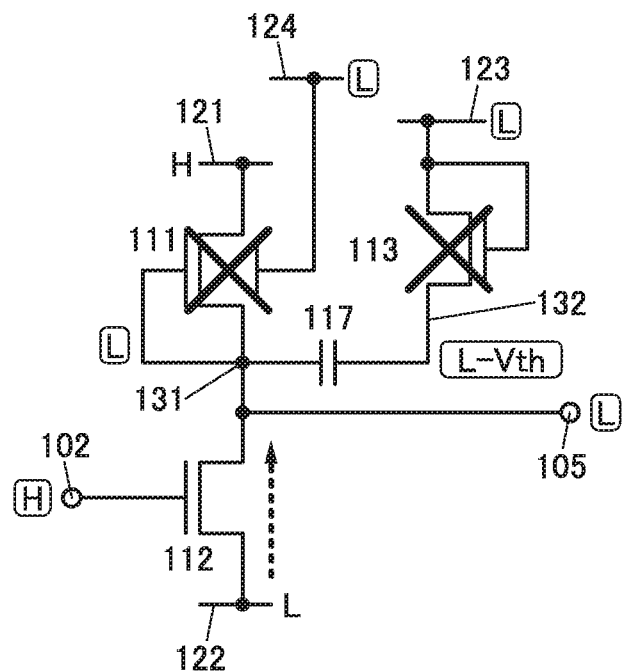
Figure 5A:
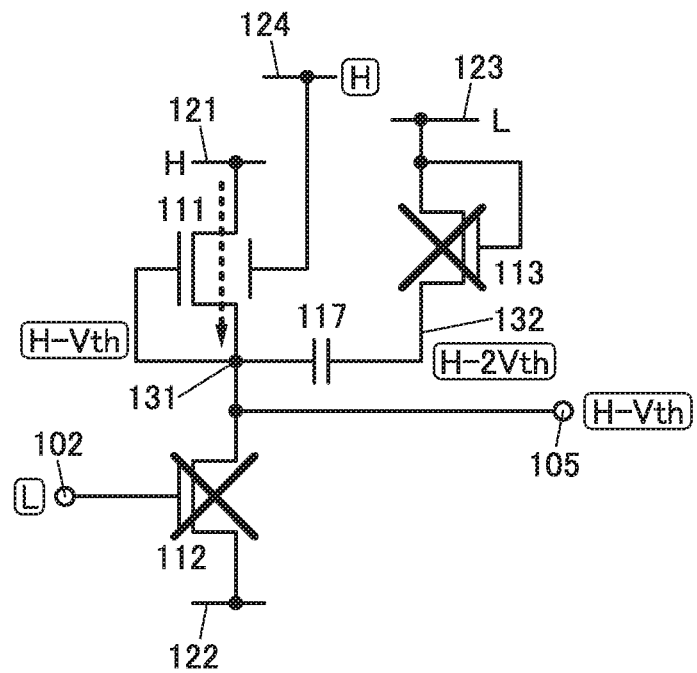
FIGS. 5A and 5B are each a circuit diagram illustrating operation of a semiconductor device.
Figure 5B:
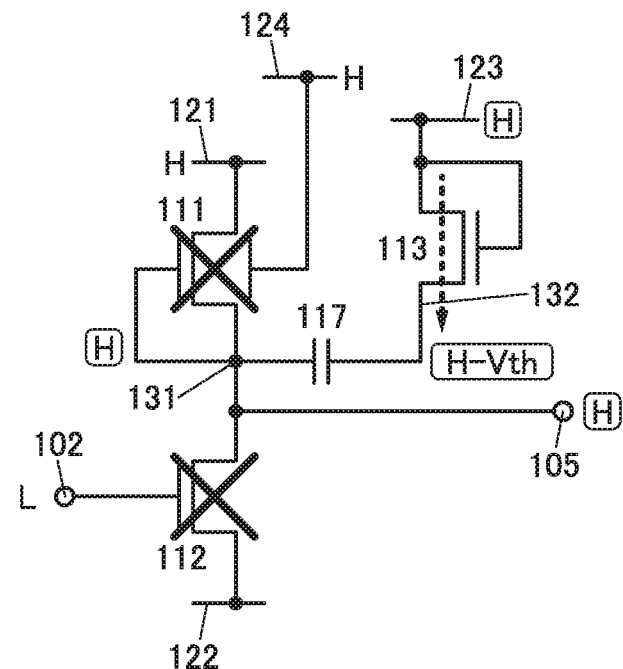
Figure 6:
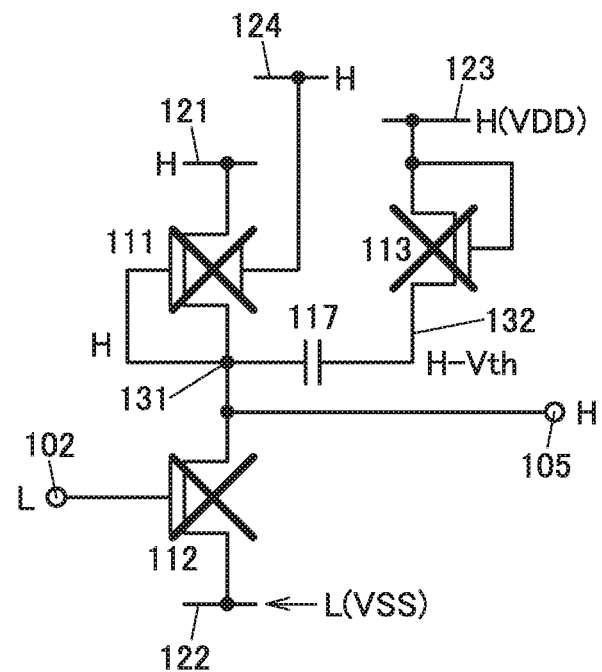
FIG. 6 is a circuit diagram illustrating operation of a semiconductor device.

FIG. 4A shows a state of the semiconductor device 100 immediately before a time T1, as an initial state. In FIG. 4A, the transistors 111 to 113 are in an off state, the potential of the node 131 is the H potential, and the potential of the node 132 is H–$V_{th}$. Furthermore, the L potential is inputted to the terminal 102.

[Period 151: H-potential-input Period]

At the time T1, the H potential is inputted to the terminal 102, the L potential is inputted to the wiring 124, and the L potential is inputted to the wiring 123. Thus, the transistor 112 is turned on. When the transistor 112 is turned on, the potential of the node 131 becomes the L potential, and the L potential is outputted from the terminal 105. When the potential of the node 131 becomes the L potential, the potential of the node 132 that is connected to the node 131 via the capacitor 117 becomes L–$V_{th}$ (see FIG. 4B). The preferable timing of inputting the H potential to the terminal 102 is after the L potential is inputted to the wiring 123.

[Period 152: L-potential-input Period]

At a time T2, the L potential is inputted to the terminal 102, and the H potential is inputted to the wiring 124. Then, the transistor 112 is turned off, and the transistor 111 is turned on. After that, the potential of the node 131 becomes H–$V_{th}$. The potential of the node 132 that is connected to the node 131 via the capacitor 117 becomes H–2×$V_{th}$ (see FIG. 5A).

At a time T3, the H potential is supplied to the wiring 123. Then, the transistor 113 is turned on, and the potential of the node 132 becomes H–$V_{th}$. At this time, the potential of the node 132 increases by $V_{th}$ that is a potential difference between H–2×$V_{th}$ and H–$V_{th}$. The potential of the node 131 that is connected to the node 132 via the capacitor 117 also increases by $V_{th}$. Thus, the potential of the node 131 becomes the H potential (see FIG. 5B). In the above manner, the H potential is supplied from the terminal 105. The potentials of the first gate, the second gate, the source, and the drain in the transistor 111 each become the H potential, and thus, the transistor 111 is turned off As shown in a time T4 in FIG. 6, when the potential of the node 132 becomes H–$V_{th}$, the transistor 113 is turned off.

This embodiment can be implemented in appropriate combination with any of the structures described in the other embodiments and the like.

(Embodiment 2)

Figure 7A:
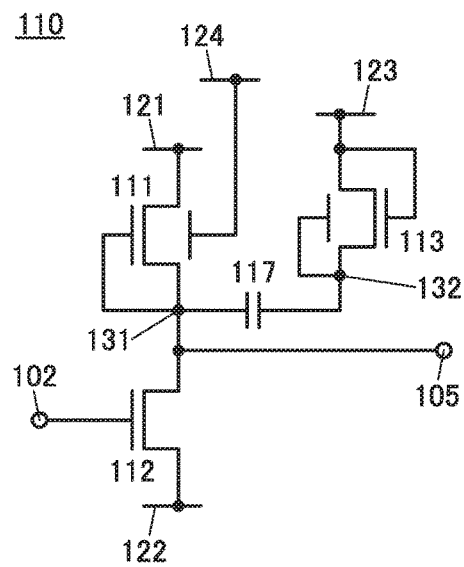
FIGS. 7A to 7D are each a circuit diagram illustrating a semiconductor device.

In this embodiment, a semiconductor device 110 having a different structure from that of the semiconductor device 100 will be described with reference to drawings. FIG. 7A is a circuit diagram showing the structure of the semiconductor device 110. In this embodiment, a description is mainly made of portions different from the semiconductor device 100 to avoid repetition of the same description. For parts that are not described in this embodiment, the other embodiments or common general technical knowledge known to those skilled in art can be referred to.

<Structure Example of Semiconductor Device 110>

The semiconductor device 110 has a structure in which a back gate is additionally provided for the transistor 113 that is the same as in the semiconductor device 100 in FIG. 1A, and the back gate is electrically connected to the other of the source and the drain of the transistor 113.

Figure 7B:
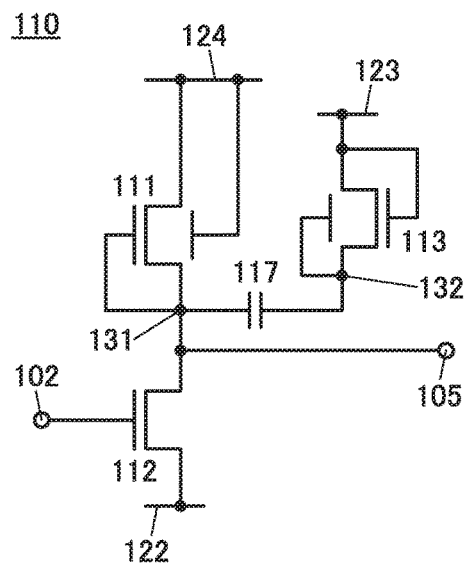

Note that an inverted signal of a signal inputted to the terminal 102 may be inputted to the wiring 121. In this case, the wiring 121 may be omitted, and the one of the source and the drain of the transistor 111 may be electrically connected to the wiring 124 (see FIG. 7B).

Figure 7C:
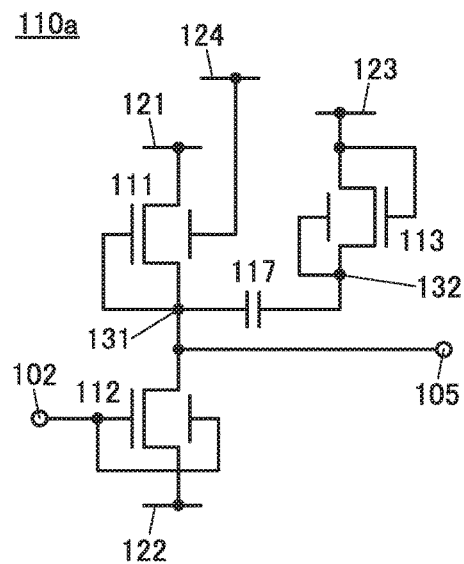

As shown in a semiconductor device 110*a* shown in a circuit diagram in FIG. 7C, the transistor 112 in the semiconductor device 110 may be provided with a back gate, and the back gate may be electrically connected to the gate of the transistor 112.

Figure 7D:
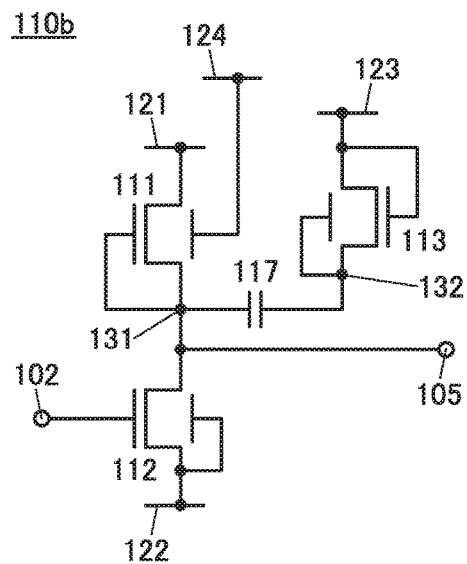

As shown in a semiconductor device 110*b* in a circuit diagram in FIG. 7D, the transistor 112 in the semiconductor device 110 may be provided with a back gate, and the back gate may be electrically connected to the other of the source and the drain of the transistor 112.

The semiconductor device 110, the semiconductor device 110*a*, and the semiconductor device 110*b* can operate in a manner similar to that of the semiconductor device 100. Note that in the semiconductor device 110, the semiconductor device 110*a*, and the semiconductor device 110*b*, when the L potential is supplied to the wiring 123 during the period 151, the potential of the node 132 becomes $V_{th}$.

<Operation Example of Semiconductor Device 110>

Figure 8:
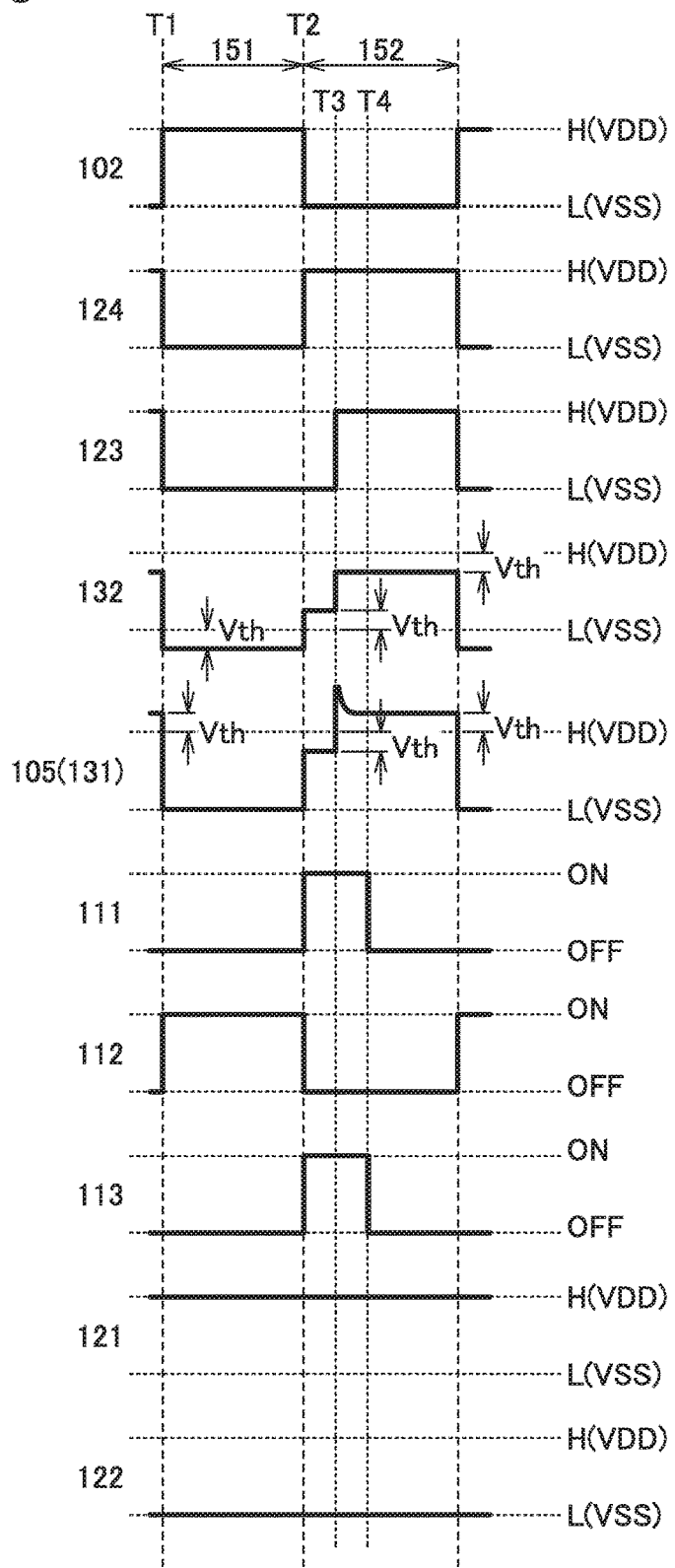
FIG. 8 is a timing chart illustrating operation of a semiconductor device.

An operation example of the semiconductor device 110 is described with reference to a timing chart in FIG. 8 and circuit diagrams in FIGS. 9A and 9B, FIGS. 10A and 10B, and FIG. 11. The semiconductor device 110 can operate in substantially the same manner to the semiconductor device 100. The operation different from that of the semiconductor device 100 is described below.

In this embodiment, the threshold voltages (also referred to as $V_{th}$) of the transistors 111 to 113 are the same as each other. The H potential ($V_{DD}$) is supplied to the wiring 121, and the L potential ($V_{SS}$) is supplied to the wiring 122. To the wiring 124, an inverted signal of a signal inputted to the terminal 102 is inputted.

Note that to the wiring 121, an inverted signal of a signal inputted to the terminal 102 may be inputted. In this case, the wiring 121 may be omitted, and the one of the source and the drain of the transistor 111 may be electrically connected to the wiring 124 (see FIG. 7B).

Figure 9A:
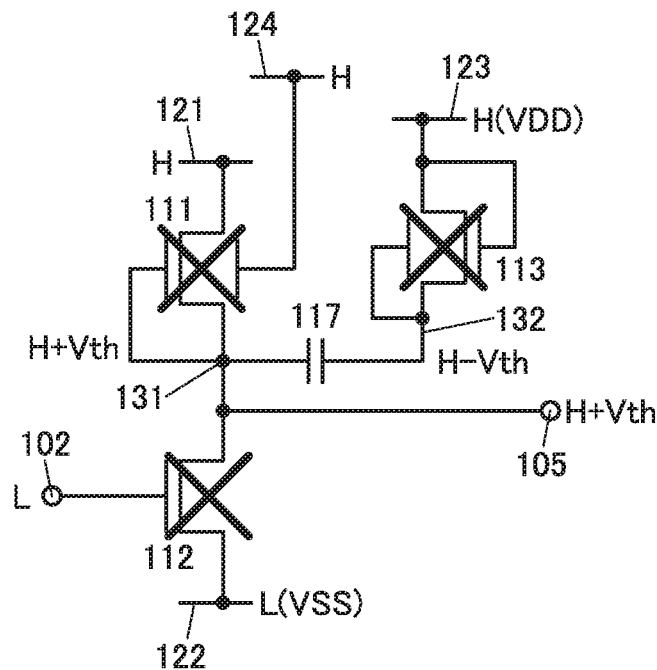
FIGS. 9A and 9B are each a circuit diagram illustrating operation of a semiconductor device.
Figure 9B:
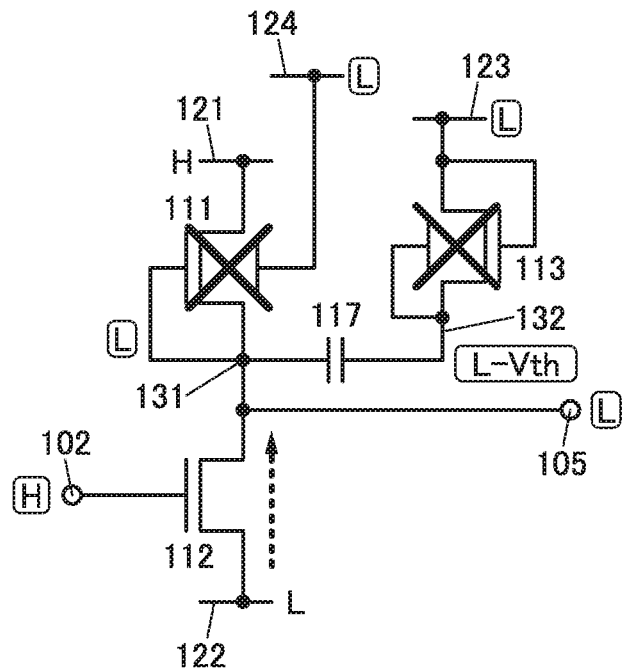
Figure 10A:
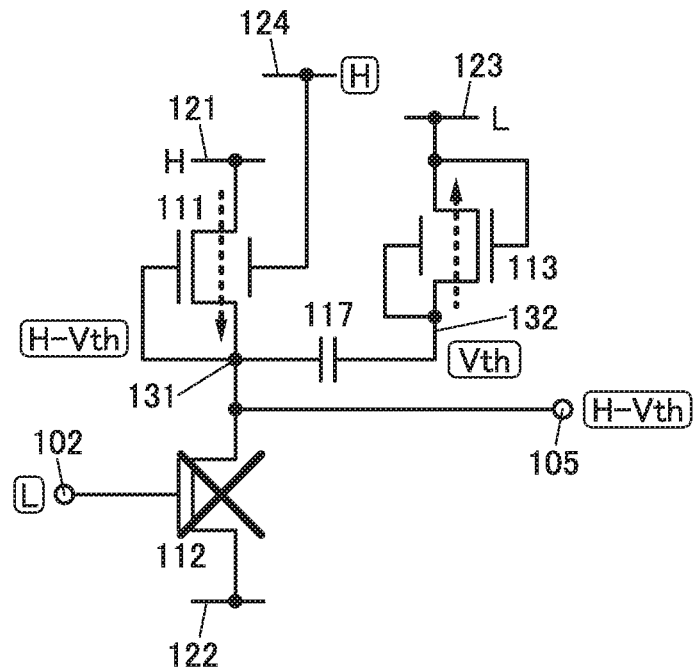
FIGS. 10A and 10B are each a circuit diagram illustrating operation of a semiconductor device.
Figure 10B:
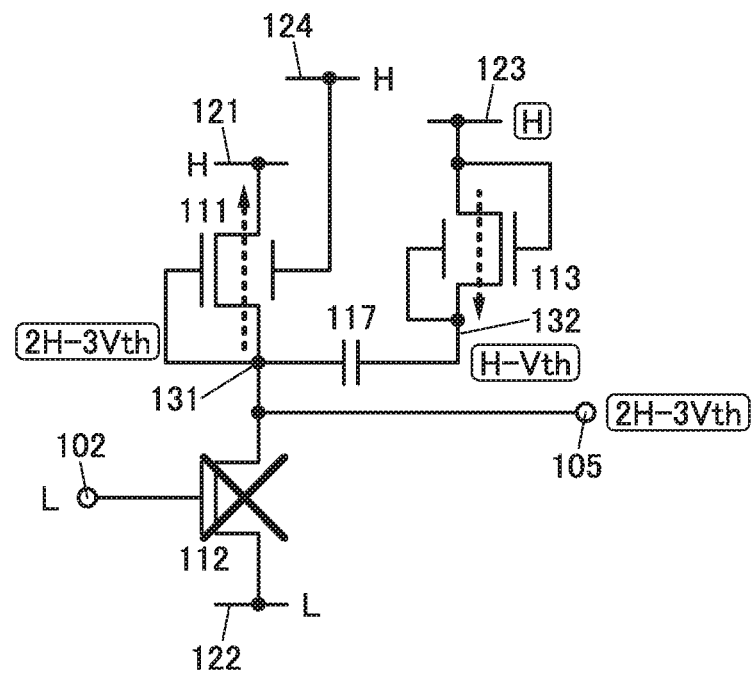

FIG. 9A shows a state of the semiconductor device 110 immediately before a time T1 as an initial state. In FIG. 9A, the transistors 111 to 113 are in an off state, the potential of the node 131 is $H+V_{th}$, and the potential of the node 132 is $H-V_{th}$. In addition, the L potential is inputted to the terminal 102.

[Period 151: H-potential-input Period]

At the time T1, the H potential is inputted to the terminal 102, the L potential is inputted to the wiring 124, and the L potential is inputted to the wiring 123. Then, the transistor 112 is turned on. When the transistor 112 is turned on, the node 131 has the L potential. Furthermore, the L potential is outputted from the terminal 105. When the potential of the node 131 becomes the L potential, the potential of the node 132 that is connected to the node 131 via the capacitor 117 becomes $L-V_{th}$ (see FIG. 9B).

[Period 152: L-potential-input Period]

At a time T2, the L potential is inputted to the terminal 102, and the H potential is supplied to the wiring 124. Then, the transistor 112 is turned off, and the transistor 111 is turned on. After that, the potential of the node 131 increases from the L potential to $H-V_{th}$. At that time, the potential of node 132 that is connected to the node 131 via the capacitor 117 tends to increase. When the potential of the node 132 exceeds $V_{th}$ of the transistor 113, the transistor 113 is turned on. Thus, the potential of the node 132 becomes $V_{th}$ (see FIG. 10A). Note that when the potential of the node 132 becomes $V_{th}$, the transistor 113 is turned off At a time T3, the H potential is supplied to the wiring 123. Then, the transistor 113 is turned on, and the potential of the node 132 becomes $H-V_{th}$. At this time, the potential of the node 132 increases by $H-2\times V_{th}$ corresponding to the potential difference between $V_{th}$ and $H-V_{th}$. The potential of the node 131 connected to the node 132 via the capacitor 117 also increases by $H-2\times V_{th}$. Thus, the potential of the node 131 instantaneously increases to $2\times H-3\times V_{th}$ (see FIG. 10B).

When the potential of the node 131 exceeds $H+V_{th}$, the charge at the node 131 transfers to the wiring 121, and accordingly the potential of the node 131 decreases.

Figure 11:
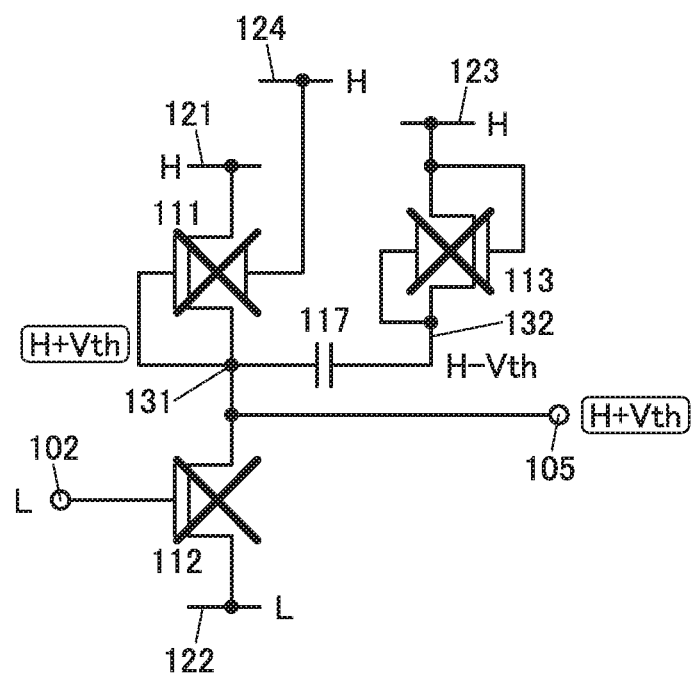
FIG. 11 is a circuit diagram illustrating operation of a semiconductor device.

As shown in a time T4 in FIG. 11, when the potential of the node 131 becomes $H+V_{th}$, the transistor 111 is turned off. Furthermore, when the potential of the node 132 becomes $H-V_{th}$, the transistor 113 is turned off. In the above manner, the potential higher than or equal to the H potential can be supplied from the terminal 105.

In the operation example of the semiconductor device 110 in this embodiment, it is important that $V_{DD}-2\times V_{th}$ be higher than $V_{th}$. In other words, it is important that $V_{th}$ be lower than one third of $V_{DD}$.

This embodiment can be implemented in appropriate combination with any of the structures described in the other embodiments and the like.

(Embodiment 3)

Figure 12A:
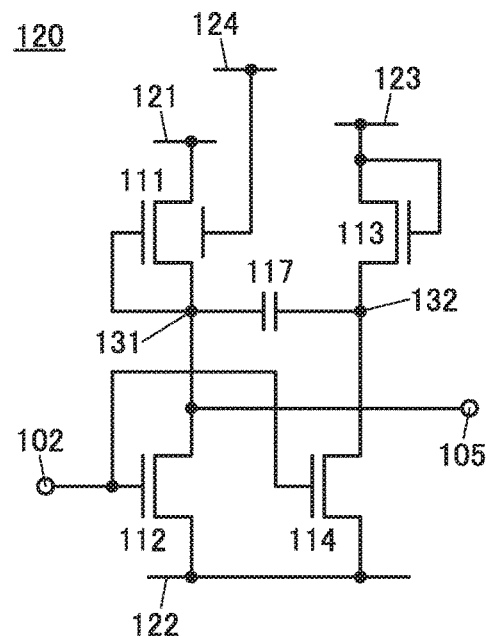
FIGS. 12A to 12D are each a circuit diagram illustrating a semiconductor device.

In this embodiment, a semiconductor device 120 having a structure different from that of the semiconductor device 100 will be described with reference to drawings. FIG. 12A is a circuit diagram showing the structure of the semiconductor device 120. In this embodiment, a description is made of portions different from the semiconductor device 100 to avoid repetition of the same description. For parts that are not described in this embodiment, the other embodiments or common general technical knowledge known to those skilled in art can be referred to.

<Structure Example of Semiconductor Device 120>

The semiconductor device 120 has a structure in which a transistor 114 is added to the semiconductor device 100 shown in FIG. 1A. In the transistor 114 in the semiconductor device 120, one of a source and a drain is electrically connected to the node 132, and the other of the source and the drain is electrically connected to the wiring 122. A gate of the transistor 114 is electrically connected to the terminal 102.

Figure 12B:
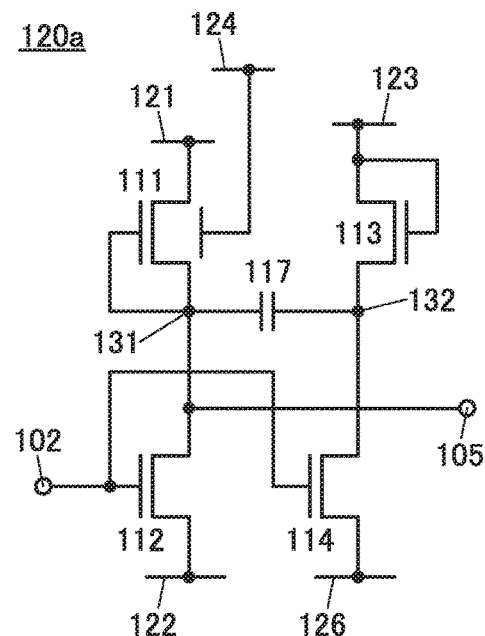

As shown in a semiconductor device 120*a* in a circuit diagram in FIG. 12B, the other of the source and the drain of the transistor 114 is electrically connected to a wiring 126. The other of the source and the drain of the transistor 114 may be connected to a wiring that is not the wiring 122, whereby the other of the source and the drain of the transistor 114 can be supplied with a potential different from that of the wiring 122.

Figure 12C:
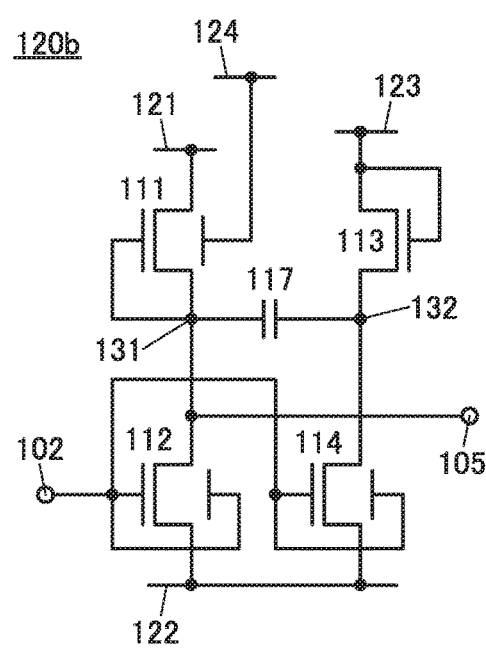

As shown in a semiconductor device 120*b* in a circuit diagram in FIG. 12C, the transistor 112 may be provided with a back gate, and the back gate may be electrically connected to the gate of the transistor 112. In addition, the transistor 114 may be provided with a back gate, and the back gate may be electrically connected to the gate of the transistor 114.

Figure 12D:
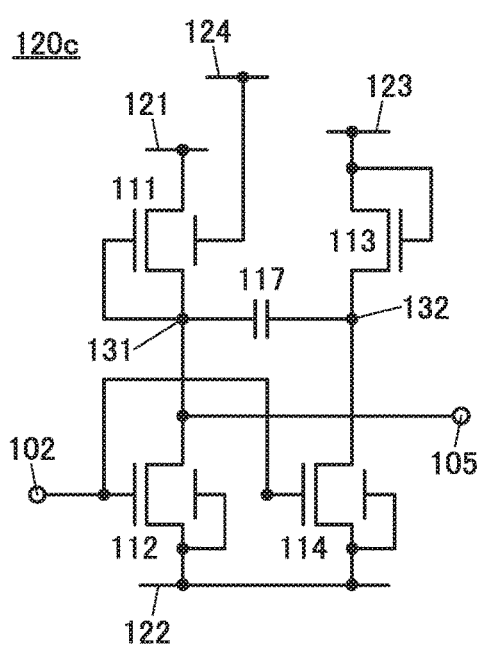

As shown in a semiconductor device 120*c* in a circuit diagram in FIG. 12D, the transistor 112 may be provided with a back gate, and the back gate may be electrically connected to the other of the source and the drain of the transistor 112. Alternatively, the transistor 114 may be provided with a back gate, and the back gate may be electrically connected to the other of the source and the drain of the transistor 114.

<Operation Example of Semiconductor Device 120>

Figure 13:
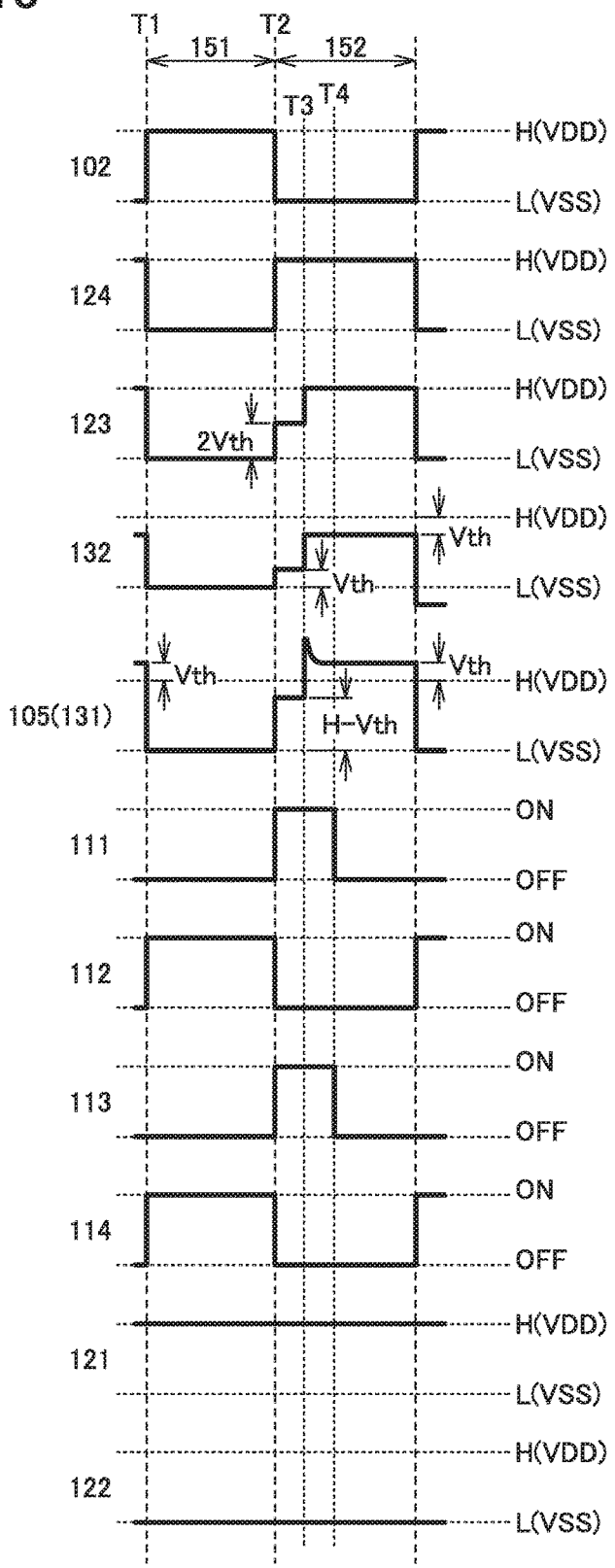
FIG. 13 is a timing chart illustrating operation of a semiconductor device.

An operation example of the semiconductor device 120 is described with reference to a timing chart of FIG. 13 and circuit diagrams in FIGS. 14A and 14B, FIGS. 15A and 15B, and FIG. 16. The semiconductor device 120 can operate substantially the same as the semiconductor device 100. The operation different from that of the semiconductor device 100 is described below.

In this embodiment, the threshold voltages (also referred to as $V_{th}$) of the transistors 111 to 114 are the same as each other. The H potential ($V_{DD}$) is supplied to the wiring 121, and the L potential ($V_{SS}$) is supplied to the wiring 122. To the wiring 121, an inverted signal of a signal inputted to the terminal 102 may be inputted.

Figure 14A:
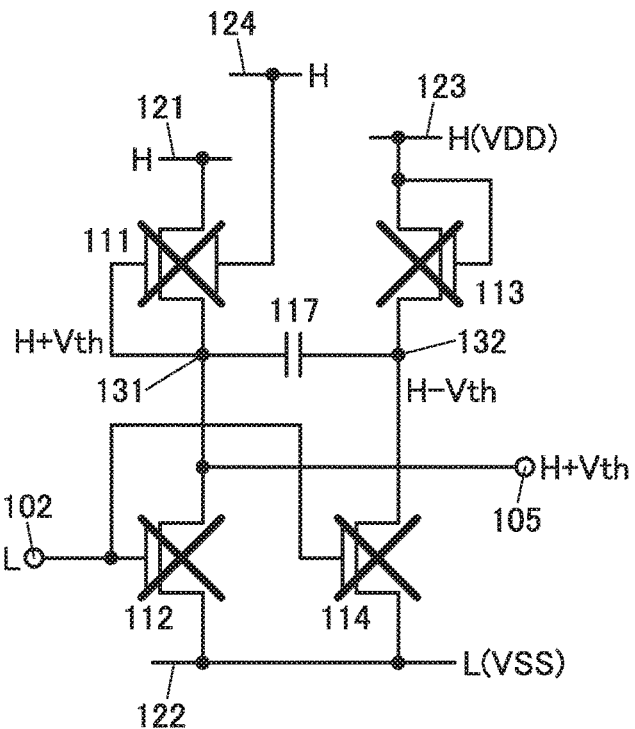
FIGS. 14A and 14B are each a circuit diagram illustrating operation of a semiconductor device.
Figure 14B:
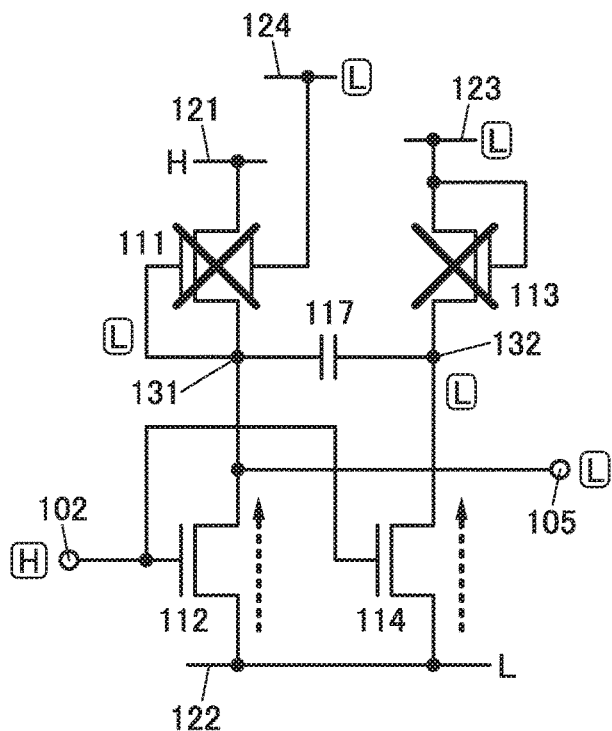
Figure 15A:
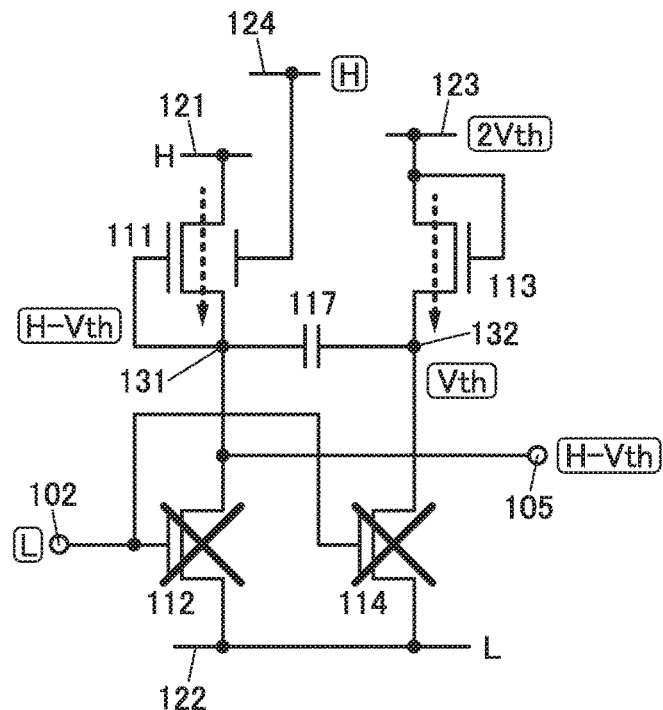
FIGS. 15A and 15B are each a circuit diagram illustrating operation of a semiconductor device.
Figure 15B:
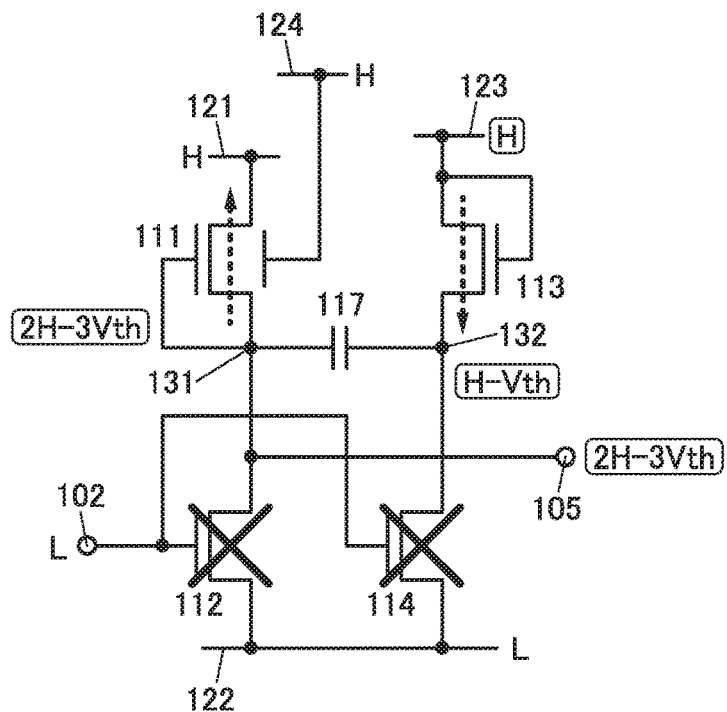

FIG. 14A shows a state of the semiconductor device 120 immediately before a time T1, as an initial state. In FIG. 14A, the transistors 111 to 114 are each in an off state, the potential of the node 131 is $H+V_{th}$, and the potential of the node 132 is $H-V_{th}$. The L potential is inputted to the terminal 102.

[Period 151: H-potential-input Period]

At the time T1, the H potential is inputted to the terminal 102, the L potential is inputted to the wiring 124, and the L potential is inputted to the wiring 123. Then, the transistor 112 and the transistor 114 are turned on. When the transistor 112 and the transistor 114 are turned on, the node 131 and the node 132 each have the L potential. Furthermore, the L potential is outputted from the terminal 105 (see FIG. 14B).

[Period 152: L-potential-input Period]

At a time T2, the L potential, the H potential, and a potential higher than or equal to $2\times V_{th}$ and lower than or equal to $H-V_{th}$ are supplied to the terminal 102, the wiring 124, and the wiring 123, respectively. In this embodiment, the voltage $2\times V_{th}$ is supplied to the wiring 123. Then, the transistor 112 and the transistor 114 are turned off, the potential of the node 131 becomes $H-V_{th}$, and the potential of the node 132 becomes $V_{th}$ (see FIG. 15A).

At a time T3, the potential of the wiring 123 is set to the H potential. Then, the potential of the node 132 increases from $V_{th}$ to $H-V_{th}$. At this time, the potential of the node 132 increases by $H-2\times V_{th}$ corresponding to a potential difference between $V_{th}$ and $H-V_{th}$. Furthermore, the potential of the node 131 connected to the node 132 via the capacitor 117 increases by $H-2\times V_{th}$. Thus, the potential of the node 131 instantaneously increases to $2\times H-3\times V_{th}$ (see FIG. 15B).

Note that when the potential of the node 131 exceeds $H+V_{th}$, the charge at the node 131 transfers to the wiring 121, and accordingly the potential of the node 131 decreases.

Figure 16:
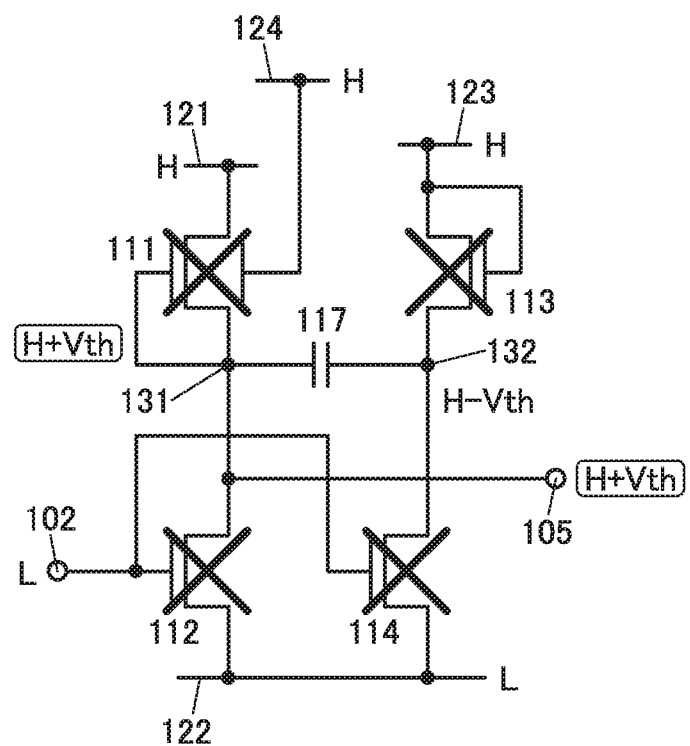
FIG. 16 is a circuit diagram illustrating operation of a semiconductor device.

As shown in a time T4 in FIG. 16, when the potential of the node 131 becomes $H+V_{th}$, the transistor 111 is turned off. Since the potential of the node 132 is $H-V_{th}$, the transistor 113 is in an off state. In the above manner, the potential higher than or equal to the H potential can be supplied from the terminal 105.

This embodiment can be implemented in appropriate combination with any of the structures described in the other embodiments and the like.

(Embodiment 4)

In this embodiment, a structure example of a transistor that can be used for the semiconductor device described in the above embodiment will be described.

<Example of Structure of Transistor>

The semiconductor device of one embodiment of the present invention can be fabricated by using a transistor with any of various structures, such as a bottom-gate transistor, a top-gate transistor, or the like. Therefore, a material for a semiconductor layer or the structure of a transistor can be easily changed depending on the existing production line.

[Bottom-gate Transistor]

FIG. 17A1 is a cross-sectional view of a channel-protective transistor 410 that is a type of bottom-gate transistor. The transistor 410 includes an electrode 246 over a substrate 271 with an insulating layer 272 positioned therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 225 over a channel formation region in the semiconductor layer 242. The transistor 410 includes an electrode 244a and an electrode 244b which are partly in contact with the semiconductor layer 242 and over the insulating layer 226. Part of the electrode 244a and part of the electrode 244b are formed over the insulating layer 225.

The insulating layer 225 can function as a channel protective layer. With the insulating layer 225 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. According to one embodiment of the present invention, a transistor with favorable electrical characteristics can be provided.

The transistor 410 includes an insulating layer 228 over the electrode 244a, the electrode 244b, and the insulating layer 225 and further includes an insulating layer 229 over the insulating layer 228.

In the case where an oxide semiconductor is used for the semiconductor layer 242, a material that is capable of removing oxygen from part of the semiconductor layer 242 to generate oxygen vacancies is preferably used at least for regions of the electrodes 244a and 244b that are in contact with the semiconductor layer 242. The carrier concentration of the regions of the semiconductor layer 242 in which oxygen vacancies are generated is increased, so that the regions become n-type regions ($n^+$ layers). Accordingly, the regions can function as a source region and a drain region. Examples of the material which is capable of removing oxygen from the oxide semiconductor to generate oxygen vacancies include tungsten and titanium.

Formation of the source region and the drain region in the semiconductor layer 242 makes it possible to reduce contact resistance between the semiconductor layer 242 and each of the electrodes 244a and 244b. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as a source region or a drain region in a transistor.

The insulating layer 229 is preferably formed using a material that can prevent or reduce diffusion of impurities into the transistor from the outside. The formation of the insulating layer 229 may also be omitted.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

A transistor 411 illustrated in FIG. 17A2 is different from the transistor 410 in that an electrode 223 that can function as a back gate is provided over the insulating layer 229. The electrode 223 can be formed using a material and a method similar to those of the electrode 246.

[Back Gate]

A gate and a back gate of a transistor are described. In general, the back gate is formed using a conductive layer and positioned so that the channel formation region of the semiconductor layer is positioned between the gate and the back gate. In addition, the back gate can function in a manner similar to that of the gate. The potential of the back gate may be the same as that of the gate electrode or may be a GND potential or a predetermined potential. By changing the potential of the back gate independently of the potential of the gate, the threshold voltage of the transistor can be changed.

The electrode 246 and the electrode 223 can each function as a gate. Thus, the insulating layers 226, 228, and 229 can each function as a gate insulating layer. The electrode 223 may also be provided between the insulating layers 228 and 229.

In the case where one of the electrode 246 and the electrode 223 is simply referred to as a "gate" or a "gate electrode", the other can be referred to as a "back gate" or a "back gate electrode". For example, in the transistor 411, in the case where the electrode 223 is referred to as a "gate electrode", the electrode 246 is referred to as a "back gate electrode". In the case where the electrode 223 is used as a "gate electrode", the transistor 411 can be regarded as a kind of top-gate transistor. Alternatively, one of the electrode 246 and the electrode 223 may be referred to as a "first gate" or a "first gate electrode", and the other may be referred to as a "second gate" or a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a semiconductor device having a high degree of integration can be provided.

Furthermore, the gate and the back gate are formed using conductive layers and thus each have a function of preventing an electric field generated outside the transistor from influencing the semiconductor layer in which the channel is formed (in particular, an electric field blocking function against static electricity and the like). When the back gate is formed larger than the semiconductor layer such that the semiconductor layer is covered with the back gate, the electric field blocking function can be enhanced.

Since the electrode 246 (gate) and the electrode 223 (back gate) each have a function of blocking an electric field from the outside, electric charge of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative charges are applied to a gate) can be reduced. Furthermore, a change in gate voltage (rising voltage) at which on-state current starts flowing at different drain voltages can be reduced. Note that this effect is obtained when the electrodes 246 and 223 have the same potential or different potentials.

The GBT stress test is one kind of acceleration test and can evaluate, in a short time, a change by long-term use (i.e., a change over time) in characteristics of a transistor. In particular, the amount of change in threshold voltage of the transistor between before and after the GBT stress test is an important indicator when examining the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, a variation in electrical characteristics among a plurality of transistors is also reduced.

The transistor including the back gate has a smaller change in threshold voltage by a positive GBT stress test in which positive electric charge is applied to a gate than a transistor including no back gate.

When the back gate is formed using a light-blocking conductive film, light can be prevented from entering the semiconductor layer from the back gate side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

FIG. 17B1 is a cross-sectional view of a channel-protective transistor 420 that is a type of bottom-gate transistor. The transistor 420 has substantially the same structure as the transistor 410 but is different from the transistor 410 in that the insulating layer 225 covers the semiconductor layer 242. With the insulating layer 225, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The semiconductor layer 242 is electrically connected to the electrode 244a in an opening formed by selectively removing part of the insulating layer 225 which overlaps with the semiconductor layer 242. The semiconductor layer 242 is electrically connected to the electrode 244b in another opening formed by selectively removing part of the insulating layer 225 which overlaps with the semiconductor layer 242. A region of the insulating layer 229 which overlaps with the channel formation region can function as a channel protective layer.

A transistor 421 illustrated in FIG. 17B2 is different from the transistor 420 in that the electrode 223 that can function as a back gate is provided over the insulating layer 229.

The distance between the electrodes 244a and 246 and the distance between the electrodes 244b and 246 in the transistors 420 and 421 are longer than those in the transistors 410 and 411. Thus, the parasitic capacitance generated between the electrodes 244a and 246 can be reduced. Furthermore, the parasitic capacitance generated between the electrodes 244b and 246 can be reduced. According to one embodiment of the present invention, a transistor with favorable electrical characteristics can be provided.

A transistor 425 illustrated in FIG. 17C1 is a channel-etched transistor that is a type of bottom-gate transistor. In the transistor 425, the insulating layer 225 is not provided and the electrodes 244a and 244b are formed to contact with the semiconductor layer 242. Thus, part of the semiconductor layer 242 that is exposed when the electrodes 244a and 244b are formed is etched in some cases. However, since the insulating layer 229 is not provided, the productivity of the transistor can be increased.

A transistor 426 illustrated in FIG. 17C2 is different from the transistor 425 in that the electrode 223 which can function as a back gate is provided over the insulating layer 229.

[Top-gate Transistor]

FIG. 18A1 is a cross-sectional view of a transistor 430 that is a type of top-gate transistor. The transistor 430 includes the semiconductor layer 242 over the substrate 271 with the insulating layer 272 therebetween, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 18A3). According to one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one element of a Group 13 element, a Group 15 element, and the like can be used. In the case where an oxide semiconductor is used for the semiconductor layer 242, it is possible to use at least one kind of element of a rare gas, hydrogen, and nitrogen as the impurity 255.

A transistor 431 illustrated in FIG. 18A2 is different from the transistor 430 in that the electrode 223 and the insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method similar to those of the insulating layer 226.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 18B1 as an example is a type of top-gate transistor. The transistor 440 is different from the transistor 430 in that the semiconductor layer 242 is formed after the formation of the electrodes 244a and 244b. A transistor 441 illustrated in FIG. 18B2 is different from the transistor 440 in that the electrode 223 and the insulating layer 227 are included. Thus, in the transistors 440 and 441, part of the semiconductor layer 242 is formed over the electrode 244a and another part of the semiconductor layer 242 is formed over the electrode 244b.

The transistor 441 as well as the transistor 411 has a high on-state current for its area. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

A transistor 442 illustrated in FIG. 19A1 as an example is a type of top-gate transistor. The transistor 442 has the electrodes 244a and 244b over the insulating layer 229. The electrodes 244a and 244b are electrically connected to the semiconductor layer 242 through openings formed in the insulating layers 228 and 229.

Part of the insulating layer 226 that does not overlap with the electrode 246 is removed. The insulating layer 226 included in the transistor 442 is partly extended across the ends of the electrode 246.

Figure 3:
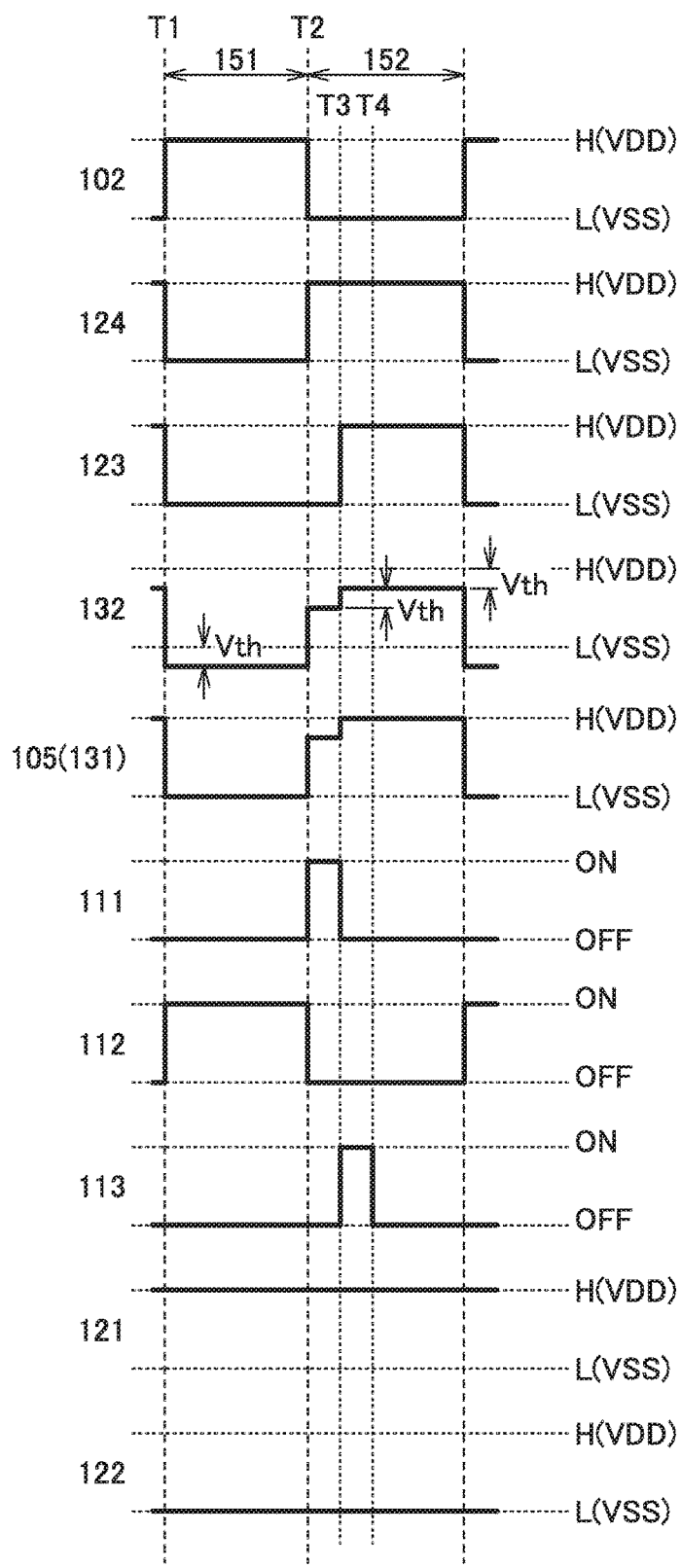
FIG. 3 is a timing chart illustrating operation of a semiconductor device.

The impurity 255 is added to the semiconductor layer 242 using the electrode 246 and the insulating layer 226 as masks, so that an impurity region can be formed in the semiconductor layer 242 in a self-aligned manner (see FIG. 19A3).

At this time, the impurity 255 is not added to the semiconductor layer 242 in a region overlapping with the electrode 246, and the impurity 255 is added to the semiconductor layer 242 in a region that does not overlap with the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in the semiconductor layer 242 in a region adjacent to the electrode 246 when seen from the above.

A transistor 443 illustrated in FIG. 19A2 is different from the transistor 442 in that the transistor 443 includes the electrode 223 under the semiconductor layer 242. The electrode 223 and the semiconductor layer 242 overlap with each other with the insulating layer 272 positioned therebetween. The electrode 223 can function as a back gate electrode.

As in a transistor 444 illustrated in FIG. 19B1 and a transistor 445 illustrated in FIG. 19B2, the insulating layer 226 in a region that does not overlap with the electrode 246 may be wholly removed. Alternatively, as in a transistor 446 illustrated in FIG. 19C1 and a transistor 447 illustrated in FIG. 19C2, the insulating layer 226 except for the openings may be left without being removed.

In the transistors 444 to 447, after the formation of the electrode 246, the impurity 255 is added to the semiconductor layer 242 using the electrode 246 as a mask, so that an impurity region can be formed in the semiconductor layer 242 in a self-aligned manner.

[S-channel Transistor]

Figure 20A:
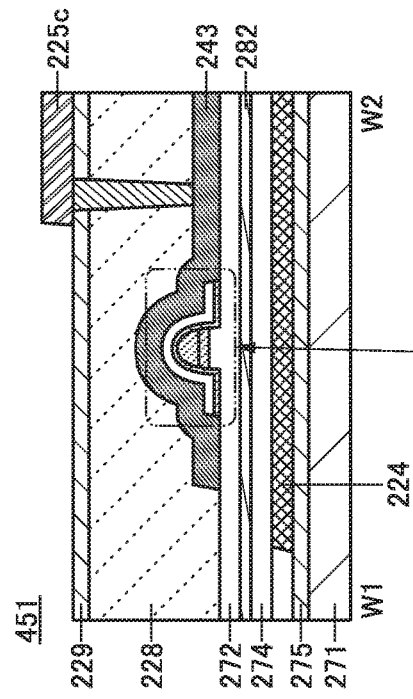
FIGS. 20A to 20C illustrate an example of a transistor.
Figure 20B:
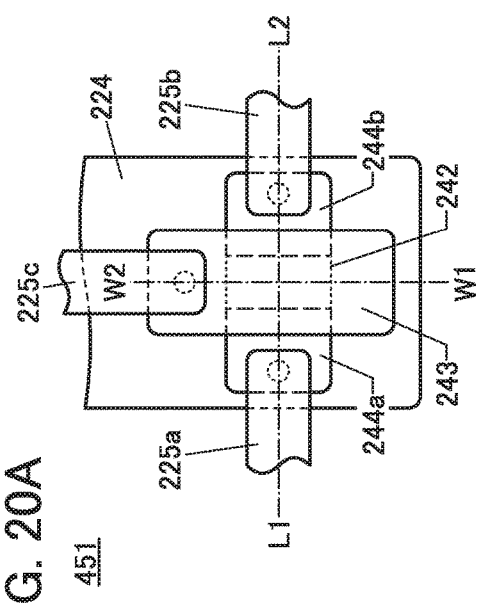
Figure 20C:
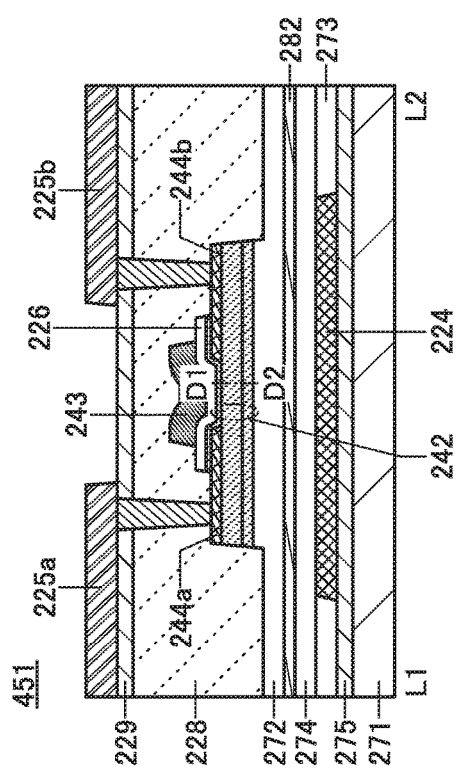

FIGS. 20A to 20C illustrate an example of a structure of a transistor including an oxide semiconductor for the semiconductor layer 242. FIG. 20A is a top view of a transistor 451. FIG. 20B is a cross-sectional view (in the channel length direction) of a portion along the dashed-dotted line L1-L2 in FIG. 20A. FIG. 20C is a cross-sectional view (in the channel width direction) of a portion along the dash-dot line W1-W2 in FIG. 20A.

The transistor 451 includes the semiconductor layer 242, the insulating layer 226, the insulating layer 272, an insulating layer 282, an insulating layer 274, an electrode 224, an electrode 243, the electrode 244a, and the electrode 244b. The electrode 243 can function as a gate, and the electrode 224 can function as a back gate. The insulating layer 226, the insulating layer 272, the insulating layer 282, and the insulating layer 274 each can function as a gate insulating layer. The electrode 244a can function as one of a source electrode and a drain electrode. The electrode 244b can function as the other of the source electrode and the drain electrode.

An insulating layer 275 is provided over the substrate 271, and the electrode 224 and an insulating layer 273 are provided over the insulating layer 275. Over the electrode 224 and the insulating layer 273, the insulating layer 274 is provided. Over the insulating layer 274, the insulating layer 282 is provided, and over the insulating layer 282, the insulating layer 272 is provided.

A semiconductor layer 242a is provided over a projection formed in the insulating layer 272, and a semiconductor layer 242b is provided over the semiconductor layer 242a. The electrode 244a and the electrode 244b are provided over the semiconductor layer 242b. A region in the semiconductor layer 242b which overlaps with the electrode 244a can function as one of a source and a drain of the transistor 451. A region in the semiconductor layer 242b which overlaps with the electrode 244b can function as the other of the source and the drain of the transistor 451.

In addition, a semiconductor layer 242c is provided to be in contact with part of the semiconductor layer 242b. The insulating layer 226 is provided over the semiconductor layer 242c, and the electrode 243 is provided over the insulating layer 226.

The transistor 451 has a structure in which a top surface and side surfaces of the semiconductor layer 242b and side surfaces of the semiconductor layer 242a are covered with the semiconductor layer 242c in the portion along W1-W2. With the semiconductor layer 242b provided on the projection of the insulating layer 272, the side surface of the semiconductor layer 242b can be covered with the electrode 243. Thus, the transistor 451 has a structure in which the semiconductor layer 242b can be electrically surrounded by electric field of the electrode 243. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the s-channel structure, a channel can be formed in the whole (bulk) of the semiconductor layer 242b. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, off-state current of the transistor with an s-channel structure can be further reduced.

When the projection of the insulating layer 272 is increased in height, and the channel width is shortened, the effects of the s-channel structure for increasing the on-state current and reducing the off-state current can be enhanced. Part of the semiconductor layer 242a exposed in the formation of the semiconductor layer 242b may be removed. In this case, the side surfaces of the semiconductor layer 242a and the semiconductor layer 242b may be aligned to each other.

The insulating layer 228 is provided over the transistor 451 and the insulating layer 229 is provided over the insulating layer 228. An electrode 225a, an electrode 225b, an electrode 225c are provided over the insulating layer 229. The electrode 225a is electrically connected to the electrode 244a via a contact plug through an opening in the insulating layer 229 and the insulating layer 228. The electrode 225b is electrically connected to the electrode 244b via a contact plug through an opening in the insulating layer 229 and the insulating layer 228. The electrode 225c is electrically connected to the electrode 244c via a contact plug through an opening in the insulating layer 229 and the insulating layer 228.

Note that when the insulating layer 282 is formed using hafnium oxide, aluminum oxide, tantalum oxide, aluminum silicate, or the like, the insulating layer 282 can function as a charge trap layer. The threshold voltage of the transistor can be changed by injecting electrons into the insulating layer 282. For example, the injection of electrons into the insulating layer 282 can be performed with use of the tunnel effect. By applying a positive voltage to the electrode 224, tunnel electrons can be injected into the insulating layer 282.

<Energy Band Structure (1) of Semiconductor Layer 242>

Figure 28A:
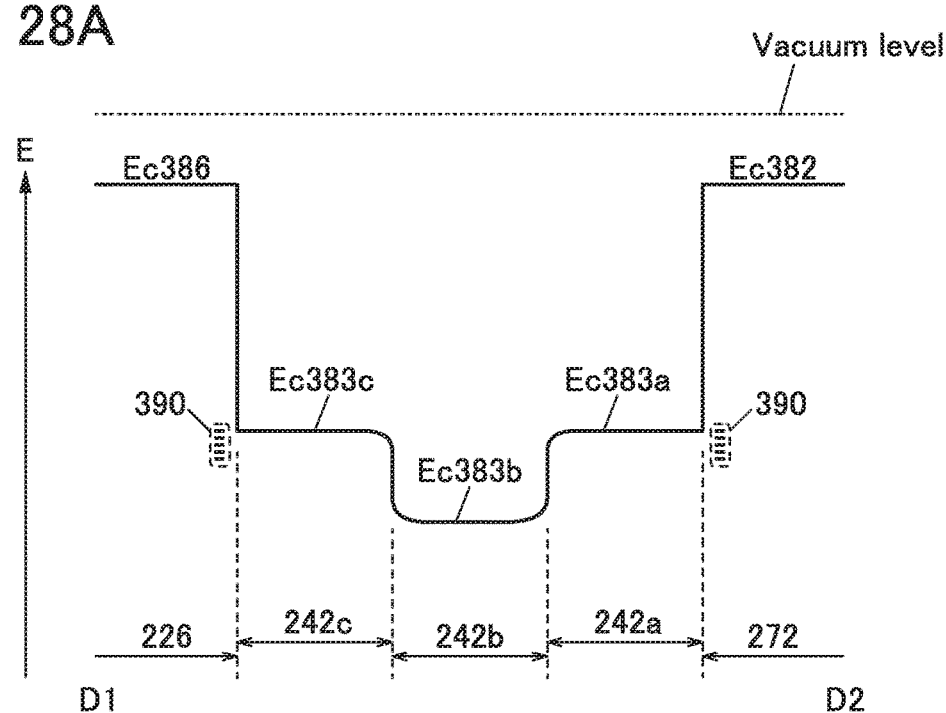
FIGS. 28A and 28B each show an energy band structure.

The function and effect of the semiconductor layer 242 that is a stacked layer including the semiconductor layers 242a, 242b, and 242c are described with an energy band structure diagrams shown in FIG. 28A. FIG. 28A illustrates the energy band structure of a portion along dashed dotted line D1-D2 in FIG. 20B. In other words, FIG. 28A illustrates the energy band structure of a channel formation region of the transistor 451.

In FIG. 28A, Ec382, Ec383a, Ec383b, Ec383c, and Ec386 indicate the energy of the conduction band minimum of the insulating layer 272, that of the semiconductor layer 242a, that of the semiconductor layer 242b, that of the semiconductor layer 242c, and that of the insulating layer 226, respectively.

Here, an electron affinity corresponds to a value obtained by subtracting a band gap from a difference in energy between the vacuum level and the valence band maximum (the difference is also referred to as "ionization potential"). Note that the band gap can be measured using a spectroscopic ellipsometer (UT-300 manufactured by HORIBA JOBIN YVON). The energy difference between the vacuum level and the valence band maximum can be measured using an ultraviolet photoelectron spectroscopy (UPS) device (VersaProbe manufactured by ULVAC-PHI, Inc.).

In the case of an In—Ga—Zn oxide formed using a target whose atomic ratio is In:Ga:Zn=1:3:2, the band gap is about 3.5 eV, and the electron affinity is about 4.5 eV.

In the case of an In—Ga—Zn oxide formed using a target whose atomic ratio is In:Ga:Zn=1:3:4, the band gap is about 3.4 eV, and the electron affinity is about 4.5 eV. In the case of an In—Ga—Zn oxide formed using a target whose atomic ratio is In:Ga:Zn=1:3:6, the band gap is about 3.3 eV, and the electron affinity is about 4.5 eV. In the case of an In—Ga—Zn oxide formed using a target whose atomic ratio is In:Ga:Zn=1:6:2, the band gap is about 3.9 eV, and the electron affinity is about 4.3 eV. In the case of an In—Ga—Zn oxide formed using a target whose atomic ratio is In:Ga:Zn=1:6:8, the band gap is about 3.5 eV, and the electron affinity is about 4.4 eV. In the case of an In—Ga—Zn oxide formed using a target whose atomic ratio is In:Ga:Zn=1:6:10, the band gap is about 3.5 eV, and the electron affinity is about 4.5 eV. In the case of an In—Ga—Zn oxide formed using a target whose atomic ratio is In:Ga:Zn=1:1:1, the band gap is about 3.2 eV, and the electron affinity is about 4.7 eV. In the case of an In—Ga—Zn oxide formed using a target whose atomic ratio is In:Ga:Zn=3:1:2, the band gap is about 2.8 eV, and the electron affinity is about 5.0 eV.

Since the insulating layer 272 and the insulating layer 226 are insulators, Ec382 and Ec386 are closer to the vacuum level (have a smaller electron affinity) than Ec383a, Ec383b, and Ec383c.

Further, Ec383a is closer to the vacuum level than Ec383b is. Specifically, Ec383a is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Further, Ec383c is closer to the vacuum level than Ec383b is. Specifically, Ec383c is preferably located closer to the vacuum level than Ec383b by greater than or equal to 0.07 eV and less than or equal to 1.3 eV, further preferably greater than or equal to 0.1 eV and less than or equal to 0.7 eV, still further preferably greater than or equal to 0.15 eV and less than or equal to 0.4 eV.

Here, a mixed region of the semiconductor layer 242a and the semiconductor layer 242b exists between the semiconductor layer 242a and the semiconductor layer 242b in some cases. In addition, a mixed region of the semiconductor layer 242b and the semiconductor layer 242c exists between the semiconductor layer 242b and the semiconductor layer 242c in some cases. The mixed region has a low density of interface states. For that reason, the stack including the semiconductor layers 242a, 242b, and 242c has a band structure where energy at each interface and in the vicinity of the interface is changed continuously (continuous junction).

In this state, electrons move mainly in the semiconductor layer 242b, not in the semiconductor layers 242a and 242c. Thus, when the interface state density at the interface between the semiconductor layer 242a and the semiconductor layer 242b and the interface state density at the interface between the semiconductor layer 242b and the semiconductor layer 242c are decreased, electron movement in the semiconductor layer 242b is less likely to be inhibited and the on-state current of the transistor 451 can be increased.

Note that although trap states 390 due to impurities or defects might be formed in the vicinity of the interface between the semiconductor layer 242a and the insulating layer 272 and in the vicinity of the interface between the semiconductor layer 242c and the insulating layer 226, the semiconductor layer 242b can be apart from the trap states owing to the existence of the semiconductor layer 242a and the semiconductor layer 242c.

In the case where the transistor 451 has an s-channel structure, a channel is formed in the whole of the semiconductor layer 242b seen in the portion along W1-W2. Therefore, as the thickness of the semiconductor layer 242b is increased, the size of the channel region is increased. In other words, as the thickness of the semiconductor layer 242b is increased, the on-state current of the transistor 451 can be increased. For example, the semiconductor layer 242b has a region with a thickness greater than or equal to 10 nm, preferably greater than or equal to 40 nm, further preferably greater than or equal to 60 nm, still further preferably greater than or equal to 100 nm. Note that the semiconductor layer 242b has a region with a thickness of, for example, less than or equal to 300 nm, preferably less than or equal to 200 nm, or further preferably less than or equal to 150 nm because the productivity of the semiconductor device including the transistor 451 might be decreased. In some cases, when the channel formation region is reduced in size, the electrical characteristics of the transistor with a smaller thickness of the semiconductor layer 242b are higher than those of the transistor with a larger thickness of the semiconductor layer 242b. Therefore, the semiconductor layer 242b may have a thickness less than 10 nm.

Moreover, the thickness of the semiconductor layer 242c is preferably as small as possible to increase the on-state current of the transistor 451. For example, the semiconductor layer 242c may have a region with a thickness less than 10 nm, preferably less than or equal to 5 nm, and further preferably less than or equal to 3 nm. Meanwhile, the semiconductor layer 242c has a function of blocking entry of elements other than oxygen (such as hydrogen and silicon) included in the adjacent insulator into the semiconductor layer 242b where a channel is formed. For this reason, it is preferable that the semiconductor layer 242c have a certain thickness. The semiconductor layer 242c may have a region with a thickness greater than or equal to 0.3 nm, preferably greater than or equal to 1 nm, further preferably greater than or equal to 2 nm, for example.

To improve the reliability, preferably, the thickness of the semiconductor layer 242a is large and the thickness of the semiconductor layer 242c is small. For example, the semiconductor layer 242a may have a region with a thickness greater than or equal to 10 nm, preferably greater than or equal to 20 nm, further preferably greater than or equal to 40 nm, still further preferably greater than or equal to 60 nm. When the thickness of the semiconductor layer 242a is made large, a distance from an interface between the adjacent insulator and the semiconductor layer 242a to the semiconductor layer 242b in which a channel is formed can be large. Since the productivity of the semiconductor device including the transistor 451 might be decreased, the semiconductor layer 242a has a region with a thickness, for example, less than or equal to 200 nm, preferably less than or equal to 120 nm, or further preferably less than or equal to 80 nm.

Note that silicon contained in the oxide semiconductor might serve as a carrier trap or a carrier generation source. Therefore, the silicon concentration in the semiconductor layer 242b is preferably as low as possible. For example, a region with the silicon concentration lower than $1 \times 10^{19}$ atoms/cm$^3$, preferably lower than $5 \times 10^{18}$ atoms/cm$^3$, or further preferably lower than $2 \times 10^{18}$ atoms/cm$^3$ which is measured by secondary ion mass spectrometry (SIMS) is provided between the semiconductor layer 242b and the semiconductor layer 242a. A region with the silicon concentration of lower than $1 \times 10^{19}$ atoms/cm$^3$, preferably lower than $5 \times 10^{18}$ atoms/cm$^3$, further preferably lower than $2 \times 10^{18}$ atoms/cm$^3$ which is measured by SIMS is provided between the semiconductor layer 242b and the semiconductor layer 242c.

It is preferable to reduce the concentrations of hydrogen in the semiconductor layer 242a and the semiconductor layer 242c in order to reduce the concentration of hydrogen in the semiconductor layer 242b. The semiconductor layer 242a and the semiconductor layer 242c each have a region in which the concentration of hydrogen measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the semiconductor layer 242a and the semiconductor layer 242c in order to reduce the concentration of nitrogen in the semiconductor layer 242b. The semiconductor layer 242a and the semiconductor layer 242c each have a region in which the concentration of nitrogen measured by SIMS is lower than $5\times10^{19}$ atoms/cm$^3$, preferably less than or equal to $5\times10^{18}$ atoms/cm$^3$, further preferably less than or equal to $1\times10^{18}$ atoms/cm$^3$, still further preferably less than or equal to $5\times10^{17}$ atoms/cm$^3$.

Note that when copper enters the oxide semiconductor, an electron trap might be generated. The electron trap might shift the threshold voltage of the transistor in the positive direction. Therefore, the concentration of copper on the surface of or in the semiconductor layer 242b is preferably as low as possible. For example, the semiconductor layer 242b preferably has a region in which the concentration of copper is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

The above three-layer structure is an example. For example, a two-layer structure without either one of the semiconductor layer 242a and the semiconductor layer 242c may be employed. A four-layer structure in which any one of the semiconductors described as examples of the semiconductor layer 242a, the semiconductor layer 242b, and the semiconductor layer 242c is provided below or over the semiconductor layer 242a or below or over the semiconductor layer 242c may be employed. An n-layer structure (n is an integer of 5 or more) may be included in which any one of the semiconductors described as examples of the semiconductor layers 242a, 242b, and 242c is provided at two or more of the following positions: over the semiconductor layer 242a, below the semiconductor layer 242a, over the semiconductor layer 242c, and below the semiconductor layer 242c may be employed.

In particular, in the transistor 451 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, whereby the influence of the trap state can be further reduced.

Each of the band gaps of the semiconductor layer 242a and the semiconductor layer 242c is preferably larger than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small off-state current. Specifically, the off-state current per micrometer in channel width at room temperature (25° C.) and at a source-drain voltage of 3.5 V can be lower than $1\times10^{-20}$ A, lower than $1\times10^{-22}$ A, or lower than $1\times10^{-24}$ A. That is, the on/off ratio of the transistor can be greater than or equal to 20 digits and less than or equal to 150 digits. An OS transistor has high withstand voltage between its source and drain. With use of the OS transistor, a semiconductor device with high output voltage and high withstand voltage can be achieved.

With one embodiment of the present invention, a transistor with small power consumption can be provided. Accordingly, a semiconductor device with small power consumption can be provided.

The electrode 224 that can function as a back gate is not necessary provided, depending on the purpose. FIG. 21A is a top view of a transistor 451a. FIG. 21B is a cross-sectional view of a portion indicated by the dashed-dotted line L1-L2 in FIG. 21A. FIG. 21C is a cross-sectional view of a portion indicated by the dashed-dotted line W1-W2 in FIG. 21A. The transistor 451a has a structure in which the electrode 224, the insulating layer 273, the insulating layer 274, and the insulating layer 282 are removed from the transistor 451. The productivity of transistor can be improved by omission of the electrode and insulating layer. Thus, the productivity of semiconductor device can be improved.

FIGS. 22A to 22C illustrate another example of an s-channel transistor. FIG. 22A is a top view of a transistor 452. FIG. 22B and FIG. 22C are cross-sectional views of portions indicated by the dashed-dotted line L1-L2 and the dashed-dotted line W1-W2 in FIG. 22A.

Although the transistor 452 has a structure similar to that of the transistor 451, there is a different point in that the electrode 244a and the electrode 244b are in contact with the side surfaces of the semiconductor layer 242a and the semiconductor layer 242b. As the insulating layer 228 covering the transistor 452, an insulating layer with a flat surface such as that in the transistor 451 may be used. In addition, the electrode 225a, the electrode 225b, and the electrode 225c may be provided over the insulating layer 229.

Figure 23A:
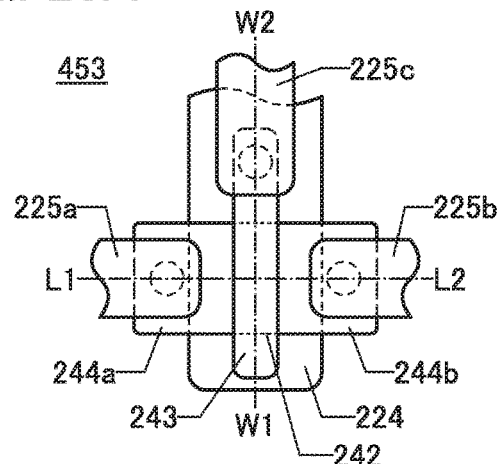
FIGS. 23A and 23B illustrate an example of a transistor.
Figure 23B:
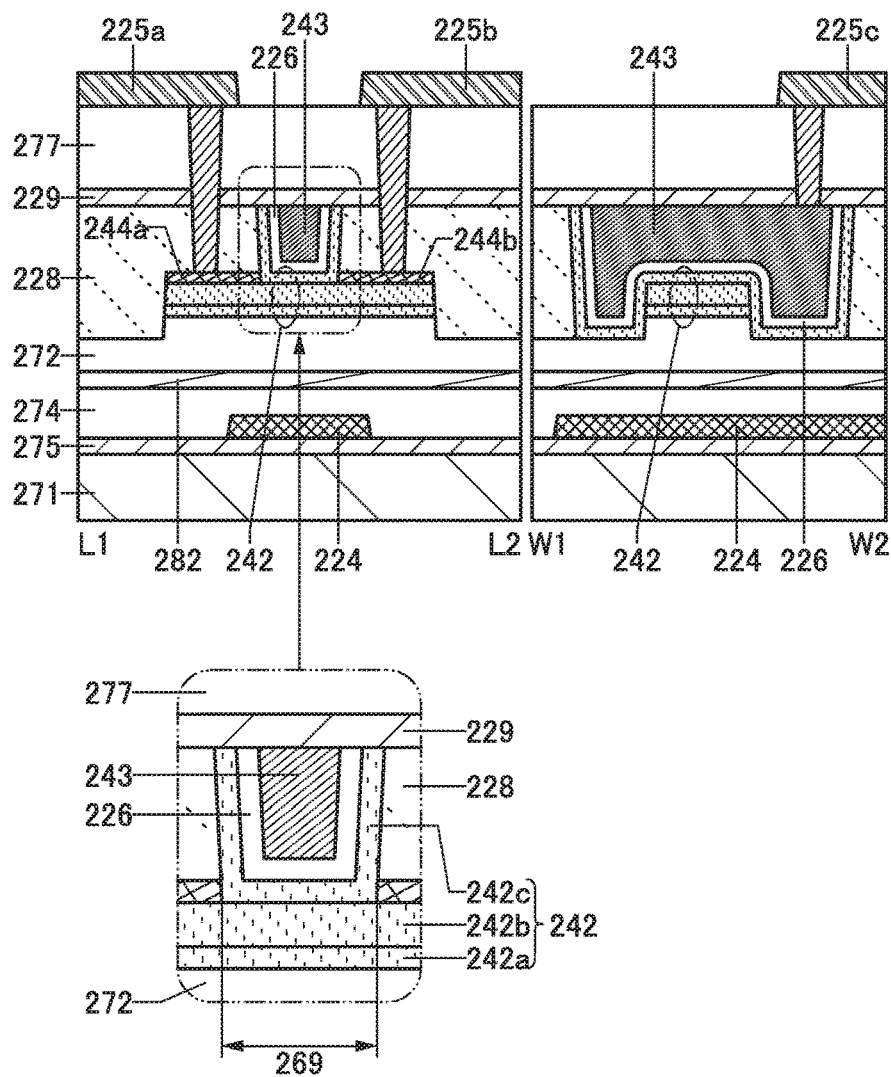

FIGS. 23A and 23B illustrate another example of an s-channel transistor. FIG. 23A is a top view of a transistor 453. FIG. 23B is a cross-sectional view of portions indicated by the dashed-dotted line L1-L2 and the dashed-dotted line W1-W2 in FIG. 23A. As in the transistor 451, the transistor 453 includes the semiconductor layer 242a and the semiconductor layer 242b over the projection of the insulating layer 272. The electrode 244a and the electrode 244b are provided over the semiconductor layer 242b. A region of the oxide semiconductor layer 242b which overlaps with the electrode 244a can function as one of a source and a drain of the transistor 453. A region of the oxide semiconductor layer 242b which overlaps with the electrode 244b can function as the other of the source and the drain of the transistor 453. Thus, a region 269 of the oxide semiconductor layer 242b which is located between the electrode 244a and the electrode 244b can function as a channel formation region.

In the transistor 453, an opening is provided in a region overlapping with the region 269 by removing part of the insulating layer 228, and the semiconductor layer 242c is provided along a side and bottom surfaces of the opening. In the opening, the insulating layer 226 is provided along the side and bottom surfaces of the opening with the oxide semiconductor layer 242c located therebetween. In addition, in the opening, the electrode 243 is provided along the side and bottom surfaces of the opening with the oxide semiconductor layer 242c and the insulating layer 226 located therebetween.

Note that the opening is wider than the oxide semiconductor layer 242a and the oxide semiconductor layer 242b in the cross section in the channel width direction. Thus, in the region 269, side surfaces of the semiconductor layer 242a and the semiconductor layer 242b are covered with the semiconductor layer 242c.

The insulating layer 229 is provided over the insulating layer 228 and an insulating layer 277 is provided over the insulating layer 229. The electrode 225a, the electrode 225b, and the electrode 225c are provided over the insulating layer 277. The electrode 225a is electrically connected to the electrode 244a via a contact plug in an opening formed by removing part of the insulating layers 277, 229, and 228. The electrode 225b is electrically connected to the electrode 244b via a contact plug in an opening formed by removing part of the insulating layers 277, 229, and 228. The electrode 225c is electrically connected to the electrode 243 via a contact plug in an opening formed by removing part of the insulating layers 277 and 229.

Figure 24A:
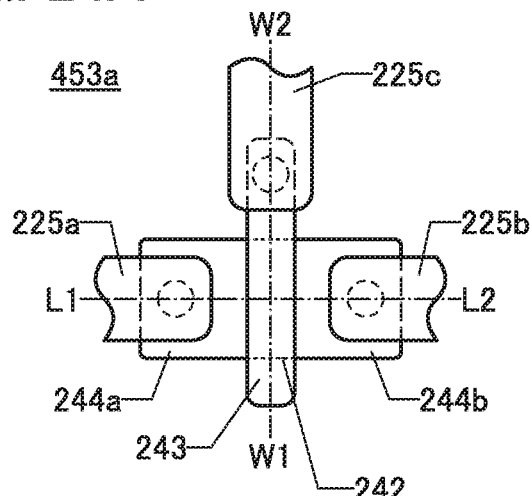
FIGS. 24A and 24B illustrate an example of a transistor.
Figure 24B:
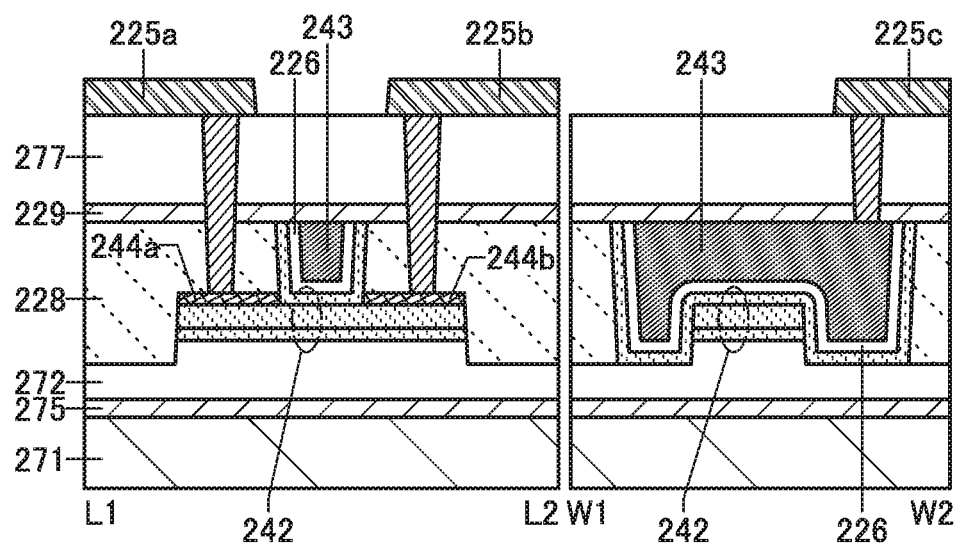

The electrode 224 that can function as a back gate is not necessarily provided, depending on the purpose. FIG. 24A is a top view of a transistor 453a. FIG. 24B is a cross-sectional view of portions indicated by the dashed-dotted line L1-L2 and the dashed-dotted line W1-W2 in FIG. 24A. The transistor 453a has a structure in which the electrode 224, the insulating layer 274, and the insulating layer 282 are removed from the transistor 453. The productivity of the transistor can be improved by omission of the electrode and the insulating layers. Accordingly, the productivity of the semiconductor device can be improved.

Figure 25A:
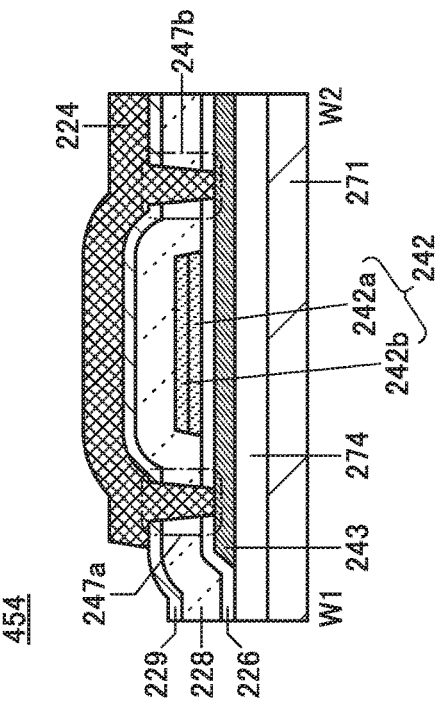
FIGS. 25A to 25C illustrate an example of a transistor.
Figure 25B:
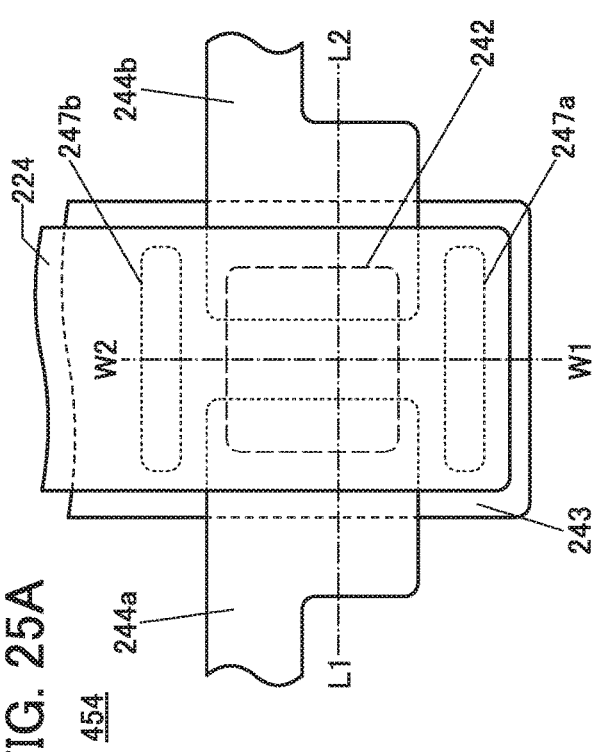
Figure 25C:
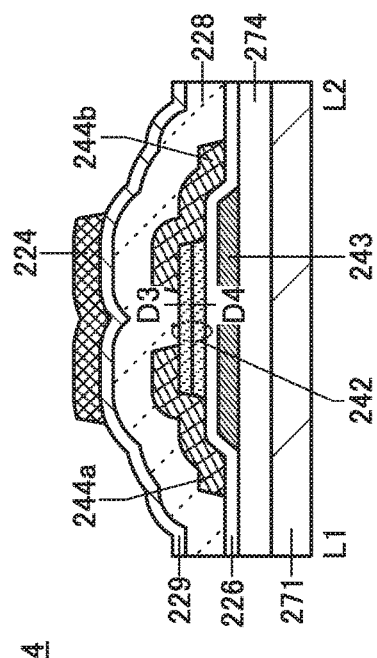

FIGS. 25A to 25C illustrate another example of an s-channel transistor. FIG. 25A is a top view of a transistor 454. FIG. 25B is a cross-sectional view of a portion indicated by the dashed-dotted line L1-L2 in FIG. 25A. FIG. 25C is a cross-sectional view of a portion indicated by the dashed-dotted line W1-W2 in FIG. 25A.

The transistor 454 is a kind of bottom-gate transistor having a back-gate electrode. In the transistor 454, the electrode 243 is formed over the insulating layer 274, and the insulating layer 226 is provided to cover the electrode 243. The semiconductor layer 242 is formed in a region that is over the insulating layer 226 and overlaps with the electrode 243. The semiconductor layer 242 in the transistor 454 has a stacked structure of the semiconductor layer 242a and the semiconductor layer 242b.

The electrode 244a and the electrode 244b are formed so as to be partly in contact with the semiconductor layer 242 and be over the insulating layer 226. The insulating layer 228 is formed so as to be partly in contact with the semiconductor layer 242 and be over the electrode 244a and the electrode 244b. The insulating layer 229 is formed over the insulating layer 228. The electrode 224 is formed in a region that is over the insulating layer 229 and overlaps with the semiconductor layer 242.

The electrode 224 provided over the insulating layer 229 is electrically connected to the electrode 243 in an opening 247a and an opening 247b provided in the insulating layer 229, the insulating layer 228, and the insulating layer 226. Accordingly, the same potential is supplied to the electrodes 224 and 243. Furthermore, either or both of the openings 247a and 247b may be omitted. In the case where neither the opening 247a nor the opening 247b are provided, different potentials can be supplied to the electrode 224 and the electrode 243.

<Energy Band Structure (2) of Semiconductor Layer 242>

Figure 28B:
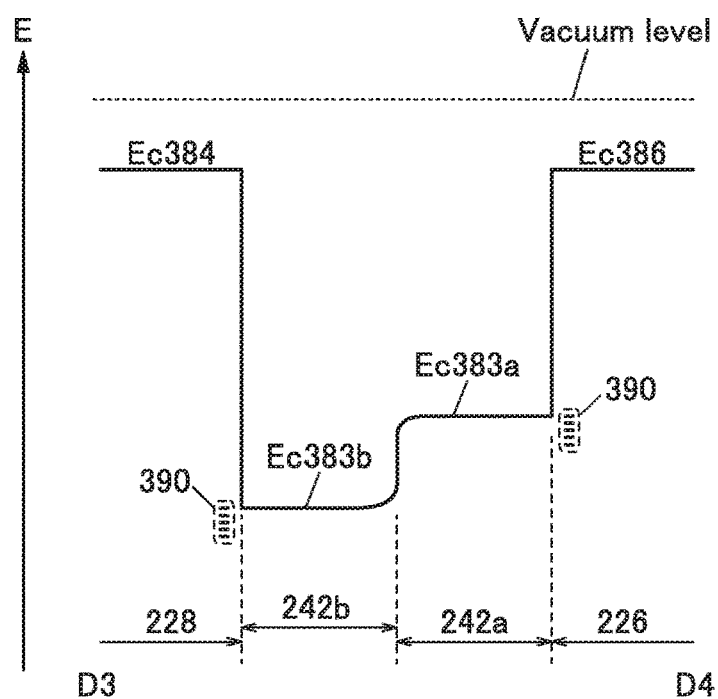

FIG. 28B is an energy band structure diagram showing a portion along the dashed-dotted line D3-D4 in FIG. 25B. FIG. 28B shows the energy band structure of a channel formation region of the transistor 454.

In FIG. 28B, Ec384 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

Figure 26A:
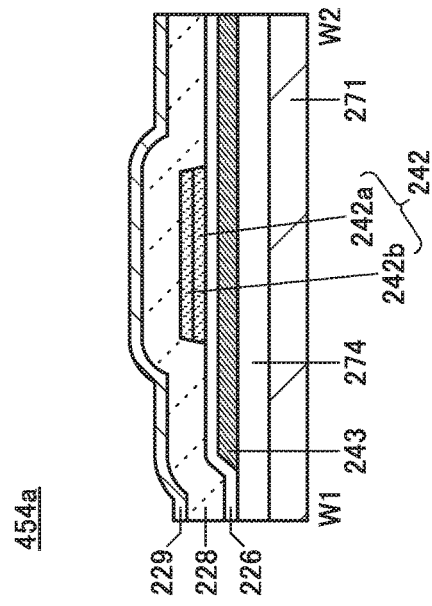
FIGS. 26A to 26C illustrate an example of a transistor.
Figure 26B:
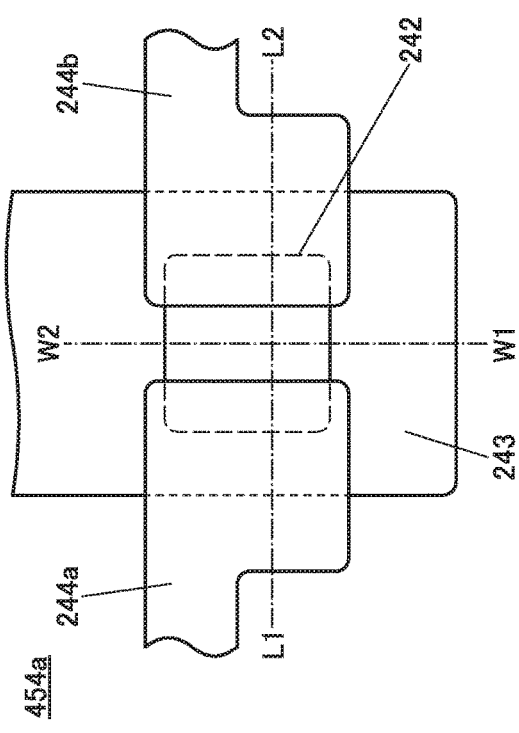
Figure 26C:
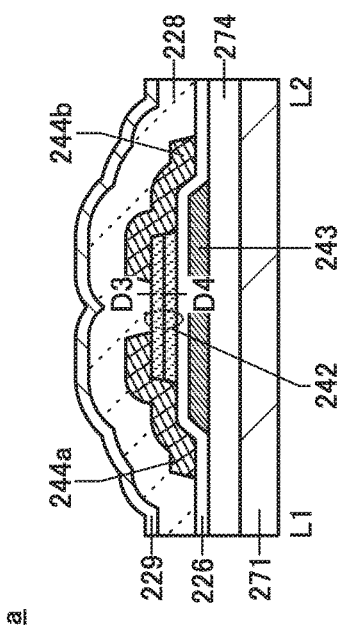

The electrode 224 that can function as a back gate is not necessary provided, depending on the purpose. FIG. 26A is a top view of a transistor 454a. FIG. 26B and FIG. 26C are cross-sectional views of portions indicated by the dashed-dotted line L1-L2 and the dashed-dotted line W1-W2 in FIG. 26A. The transistor 454a has a structure in which the electrode 224, the opening 247a, and the opening 247b are removed from the transistor 454. The productivity of the transistor can be improved by omission of the electrode and the openings. Accordingly, the productivity of the semiconductor device can be improved.

Figure 27A:
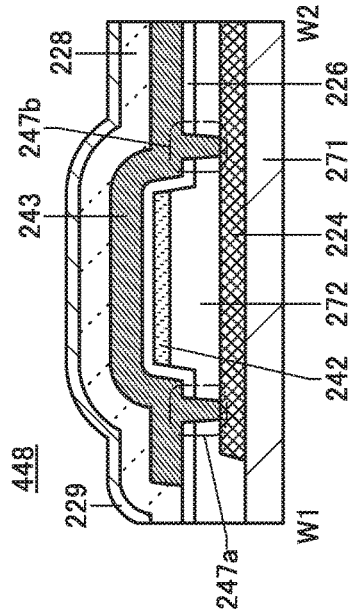
FIGS. 27A to 27C illustrate an example of a transistor.
Figure 27B:
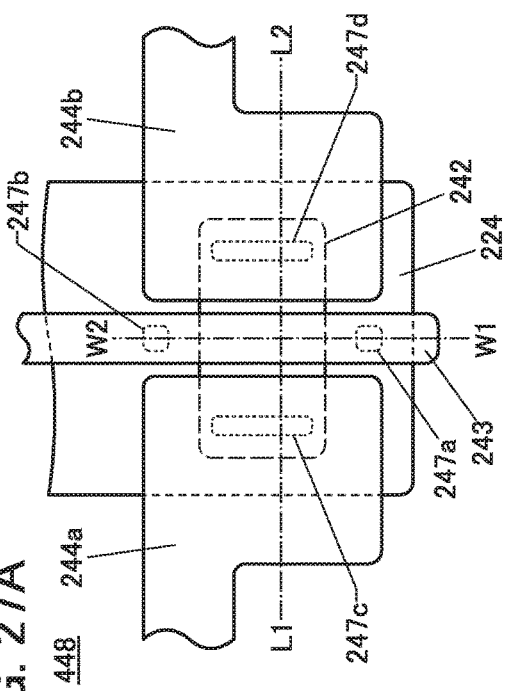
Figure 27C:
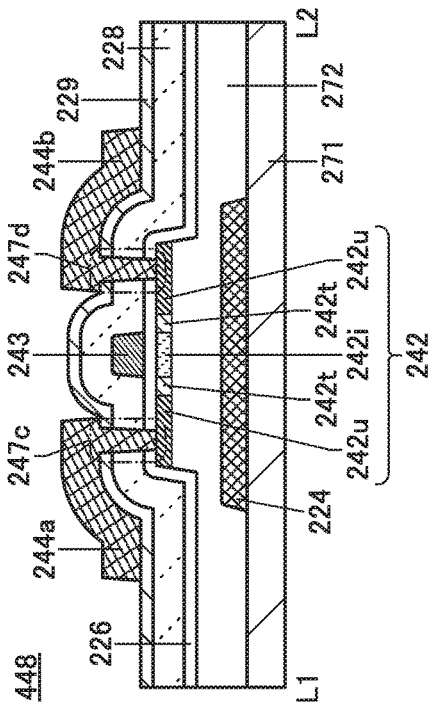

FIGS. 27A to 27C illustrate an example of a transistor with an s-channel structure. A transistor 448 in FIGS. 27A to 27C has almost the same structure as the transistor 447. The transistor 448 is a kind of top-gate transistor having a back-gate electrode. FIG. 27A is a top view of the transistor 448. FIG. 27B is a cross-sectional view of a portion indicated by the dashed-dotted line L1-L2 in FIG. 27A. FIG. 27C is a cross-sectional view of a portion indicated by the dashed-dotted line W1-W2 in FIG. 27A.

FIGS. 27A to 27C illustrate an example in which an inorganic semiconductor layer such as a silicon layer is used as the semiconductor layer 242 in the transistor 448. In FIGS. 27A to 27C, the electrode 224 is provided over the substrate 271, and the insulating layer 272 is provided over the electrode 224. In addition, the semiconductor layer 242 is formed over a projection of the insulating layer 272.

The semiconductor layer 242 includes a semiconductor layer 242i, two semiconductor layers 242t, and two semiconductor layers 242u. The semiconductor layer 242i is sandwiched between the two semiconductor layers 242t. The semiconductor layer 242i and the two semiconductor layers 242t are sandwiched between the two semiconductor layers 242u. The electrode 243 is provided in a region overlapping with the semiconductor layer 242i.

A channel is formed in the semiconductor layer 242i when the transistor 448 is on. Therefore, the semiconductor layer 242i serves as a channel formation region. The semiconductor layers 242t serve as low concentration impurity regions (i.e., LDD). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244a provided over the insulating layer 229 is electrically connected to one of the semiconductor layers 242u in an opening 247c formed in the insulating layers 226, 228, and 229. The electrode 244b provided over the insulating layer 229 is electrically connected to the other of the semiconductor layers 242u in an opening 247d formed in the insulating layers 226, 228, and 229.

The electrode 243 provided over the insulating layer 226 is electrically connected to the electrode 224 in the opening 247a and the opening 247b formed in the insulating layers 226 and 272. Accordingly, the same potential is supplied to the electrodes 243 and 224. Furthermore, either or both of the openings 247a and 247b may be omitted. In the case where neither the opening 247a nor the opening 247b are provided, different potentials can be applied to the electrode 243 and the electrode 224.

<Film Formation Method>

The conductive layer such as the electrode, the insulating layer, and the semiconductor layer in this specification and the like can be formed by a chemical vapor deposition (CVD) method, an evaporation method, a sputtering method, or the like. The CVD method generally includes a plasma enhanced CVD (PECVD) method using plasma, a thermal CVD (TCVD) method using heat, and the like. In addition, there is an atmospheric pressure CVD (APCVD) for performing deposition under an atmospheric pressure. The CVD method can be further classified into a metal CVD (MCVD) method and a metal organic CVD (MOCVD) method according to a source gas to be used.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is typically classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Further, step coverage can be improved because an incident angle of a sputtered particle to the substrate can be made smaller depending on the inclination of the target.

Different from a film formation method whereby particles released from a target are deposited, a CVD method and an ALD method are film formation methods whereby a film is formed by a reaction at a surface of an object of the treatment. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is skipped. Thus, transistors or semiconductor devices can be manufactured with improved productivity.

<Material Used in Transistor or the Like>

[Substrate]

There is no great limitation on a material used for the substrate 271. The material may be determined in accordance with the required characteristics; for example, whether it has light-transmitting property or not or heat resistance that can endure heat treatment or not is taken into consideration for the determination. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 271.

As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide, or the like is used, for example. The semiconductor substrate may be a single-crystal semiconductor substrate or a polycrystalline semiconductor substrate.

As materials of the flexible substrate, the attachment film, and the base material film, the following materials can be used: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy-based resin, an acrylic-based resin, and the like.

The flexible substrate used as the substrate 271 preferably has a lower coefficient of linear expansion because a lower coefficient of linear expansion suppresses deformation due to an environment. The flexible substrate used as the substrate 271 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. In particular, aramid is preferably used for the flexible substrate because of its low coefficient of linear expansion.

[Insulating Layer]

Each of the insulating layer 272, the insulating layer 273, the insulating layer 274, the insulating layer 275, the insulating layer 282, the insulating layer 228, the insulating layer 226, the insulating layer 229, and the insulating layer 277 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 275 and the insulating layer 229 be formed using an insulating material that is relatively impermeable to impurities. The insulating layers 275 and 229 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 273 or 229 may be formed using indium tin zinc oxide (In—Sn—Zn oxide) having an excellent insulating property or the like.

When the insulating material that is relatively impermeable to impurities is used for the insulating layer 275, impurity diffusion from the substrate 271 side can be suppressed, and the reliability of the transistor can be improved. When the insulating material that is relatively impermeable to impurities is used for the insulating layer 229, impurity diffusion from the insulating layer 229 side can be suppressed, and the reliability of the transistor can be improved.

A plurality of insulating layers formed using any of the above-described materials may be stacked as each of the insulating layer 272, the insulating layer 273, the insulating layer 274, the insulating layer 282, the insulating layer 228, the insulating layer 226, the insulating layer 229, and the insulating layer 277. The formation method of the insulating layers 272, 273, 274, 282, 228, 226, 229, and 277 is not particularly limited, and a sputtering method, a CVD method, an MBE method, a PLD method, an ALD method, a spin coating method, or the like can be used.

For example, in the case where an aluminum oxide film is formed by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

When an oxide semiconductor is used for the semiconductor layer 242, the hydrogen concentration in the insulating layers is preferably lowered in order to prevent an increase in the hydrogen concentration in the semiconductor layer 242. It is particularly preferable to lower the hydrogen concentration of the insulating layer in contact with the semiconductor layer 242. Specifically, the hydrogen concentration in the insulating layer, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration in the insulating layers is preferably low in order to prevent an increase in the nitrogen concentration in the semiconductor layer 242. It is particularly preferable to lower the nitrogen concentration of the insulating layer in contact with the semiconductor layer 242. Specifically, the nitrogen concentration in the insulating layer, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The concentration measured by SIMS analysis may include a variation within a range of ±40%.

When an oxide semiconductor is used for the semiconductor layer 242, the insulating layers are preferably formed with insulating layers from which oxygen is released by heating. It is particularly preferable that an insulating layer in contact with the semiconductor layer 242 be an insulating layer from which oxygen is released by heating. For example, it is preferable to use an insulating layer in which the amount of released oxygen converted into oxygen atoms is $1.0\times10^{18}$ atoms/cm$^3$ or more, further preferably $1.0\times10^{19}$ atoms/cm$^3$ or more, still further preferably $1.0\times10^{20}$ atoms/cm$^3$ or more, in thermal desorption spectroscopy (TDS) analysis performed under such a condition that a surface of the insulating layer is heated at a temperature higher than or equal to 100° C. and lower than or equal to 700° C., preferably higher than or equal to 100° C. and lower than or equal to 500° C. Note that in this specification and the like, oxygen released by heating is referred to as "excess oxygen". In addition, an insulating layer from which oxygen is released by heating is also referred to as an "insulating layer containing excess oxygen".

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The formation of an insulating layer by sputtering in an atmosphere including oxygen allows introduction of oxygen into the insulating layer.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, current unintentionally flowing between the two electrodes (leakage current) tends to increase and the withstand voltage of the capacitor tends to be lower.

A portion where a gate electrode, a gate insulating layer, and a semiconductor layer of a transistor overlap with each other functions as the capacitor (hereinafter also referred to as "gate capacitor"). A channel is formed in a region in the semiconductor layer, which overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used as a dielectric, even if the thickness of the dielectric is made thick, sufficient capacitance of the capacitor can be ensured.

For example, in the case where a high-k material with a high dielectric constant is used as the dielectric, even when the dielectric is made thick, a capacitance equivalent to that in the case of using silicon oxide as the dielectric can be obtained. This enables a reduction in leakage current between the two electrodes of the capacitor. The dielectric may have a stacked-layer structure of the high-k material and another insulating material.

The insulating layer 228 has a flat surface. As the insulating layer 228, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, phosphosilicate glass (PSG), borophosphosilicate glass (BPSG), or the like. Note that a plurality of insulating layers formed of these materials may be stacked to form the insulating layer 228.

Note that the siloxane-based resin corresponds to a resin including an Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the insulating layer 228, and any of the following methods that depend on a material thereof can be used: a sputtering method; an SOG method; spin coating; dipping; spray coating; a droplet discharging method (e.g., an ink-jet method); a printing method (e.g., screen printing, or offset printing); or the like.

The sample surface may be subjected to CMP treatment. The CMP treatment can reduce unevenness of the surface, and coverage whereby an insulating layer or a conductive layer to be formed later can be increased.

[Semiconductor Layer]

A single-crystal semiconductor, a polycrystalline semiconductor, a microcrystalline semiconductor, an amorphous semiconductor, or the like may be used for the semiconductor layer 242. As a semiconductor material, silicon, germanium, or the like can be used. Alternatively, a compound semiconductor of silicon germanium, silicon carbide, gallium arsenide, oxide semiconductor, nitride semiconductor, or the like, an organic semiconductor, or the like may be used.

In the case of using an organic semiconductor for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or wider; thus, when the oxide semiconductor is used for the semiconductor layer 242, a transistor with an extremely low off-state current can be provided. An OS transistor has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

In this embodiment, the case where an oxide semiconductor is used for the semiconductor layer 242 is described. For the oxide semiconductor used for the semiconductor layer 242, an oxide semiconductor containing, for example, indium (In) is preferably used. An oxide semiconductor can have a high carrier mobility (electron mobility) by containing indium, for example. An oxide semiconductor preferably contains an element M.

The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M. The element M is an element having a high bonding energy with oxygen, for example. The element M increases the energy gap of the oxide semiconductor, for example. Further, the oxide semiconductor preferably contains zinc. When the oxide semiconductor contains zinc, the oxide semiconductor is easily crystallized in some cases.

Note that the oxide semiconductor used for the semiconductor layer 242 is not limited to the oxide containing indium. The oxide semiconductor may be, for example, an oxide semiconductor which does not contain indium and contains zinc, an oxide semiconductor which does not contain indium and contains gallium, or an oxide semiconductor which does not contain indium and contains tin, e.g., a zinc tin oxide, a gallium tin oxide, or gallium oxide.

For example, in the case where an $InGaZnO_X$ (X>0) film is formed by a thermal CVD method as the semiconductor layer 242, trimethylindium $(In(CH_3)_3)$, trimethylgallium $(Ga(CH_3)_3)$, and dimethylzinc $(Zn(CH_3)_2)$ are used. Without limitation to the above combination, triethylgallium $(Ga(C_2H_5)_3)$ can be used instead of trimethylgallium, and diethylzinc $(Zn(C_2H_5)_2)$ can be used instead of dimethylzinc.

For example, in the case where an $InGaZnO_X$ film (X>0) is formed as the semiconductor layer 242 by the ALD method, an $In(CH_3)_3$ gas and an $O_3$ gas are sequentially introduced a plurality of times to form an $InO_2$ layer, subsequently a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by using these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas or tris(acetylacetonato)indium may be used. Note that tris(acetylacetonato)indium is also referred to as In (acac)$_3$. In addition, instead of a $Ga(CH_3)_3$ gas, a $Ga(C_2H_5)_3$ gas or tris(acetylacetonato) gallium may be used. Note that tris(acetylacetonato)gallium is also referred to as Ga(acac)$_3$. Furthermore, a $Zn(CH_3)_2$ gas or zinc acetate may be used. However, the deposition gas is not limited to these.

In the case where the oxide layer is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide semiconductor layer is formed by a sputtering method, the atomic ratio of In to M and Zn contained in the target may be 3:1:1, 3:1:2, 3:1:4, 1:1:0.5, 1:1:1, 1:1:2, 1:4:4, 5:1:7, 4:2:4.1, 5:1:6, or a ratio close to these ratios for example.

When the oxide semiconductor is formed by a sputtering method, an oxide semiconductor having an atomic ratio different from the atomic ratio of the target may be deposited. Especially for zinc, the atomic ratio of zinc in the deposited film is smaller than the atomic ratio of the target in some cases. Specifically, the film has an atomic ratio of zinc of 40 atomic % to 90 atomic % of the atomic ratio of zinc in the target.

Each of the semiconductor layer 242a, the semiconductor layer 242b, and the semiconductor layer 242c is preferably formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf and has a higher strength of bonding with oxygen than In has).

The semiconductor layer 242a and the semiconductor layer 242c are preferably formed using a material containing one or more kinds of metal elements contained in the semiconductor layer 242b. With the use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

In the case where the semiconductor layer 242b is an In-M-Zn oxide and the semiconductor layers 242a and 242c are each an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layers 242a, 242c, and 242b can be determined so that $y_1/x_1$ is larger than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. It is preferred that $y_1$ be larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layers 242a and 242c are each an In-M-Zn oxide and the summation of In and the element M is assumed to be 100 atomic %, the atomic percentages of In and an element M are preferably as follows: the percentage of In is lower than 50 atomic % and the percentage of M is higher than or equal to 50 atomic %. The percentages of In and M are more preferably as follows: the percentage of In is lower than 25 atomic % and the percentage of M is higher than or equal to 75 atomic %. In the case where the semiconductor layer 242b is an In-M-Zn oxide and the summation of In and M is assumed to be 100 atomic %, the atomic percentages of In and the element M are preferably more than or equal to 25 atomic % and less than 75 atomic %, respectively, further preferably more than or equal to 34 atomic % and less than 66 atomic %, respectively.

For example, an In—Ga—Zn oxide which is formed using a target having an atomic ratio of In:Ga:Zn=1:3:2, 1:3:4, 1:3:6, 1:4:5, 1:6:4, 1:9:6, or the atomic ratio close to these ratios, or an In—Ga oxide which is formed using a target having an atomic ratio of In:Ga=1:9 can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, 5:1:7, 4:2:4.1, or an atomic ratio close to these ratios can be used for the semiconductor layer 242b. Note that the atomic ratio of each of the semiconductor layer 242a, the semiconductor layer 242b, and the semiconductor layer 242c may vary within a range of ±20% of any of the above-described atomic ratios as an error.

The state in which impurity concentration is low and density of defect states is low (the number of oxygen vacancies is small) is referred to as a "highly purified intrinsic" or "substantially intrinsic" state. In order to give stable electrical characteristics to the OS transistor, it is preferable that impurities and oxygen vacancies in the oxide semiconductor layer be reduced to highly purify the oxide semiconductor layer so that the semiconductor layer 242 can be regarded as an intrinsic or substantially intrinsic oxide semiconductor layer. Furthermore, it is preferable that at least the channel formation region of the semiconductor layer 242 can be regarded as an intrinsic or substantially intrinsic oxide semiconductor layer.

It is preferable that impurities and oxygen vacancies in the semiconductor layer 242b be reduced to obtain a highly purified oxide semiconductor layer; accordingly, the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/cm^3$ and lower than $8\times10^{11}/cm^3$, preferably lower than $1\times10^{11}/cm^3$, further preferably lower than $1\times10^{10}/cm^3$.

When an oxide semiconductor is used for the semiconductor layer 242, the layer preferably includes c-axis aligned crystalline oxide semiconductor (CAAC-OS). A CAAC-OS is an oxide semiconductor having a plurality of c-axis aligned crystal parts.

In the oxide semiconductor layer used as the semiconductor layer 242, a region where CAAC is not formed preferably accounts for less than 20% of the whole oxide semiconductor layer.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor layer, an increase in S value due to miniaturization is less likely to occur.

Moreover, since the dielectric constant in the a-axis direction and the b-axis direction of a CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics such as a decrease in threshold voltage is caused. The more transistor is miniaturized, the more deterioration in electrical characteristics caused by the phenomena is likely to occur.

Note that after the oxide semiconductor layer is formed, oxygen doping treatment may be performed. In order to further decrease impurities such as water or hydrogen in the oxide semiconductor layer to highly purify the oxide semiconductor layer, heat treatment is preferably performed.

For example, the oxide semiconductor layer is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By the heat treatment, at the same time as the release of the impurities, oxygen contained in the insulating layer 226 is diffused to the oxide semiconductor layer and oxygen vacancies in the oxide semiconductor layer can be reduced. Note that the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be provided with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

[Electrode]

As a conductive material for forming each of the electrode 243, the electrode 224, the electrode 244*a*, the electrode 244*b*, the electrode 225*a*, and the electrode 225*b*, a material containing one or more metal elements selected from aluminum, chromium, iron, copper, silver, gold, platinum, tantalum, nickel, cobalt, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or silicide such as nickel silicide may be used. A plurality of stacked conductive layers formed with these materials may be used as the electrode.

The conductive material for forming the electrodes 243, 224, 244*a*, 244*b*, 225*a*, and 225*b* can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen. There is no particular limitation on the formation method of the conductive material, and any of a variety of formation methods such as an evaporation method, a CVD method, and a sputtering method can be employed.

[Contact Plug]

As the contact plug, a conductive material with high embeddability such as tungsten or polysilicon can be used. A side surface and a bottom surface of the material may be covered with a barrier layer (a diffusion prevention layer) of a titanium layer, a titanium nitride layer, or a stacked layer of these layers. In this case, the barrier layer is regarded as part of the contact plug in some cases.

This embodiment can be implemented in appropriate combination with any of the structures described in the other embodiments.

(Embodiment 5)

The semiconductor devices disclosed in the above embodiment can be used for a driver circuit of a display device. This embodiment describes examples where the semiconductor devices disclosed in the above embodiments are used in display devices, with reference to drawings.

<Example of Display Device>

Figure 29A:
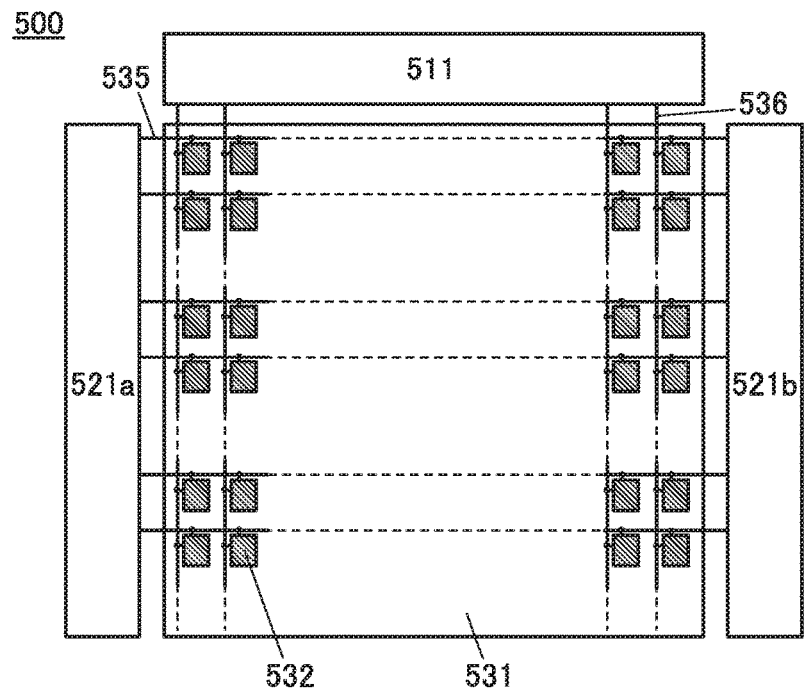
FIG. 29A is a block diagram illustrating an example of a display device.

FIG. 29A is a block diagram illustrating a structure example of a display device 500. The display device 500 in FIG. 29A includes driver circuits 511, 521*a*, and 521*b*, and a display region 531. Note that the driver circuits 511, 521*a*, and 521*b* are collectively referred to as a driver circuit or a peripheral driver circuit in some cases.

The driver circuits 521*a* and 521*b* can function as, for example, scan line driver circuits. The driver circuit 511 can function as, for example, a signal line driver circuit. Note that one of the driver circuits 521*a* and 521*b* may be omitted. Alternatively, some sort of circuit facing the driver circuit 511 with the display region 531 provided therebetween may be provided.

The display device 500 illustrated as an example in FIG. 29A includes m wirings 535 which are arranged substantially parallel to each other and whose potentials are controlled by the driver circuit 521*a* and/or the driver circuit 521*b*, and n wirings 536 which are arranged substantially parallel to each other and whose potentials are controlled by the driver circuit 511. The display region 531 includes a plurality of pixels 532 arranged in a matrix. The pixel 532 includes a pixel circuit 534 and a display element.

When every three pixels 532 function as one pixel, full-color display can be provided. The three pixels 532 each control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels controlling red light, green light, and blue light so that the four pixels 532 will collectively serve as one pixel. The addition of the pixel 532 controlling white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like). Using a larger number of pixels, the display device 500 can display an image with 16K or 32K resolution.

A wiring 535_*i* on the i-th row (i is a natural number larger than or equal to 1 and smaller than or equal to m) is electrically connected to n pixels 532 on the i-th row among the plurality of pixels 532 arranged in m rows and n columns (m and n are each a natural number of 1 or more) in the display region 531. A wiring 536_*j* on the j-th column (j is a natural number larger than or equal to 1 and smaller than or equal to n) is electrically connected to m pixels 532 on the j-th column among the plurality of pixels 532 arranged in m rows and n columns.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. For example, the display device may be a plasma display panel (PDP).

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

FIGS. 29B and 29C and FIGS. 30A and 30B illustrate circuit structure examples that can be used for the pixel 532.

[Example of Pixel Circuit for Light-emitting Display Device]

Figure 29B:
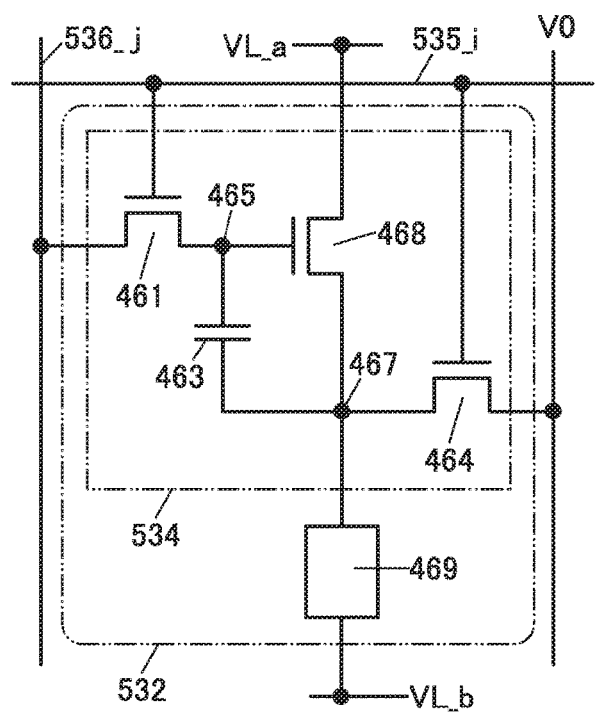
FIGS. 29B and 29C are each a circuit diagram thereof.

The pixel circuit 534 in FIG. 29B includes transistors 461, 468, and 464, and a capacitor 463. The pixel circuit 534 in FIG. 29B is electrically connected to a light-emitting element 469 that can function as a display element.

One of a source electrode and a drain electrode of the transistor 461 is electrically connected to the wiring 536_*j*. A gate electrode of the transistor 461 is electrically connected to the wiring 535_*i*. The wiring 536_*j* supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function as a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_i.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential $V_{DD}$ is supplied to one of the potential supply line VL_a and the potential supply line VL_b, and a low power supply potential $V_{SS}$ is supplied to the other, for example.

In the display device 500 including the pixel circuits 534 in FIG. 29B, the pixels 532 are sequentially selected row by row by the driver circuit 521a and/or the driver circuit 521b, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image is displayed.

Figure 30A:
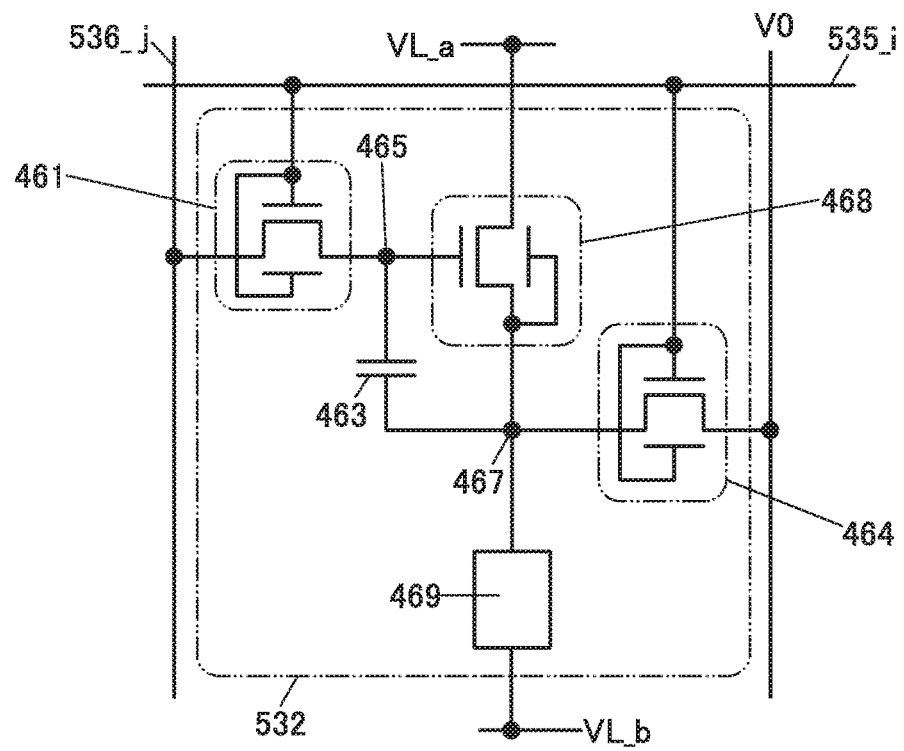
FIGS. 30A and 30B are each a diagram for describing an example of a display device.

As shown in FIG. 30A, the transistors 461, 464, and 468 may be transistors with back gates. In each of the transistors 461 and 464 in FIG. 30A, the gate is electrically connected to the back gate. Thus, the gate and back gate always have the same potential. The back gate of the transistor 468 is electrically connected to the node 467. Therefore, the back gate always has the same potential as the node 467.

[Example of Pixel Circuit for Liquid Crystal Display Device]

Figure 29C:
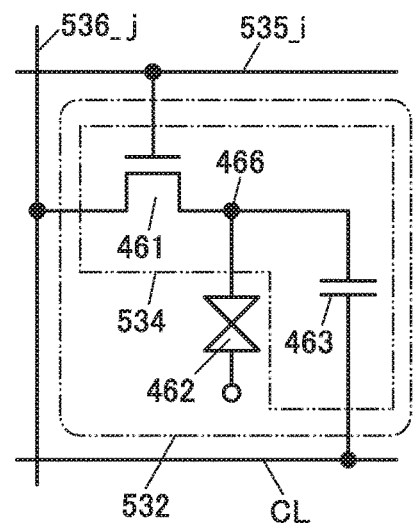

The pixel circuit 534 in FIG. 29C includes the transistor 461 and the capacitor 463. The pixel circuit 534 in FIG. 29C is electrically connected to a liquid crystal element 462 that can function as a display element.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL is supplied. Further, the potential applied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, any of the following modes can be used, for example: a TN (twisted nematic) mode, an STN (super-twisted nematic) mode, a VA (vertical alignment) mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA (multi-domain vertical alignment) mode, a PVA (patterned vertical alignment) mode, an IPS mode, an FFS (fringe field switching) mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is preferably used for a liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1 \times 10^9$ Ω·cm, preferably greater than or equal to $1 \times 10^{11}$ Ω·cm, still preferably greater than or equal to $1 \times 10^{12}$ Ω·cm. Note that the specific resistance in this specification is measured at 20° C.

In the pixel circuit 534 on the i-th row and the j-th column, one of the source electrode and the drain electrode of the transistor 461 is electrically connected to the wiring 536_j, and the other of the source electrode and the drain electrode of the transistor 461 is electrically connected to the node

466. The gate electrode of the transistor 461 is electrically connected to the wiring 535_i. The wiring 536_j supplies a video signal. The transistor 461 has a function of controlling writing of a video signal to the node 466.

One of a pair of electrodes of the capacitor 463 is electrically connected to a wiring to which a particular potential is supplied (hereinafter referred to as a capacitor line CL), and the other is electrically connected to the node 466. The potential of the capacitor line CL is set in accordance with the specifications of the pixel circuit 534 as appropriate. The capacitor 463 has a function as a storage capacitor for storing data written to the node 466.

For example, in the display device 500 including the pixel circuit 534 in FIG. 29C, the pixel circuits 534 are sequentially selected row by row by the driver circuit 521*a* and/or the driver circuit 521*b*, so that the transistors 461 are turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 30B:
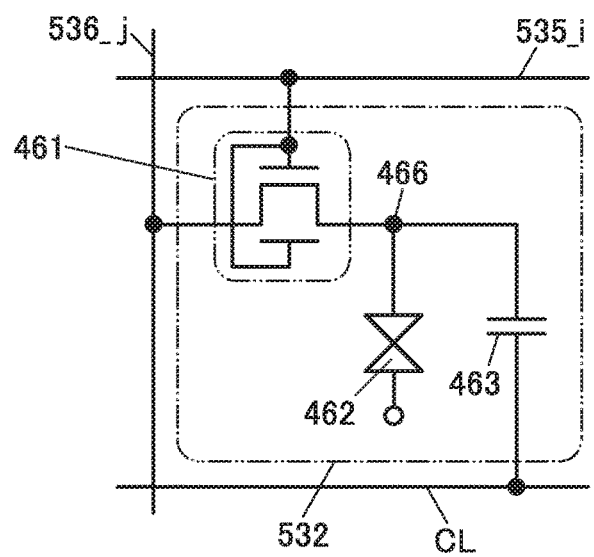

As shown in FIG. 30B, the transistor 461 may be a transistor with a back gate. In the transistor 461 in FIG. 30B, the gate is electrically connected to the back gate. Thus, the gate and back gate always have the same potential.

[Structure Example of Peripheral Circuit]

Figure 31A:
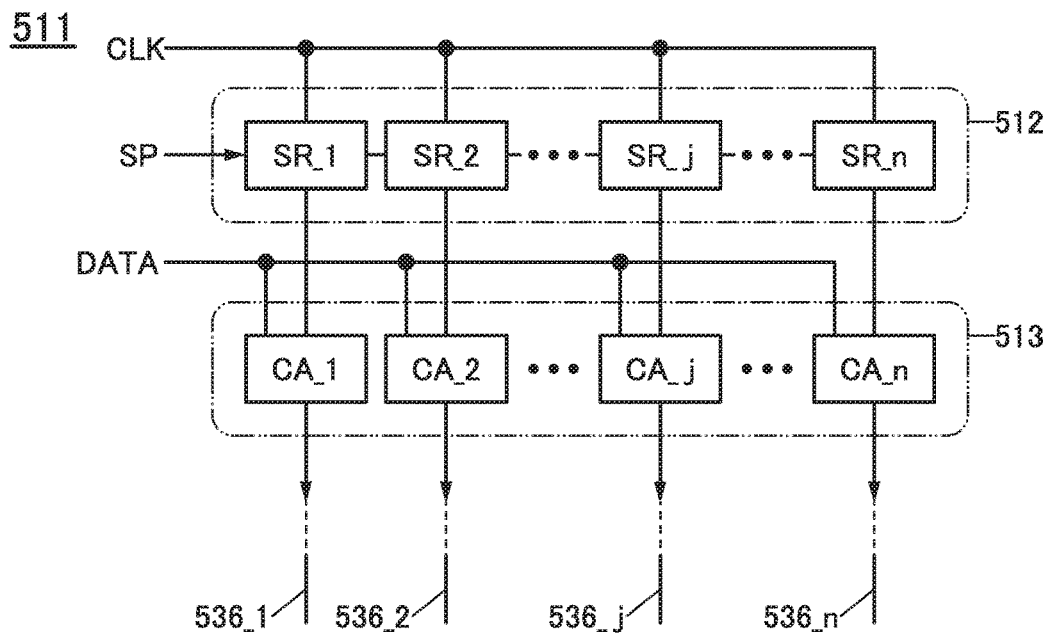
FIGS. 31A and 31B each illustrate a configuration example of a driver circuit.

A structure example of the driver circuit 511 is described with reference to FIG. 31A. The driver circuit 511 includes a shift register 512 and a DA conversion output circuit 513.

The shift register 512 has n registers SR (registers SR_1 to SR_n). A start pulse SP, a clock signal CLK, and the like are inputted to the shift register 512. The semiconductor device described in the above embodiment can be used in a circuit including the shift register 512.

The DA conversion output circuit 513 has n conversion output circuits CA (conversion output circuits CA_1 to CA_n). To the DA conversion output circuit 513, a digital signal including video data or the like is inputted. The conversion output circuit CA has a function of converting an input digital signal to an analog voltage signal.

[Operation Examples of Peripheral Circuit]

This embodiment describes operation of the driver circuit 511 by which a video signal is supplied to the wiring 536_j connected to the pixel circuit 534 on the i-th row.

When the wiring 535_i on the i-th row is selected, a start pulse SP is inputted to the shift register 512. With the start pulse SP as a trigger, outputs from the registers SR_1 to SR_n of the shift register 512 are sent in order in synchronization with the clock signal CLK. Thus, the operating conversion output circuit CA_j re sequentially selected to operate in synchronization with the clock signal CLK.

Specifically, when the start pulse SP is inputted to the shift register 512, first, a column selection signal that notifies the selection of the first column is inputted from the first register SR_1 to the conversion output circuit CA_1. That is, a column selection signal that notifies the selection of the j-th column is inputted to the conversion output circuit CA_j.

The conversion output circuit CA_1 to which the column selection signal is inputted converts the digital signal that had been inputted to the conversion output circuit CA_1, into an analog voltage signal (video signal), and outputs the signal to the wiring 536_j.

The above operation is repeated until it is conducted to the m-th row and n-th column, and then writing of a next frame starts. In this way, an image can be displayed on the display region 531.

Figure 31B:
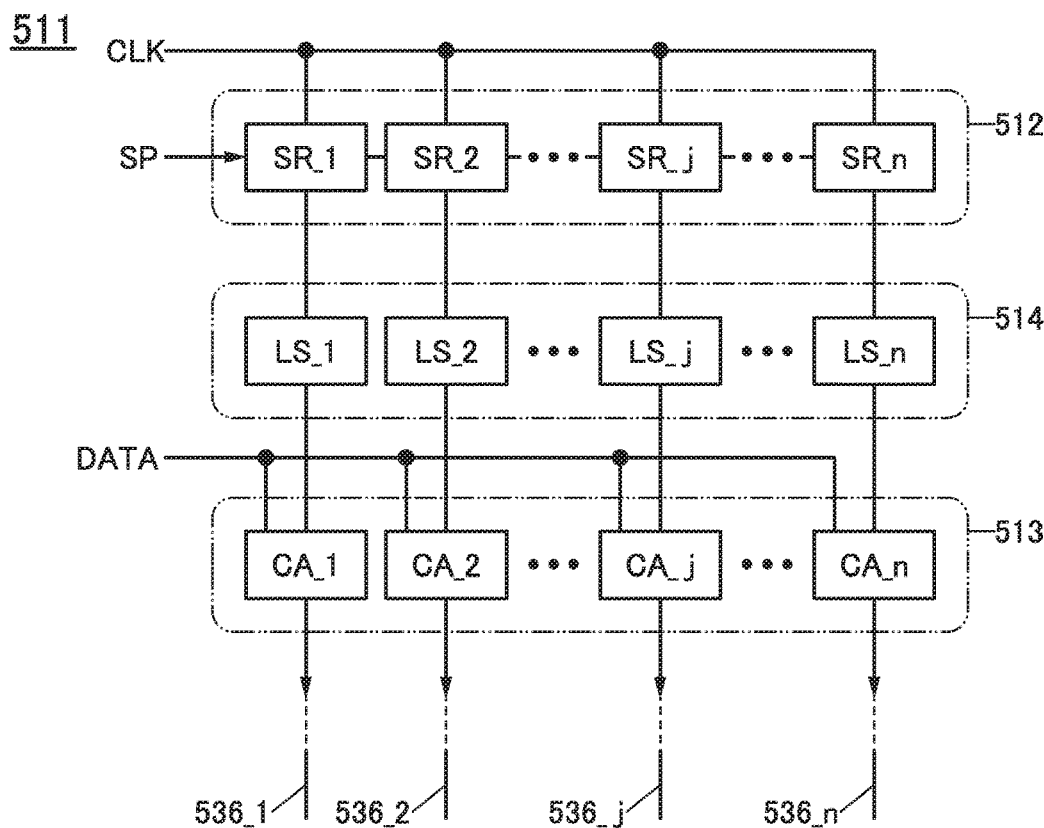

As shown in FIG. 31B, a level shifter 514 may be provided between the shift register 512 and the DA conversion output circuit 513. The level shifter 514 includes shifters LS (shifters LS_1 to LS_n) that respectively corresponds to the columns. A shifter LS_j on the j-th column has a function of widening the voltage amplitude of a signal outputted from the shift register 512 and inputting it to the conversion output circuit CA_j. With the level shifter 514, the driving voltage for the shift register 512 can be reduced. Accordingly, power consumption of the display device 500 can be reduced.

This embodiment can be implemented in appropriate combination with any of the structures described in the other embodiments and the like.

(Embodiment 6)

With use of the transistor and the semiconductor device described in the above embodiment, some or all of driver circuits which include transistors can be formed over a substrate where a pixel portion is formed, whereby a system-on-panel can be obtained. Structure examples of a display device to which the transistor described in the above embodiment can be used are described with reference to FIGS. 32A to 32C and FIGS. 33A and 33B.

<Examples of Liquid Crystal Display Device and EL Display Device>

Figure 32A:
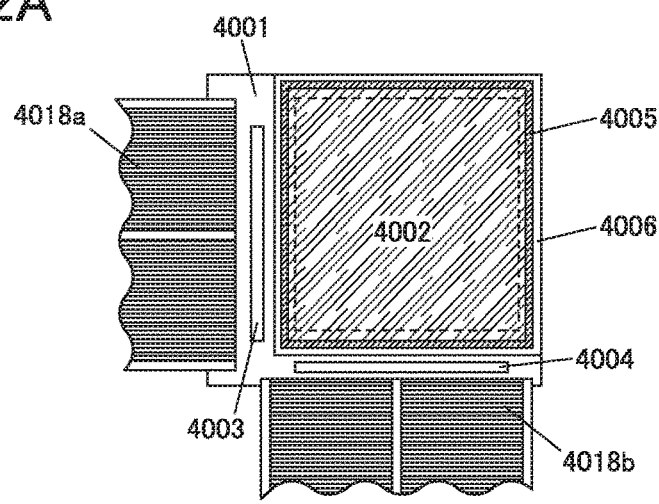
FIGS. 32A to 32C each illustrate an example of a display device.

A display device including a liquid crystal element and a display device including an EL element are described below as examples of the display device. In FIG. 32A, a sealant 4005 is provided so as to surround a pixel portion 4002 provided over a first substrate 4001, and the pixel portion 4002 is sealed with a second substrate 4006. In FIG. 32A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, and the scan line driver circuit 4004, and the pixel portion 4002 from flexible printed circuits (FPCs) 4018*a* and 4018*b*.

Figure 32B:
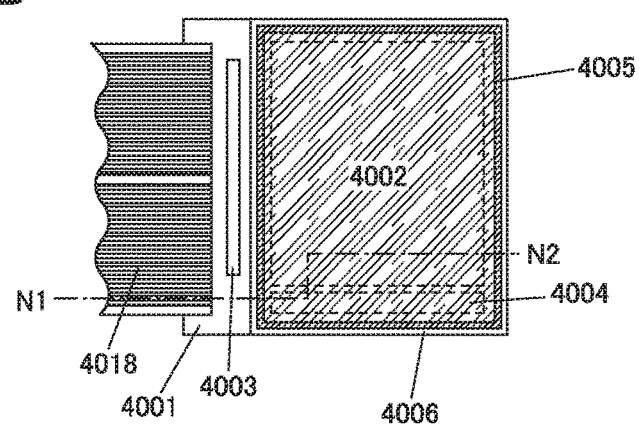
Figure 32C:
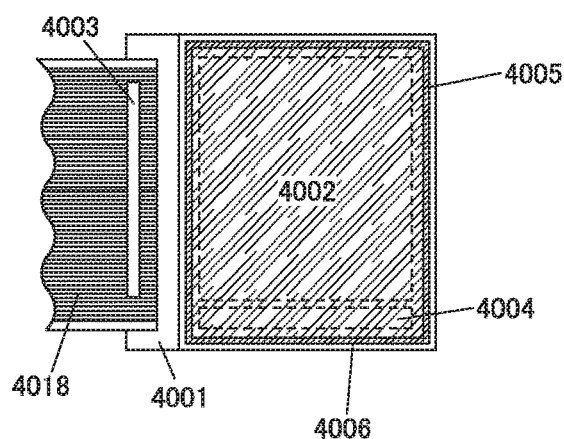

In FIGS. 32B and 32C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. Furthermore, in FIGS. 32B and 32C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 32B and 32C, various signals and potentials are supplied to the signal line driver circuit 4003, the scan line driver circuit 4004, and the pixel portion 4002 through an FPC 4018.

Although FIGS. 32B and 32C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 32A illustrate an example in which the signal line driver circuit 4003 and the scan line driver circuit 4004 are mounted by a COG. FIG. 32B illustrates an example in which the signal line driver circuit 4003 is mounted by a COG. FIG. 32C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors which are described in the above embodiments can be applied thereto.

FIGS. 33A and 33B correspond to cross-sectional views taken along chain line N1-N2 in FIG. 32B. As shown in FIGS. 33A and 33B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed using the same conductive layer as a first electrode layer 4030, and the wiring 4014 is formed using the same conductive layer as source and drain electrodes of transistors 4010 and 4011.

The pixel portion 4002 and the scan line driver circuit 4004 provided over the first substrate 4001 include a plurality of transistors. In FIGS. 33A and 33B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 33A, and a bank 4510 is further provided over the insulating layer 4112 in FIG. 33B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

The transistor described in the above embodiment can be applied to the transistors 4010 and 4011. A change in the electric characteristics of any of the transistors described in the above embodiment is suppressed and thus the transistors are electrically stable. Accordingly, the display devices of this embodiment illustrated in FIGS. 33A and 33B can be highly reliable display devices.

FIGS. 33A and 33B illustrate the case where a transistor having a structure similar to that of the transistor 452 described in the above embodiment is used as each of the transistors 4010 and 4011.

The display devices illustrated in FIGS. 33A and 33B each include a capacitor 4020. The capacitor 4020 includes a region where part of the source electrode or part of the drain electrode of the transistor 4010 overlaps with an electrode 4021 with the insulating layer 4103 interposed therebetween. The electrode 4021 is formed using the same conductive layer as the electrode 4017.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used for a pixel portion of a liquid crystal display device, the capacitance of the capacitor can be one-third or smaller, furthermore, one-fifth or smaller of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 33A. In FIG. 33A, a liquid crystal element 4013 that is the display element includes the first electrode layer 4030, a second electrode layer 4031, and a liquid crystal layer 4008. Note that an insulating layer 4032 and an insulating layer 4033 each functioning as alignment films are provided so that the liquid crystal layer 4008 is provided therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

OS transistors are preferably used as the transistors 4010 and 4011. In the OS transistor used, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a display device, high-quality images can be obtained. Since a driver circuit portion and the pixel portion can be formed over one substrate with use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The electrons and holes (i.e., carriers) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified as a dispersed inorganic EL element and a thin-film inorganic EL element depending on their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, it is acceptable as long as at least one of a pair of electrodes is transparent. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 33B illustrates an example of a light-emitting display device (also referred to as an "EL display device") using a light-emitting element as a display element. A light-emitting element 4513 which is the display element is electrically connected to the transistor 4010 provided in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic-based resin, polyimide, an epoxy-based resin, a silicone-based resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof and a nitride thereof.

A conductive composition containing a conductive high molecule (also called conductive polymer) can be used for the first electrode layer 4030 and the second electrode layer 4031. As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protective circuit for protecting the driver circuit is preferably provided. The protection circuit is preferably formed using a nonlinear element.

With use of the transistor described in the above embodiment, a highly reliable display device can be provided. With use of the transistor described in the above embodiment, a display device that has a high resolution, a large size, and high display quality can be provided. Furthermore, a display device with low power consumption can be provided.

<Example of Display Module>

Figure 34:
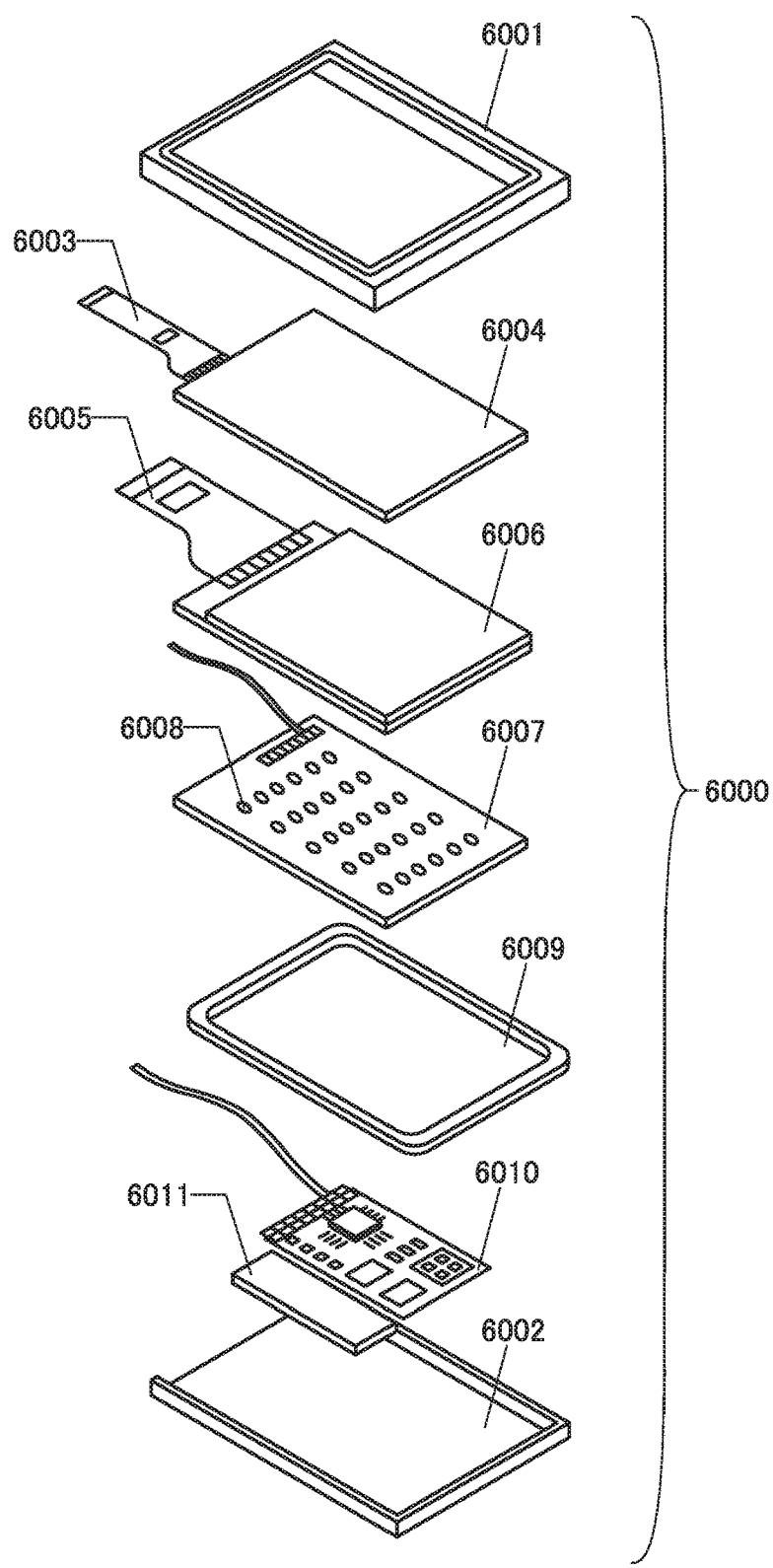
FIG. 34 illustrates an example of a display module.

A display module is described as an example of a semiconductor device using the above-described transistor. In a display module 6000 in FIG. 34, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on a printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in appropriate combination with any of the structures described in the other embodiments and the like.

(Embodiment 7)

Figure 35A:
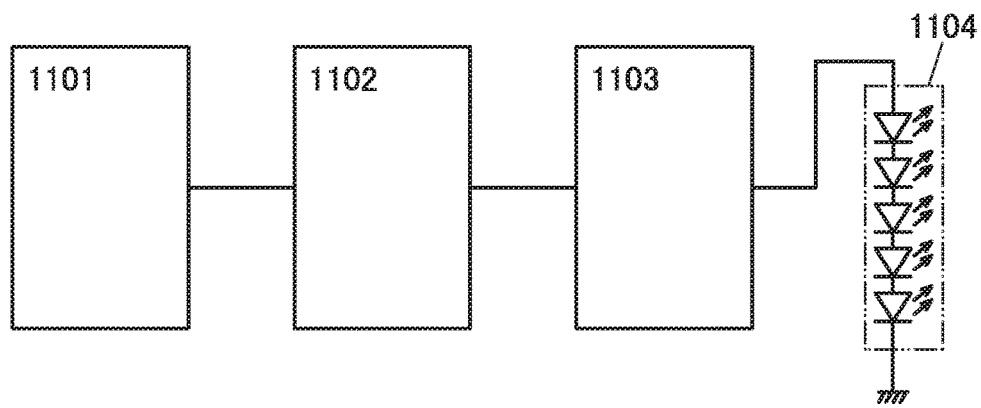
FIGS. 35A and 35B are each a block diagram illustrating an example of a semiconductor device.

The semiconductor device described in the above embodiment can be used for a lighting device. FIG. 35A is a block diagram of a lighting device 1100 as an example. The lighting device 1100 includes a controller 1101, a pre-driver 1102, a voltage generation circuit 1103, and a light-emitting portion 1104. The semiconductor device described in the above embodiment can be used for the pre-driver 1102, for example.

The light-emitting portion 1104 includes one or more LEDs 1114. Although an LED is given as an example of a light-emitting element in this embodiment, another light-emitting element can be used. The voltage generation circuit 1103 is a circuit for generating a voltage supplied to the light-emitting portion 1104. As the voltage generation circuit 1103, a switching regulator may be used, for example. The pre-driver 1102 is a circuit for driving the voltage generation circuit 1103. Thus, the voltage outputted from the voltage generation circuit 1103 is controlled by the pre-driver 1102.

The controller 1101 includes, for example, a luminance adjustment circuit, a circuit for detecting a short-circuited light-emitting portion, a light-modulation PWM-signal generation portion, and the like (not illustrated). The controller 1101 supplies a signal that determines a luminance of the light-emitting portion 1104 to the pre-driver 1102. Furthermore, a sensor such as a temperature sensor or an optical sensor can be separately provided, whereby a signal including data obtained from such a sensor can be supplied to the pre-driver 1102.

The lighting device 1100 can be used for lighting devices in a variety of fields, e.g., interior lighting devices (LED lamps and LED fluorescent lamps), outdoor lighting devices, backlight devices for liquid crystal display devices (LCDs), lighting devices for vehicles (automobiles, two wheels, and the like), lighting devices for rail cars, traffic lights, electronic message boards, and electronic signs. Examples of the lighting devices for vehicles include a headlight, a front combination lamp, a daytime running lamp, a rear combination lamp, an indicator, and a room lamp.

Figure 35B:
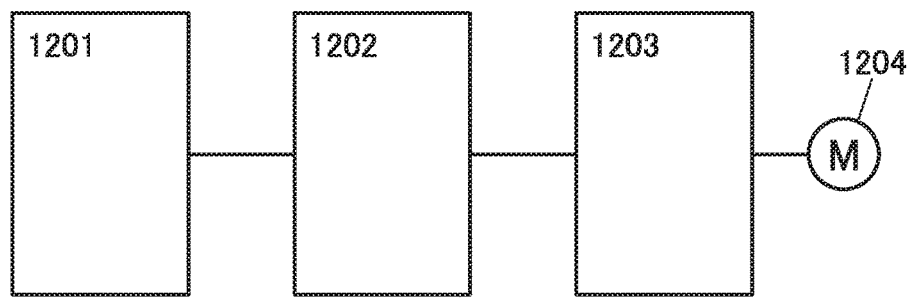

The semiconductor device described in the above embodiment can be used for a motor driving device that controls motor operation, or the like. FIG. 35B is a block diagram of a motor driving device 1200 as an example. The motor driving device 1200 includes a controller 1201, a pre-driver 1202, a voltage generation circuit 1203, and a motor 1204. The semiconductor device described in the above embodiment can be used for the pre-driver 1202, for example.

The voltage generation circuit 1203 is a circuit for generating a voltage supplied to the motor 1204. As the voltage generation circuit 1203, for example, a power transistor may be used. The pre-driver 1202 is a circuit for driving the voltage generation circuit 1203. Thus, the voltage outputted from the voltage generation circuit 1203 is controlled by the pre-driver 1202.

The controller 1201 supplies a signal that determines the output of the motor 1204 to the pre-driver 1202. The controller 1201 can determines the output of the motor 1204 according to data obtained from a sensor that is separately provided.

Note that this embodiment can be combined as appropriate with any of the other embodiments and an example in this specification.

(Embodiment 8)

In this embodiment, application examples of the semiconductor device and the like described in the foregoing embodiment to an electronic component and to an electronic device including the electronic component will be described with reference to FIGS. 36A and 36B and FIGS. 37A and 37B. Note that an electronic component is also referred to as semiconductor package or IC package. This electronic component has a plurality of standards and names depending on a terminal extraction direction and a terminal shape. In this embodiment, an example of an electronic component is described.

The electronic component can be completed in an assembly process (post-process) in which the semiconductor device described in the above embodiment and a component other than the semiconductor device are combined.

Figure 36A:
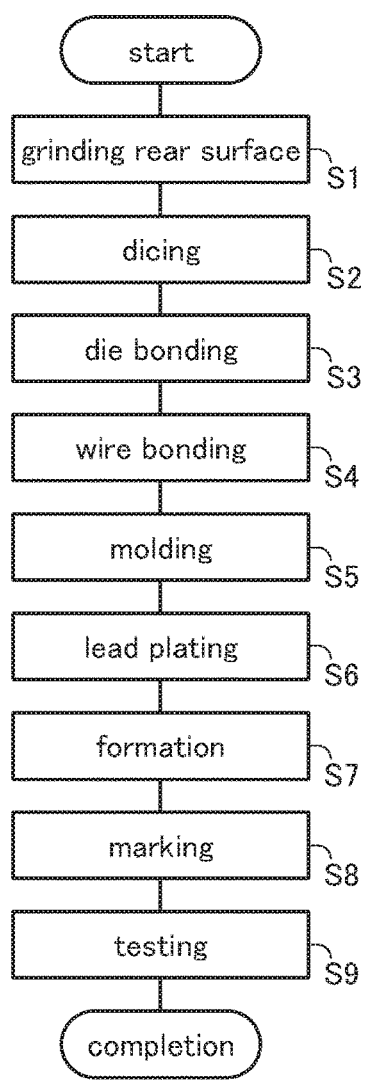
FIGS. 36A and 36B are a flow chart showing an example of steps for manufacturing electronic components and a schematic perspective view thereof.

The post-process is described with a flow chart shown in FIG. 36A. After an element substrate provided with the semiconductor device described in the above embodiment is completed (pre-process), a back surface (surface where a semiconductor device or the like is not provided) of the element substrate is ground as a step of grinding a rear surface (Step S1). The element substrate is made thin by the grinding step, whereby the element substrate is less likely to warp, and a reduction in size of electronic component can be achieved.

Next, a dicing step of dividing the element substrate into a plurality of chips is performed (Step S2). Then, the divided chips are separately picked up to be mounted on and bonded to a lead frame in a die bonding process (Step S3). To bond a chip and a lead frame in the die bonding step, resin bonding, tape-automated bonding, or the like is selected as appropriate depending on products. Note that a chip may be bonded to an interposer instead of the lead frame.

Next, a wire bonding step for electrically connecting a lead of the lead frame and an electrode on the chip through a metal wire is performed (Step S4). As a metal wire, a silver wire or a gold wire can be used. For wire bonding, ball bonding or wedge bonding can be employed.

The wire-bonded chip is subjected to a molding step of sealing the chip with an epoxy resin or the like (Step S5). Through the molding step, the inside of the electronic component is filled with a resin, so that a circuit portion incorporated in the chip and wire for connecting the chip to the lead can be protected from external mechanical force, and deterioration of characteristics (decrease in reliability) due to moisture or dust can be reduced.

Subsequently, the lead of the lead frame is plated in a lead plating step (Step S6). This plating process prevents rust of the lead and facilitates soldering at the time of mounting the chip on a printed wiring board in a later step. Then, the lead is cut and processed in a formation step (Step S7).

Next, a printing (marking) step is performed on a surface of the package (Step S8). After a testing step (Step S9) for checking whether an external shape is good and whether there is malfunction, for example, the electronic component is completed.

The above electronic component can include the transistor described in the above embodiments. Thus, the electronic component including the semiconductor device in which the frequency of malfunction in a high-temperature environment is reduced and manufacturing cost is reduced can be obtained. Since the electronic component includes the semiconductor device in which the frequency of malfunction in a high-temperature environment is reduced and manufacturing cost is reduced, limit of the electronic component on a usage environment is relieved and the size of the electronic component is reduced.

Figure 36B:
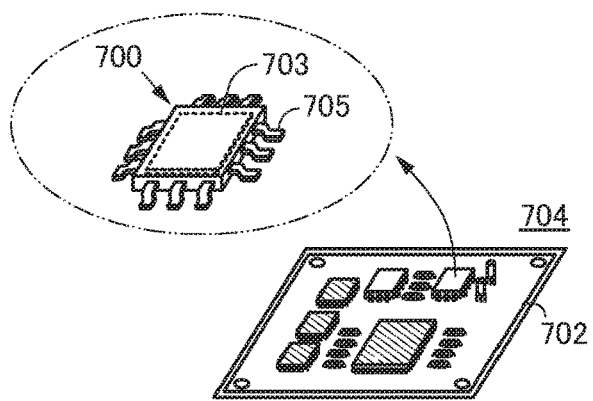

FIG. 36B is a schematic perspective diagram of a completed electronic component. FIG. 36B illustrates a schematic perspective view of a quad flat package (QFP) as an example of the electronic component. An electronic component 700 illustrated in FIG. 36B includes a lead 705 and a semiconductor device 703. As the semiconductor device 703, a semiconductor device described in the above embodiment can be used.

The electronic component 700 in FIG. 36B is mounted on a printed wiring board 702, for example. The plurality of electronic components 700 are used in combination to be electrically connected to each other over the printed wiring board 702; thus, a circuit board on which the electronic components are mounted (a circuit board 704) is completed. The completed mounted board 704 is used in an electronic device or the like.

Figure 37A:
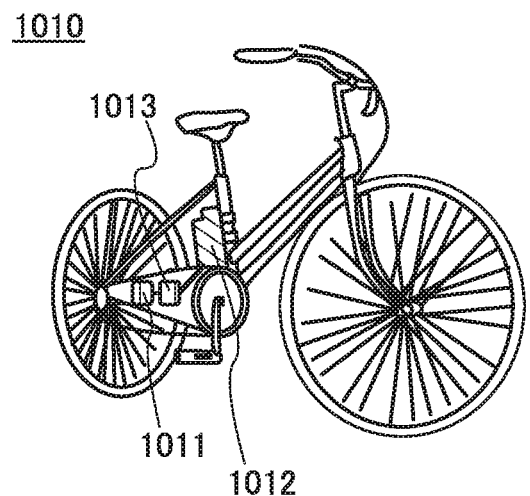
FIGS. 37A and 37B each illustrate an example of an electronic device.
Figure 37B:
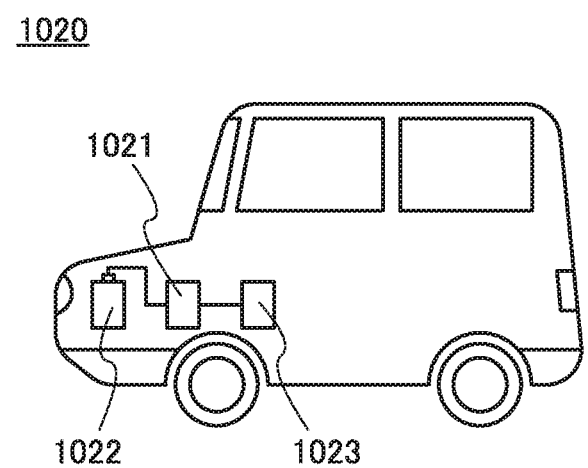

Next, with reference to FIGS. 37A and 37B, application examples of the electronic components which are applied to a driver circuit for driving an inverter, a motor, or the like, which is provided in a vehicle that is driven with power from a fixed power supply (e.g., a bicycle), are described.

FIG. 37A illustrates an electric bicycle 1010 as an application example. The electric bicycle 1010 obtains power when current is fed through a motor unit 1011. The electric bicycle 1010 includes a power storage device 1012 for supplying current fed through the motor unit 1011 and a driver circuit 1013 for driving the motor unit 1011. Note that although a pedal is illustrated in FIG. 37A, the pedal is not necessarily provided.

A mounted board provided with an electronic component including the semiconductor device described in the foregoing embodiment is incorporated in the driver circuit 1013. Thus, an electric bicycle including a smaller electronic component can be obtained. In addition, a low-power electric bicycle with a long cruising distance can be obtained. Moreover, a highly reliable electric bicycle can be obtained.

FIG. 37B illustrates an electric car 1020 as another application example. The electric car 1020 obtains power when current flows through a motor unit 1021. The electric car 1020 includes a power storage device 1022 for supplying current fed through the motor unit 1021 and a driver circuit 1023 for driving the motor unit 1021.

A mounted board provided with an electronic component including the semiconductor device described in the foregoing embodiment is incorporated in the driver circuit 1023. Thus, an electric vehicle including a smaller electronic component can be obtained. In addition, a low-power electric vehicle with a long cruising distance can be obtained. Moreover, a highly reliable electric vehicle can be obtained.

An electronic component including the semiconductor device described in any of the above embodiments is applicable not only to electric vehicles (EV) but also to hybrid electric vehicles (HEV), plug-in hybrid electric vehicles (PHEV), and the like.

As described above, a broad on which an electronic component including the semiconductor device described in the above embodiment is provided is mounted on each of the electronic devices described in this embodiment. Thus, an electronic device including a smaller electronic component can be obtained. In addition, a low-power electronic device can be obtained. Moreover, a highly reliable electronic device can be obtained.

This embodiment can be implemented in appropriate combination with any of the structures described in the other embodiments and the like.

(Embodiment 9)

Figure 38:
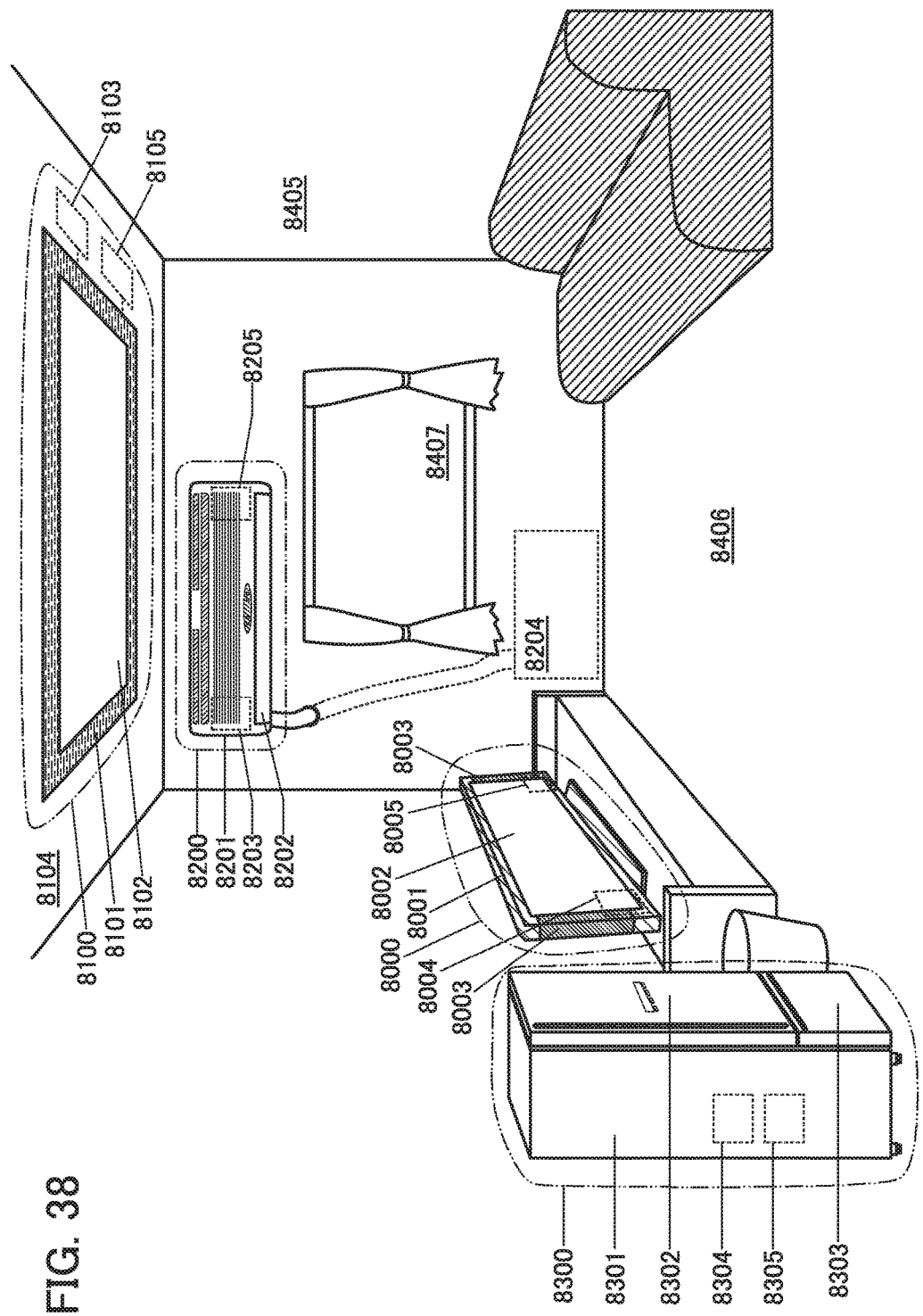
FIG. 38 illustrates an example of an electronic device.

A semiconductor device of one embodiment of the present invention can be used for control circuits in a variety of electronic devices. FIG. 38 illustrates specific examples of the electronic devices using a semiconductor device of one embodiment of the present invention.

Specific examples of semiconductor devices each using the semiconductor device of one embodiment of the present invention are as follows: display devices of televisions, monitors, and the like, lighting devices, desktop personal computers and laptop personal computers, word processors, image reproduction devices which reproduce still images and moving images stored in recording media such as digital versatile discs (DVDs), portable CD players, portable radios, tape recorders, headphone stereos, stereos, table clocks, wall clocks, cordless phone handsets, transceivers, mobile phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid.

In addition, moving objects driven by electric motors using electric power from the power storage devices are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

FIG. 38 illustrates examples of electronic devices. In FIG. 38, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can control driving of a cooling fan in the display device 8000, emission luminance adjustment, and the like. The display device 8000 can receive electric power from a commercial power supply. Alternatively, the display device 8000 can use electric power stored in the power storage device 8005.

A display device such as a liquid crystal display device, a light-emitting device in which a light-emitting element such as an organic EL element is provided in each pixel, an electrophoresis display device, a digital micromirror device (DMD), a plasma display panel (PDP), or a field emission display (FED) can be used for the display portion 8002.

Note that the display device includes, in its category, all of information display devices for personal computers, advertisement displays, and the like besides TV broadcast reception.

In FIG. 38, an installation lighting device 8100 is an example of an electronic device including a semiconductor device 8103 of one embodiment of the present invention. Specifically, the lighting device 8100 includes a housing 8101, a light source 8102, the semiconductor device 8103, and a power storage device 8105. Although FIG. 38 illustrates the case where the semiconductor device 8103 is provided in a ceiling 8104 on which the housing 8101 and the light source 8102 are installed, the semiconductor device 8103 may be provided in the housing 8101. The semiconductor device 8103 can adjust the emission luminance of the light source 8102 and the like. The lighting device 8100 can receive electric power from a commercial power source or use electric power stored in the power storage device.

Note that although the installation lighting device 8100 provided in the ceiling 8104 is illustrated in FIG. 38 as an example, the semiconductor device of one embodiment of the present invention can be used as an installation lighting device provided in, for example, a wall 8405, a floor 8406, a window 8407, or the like other than the ceiling 8104. Alternatively, the semiconductor device can be used in a tabletop lighting device or the like.

As the light source 8102, an artificial light source which emits light artificially by using electric power can be used. Specifically, an incandescent lamp, a discharge lamp such as a fluorescent lamp, and light-emitting elements such as an LED and an organic EL element are given as examples of the artificial light source.

In FIG. 38, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 38 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can control operation of a motor used for a compressor in the air conditioner. The air conditioner can receive power from a commercial power supply. The air conditioner can also use power stored in the power storage device 8205.

Although the separated air conditioner including the indoor unit and the outdoor unit is illustrated in FIG. 38 as an example, the semiconductor device of one embodiment of the present invention can be used in an air conditioner in which the functions of an indoor unit and an outdoor unit are integrated in one housing.

In FIG. 38, an electric refrigerator-freezer 8300 is an example of an electronic device including a semiconductor device 8304 of one embodiment of the present invention. Specifically, the electric refrigerator-freezer 8300 includes a housing 8301, a door for a refrigerator 8302, a door for a freezer 8303, the semiconductor device 8304, a power storage device 8305, and the like. With the semiconductor device 8304 provided in the housing 8301 in FIG. 38, the power storage device 8305 can control operation of a motor used for a compressor in the electric refrigerator-freezer 8300. The electric refrigerator-freezer 8300 can receive electric power from a commercial power supply. Alternatively, the electric refrigerator-freezer 8300 can use electric power stored in the power storage device 8305.

Figure 39A:
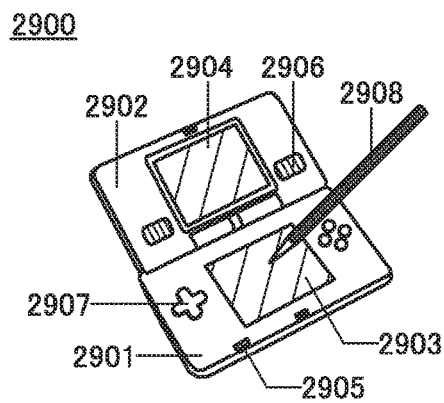
FIGS. 39A to 39G each illustrate an example of an electronic device.

A portable game machine 2900 illustrated in FIG. 39A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 39A has the two display portions 2903 and 2904, the number of display portions included in a portable game machine is not limited to this. The display portion 2903 is provided with a touch screen as an input device, which can be handled with a stylus 2908 or the like.

Figure 39B:
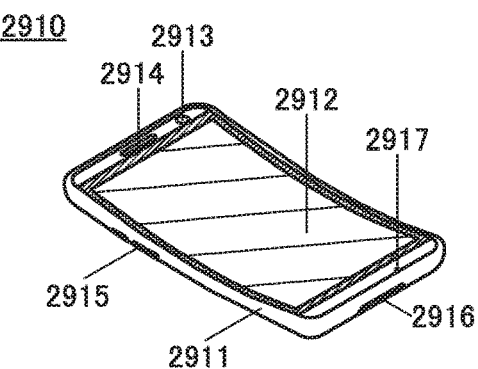

An information terminal 2910 illustrated in FIG. 39B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 39C:
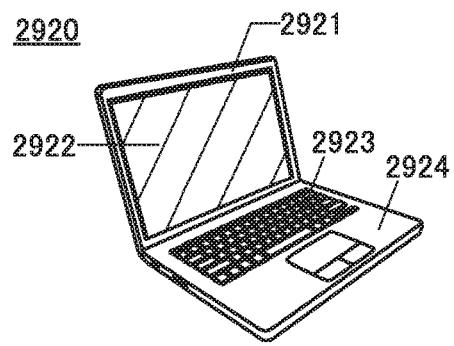

A notebook personal computer 2920 illustrated in FIG. 39C includes a housing 2921, a display portion 2922, a keyboard 2923, a pointing device 2924, and the like. In addition, the notebook personal computer 2920 includes an antenna, a battery, and the like inside the housing 2921.

Figure 39D:
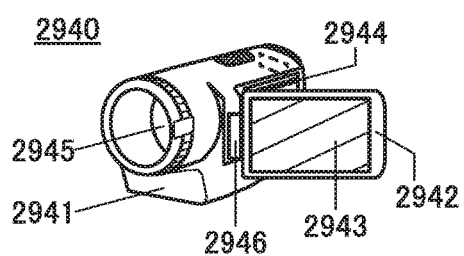

A video camera 2940 in FIG. 39D includes a housing 2941, a housing 2942, a display portion 2943, operation switches 2944, a lens 2945, a joint 2946, and the like. The operation switches 2944 and the lens 2945 are provided in the housing 2941, and the display portion 2943 is provided in the housing 2942. In addition, the video camera 2940 includes an antenna, a battery, and the like inside the housing 2941. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 39E:
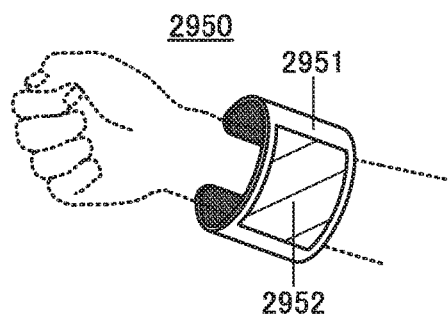

FIG. 39E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 39F:
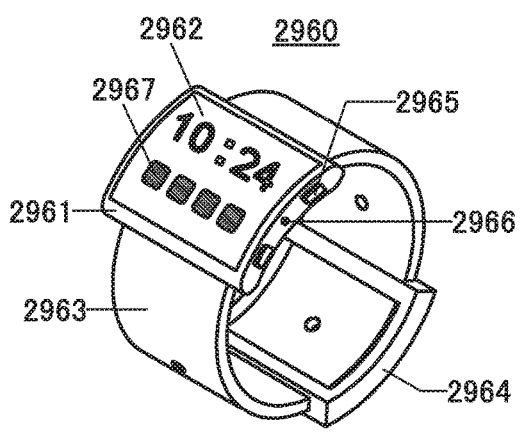

FIG. 39F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Further, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the portable information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 39G:
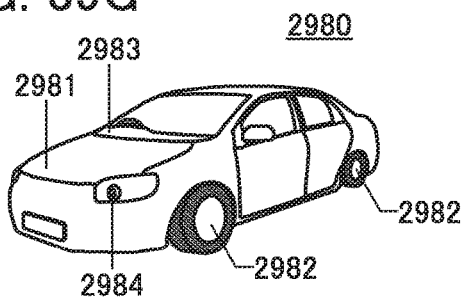

FIG. 39G is an external view illustrating a structure example of a motor vehicle. A motor vehicle 2980 includes a car body 2981, wheels 2982, a dashboard 2983, lights 2984, and the like. The motor vehicle 2980 includes an antenna, a battery, and the like.

The semiconductor device of one embodiment of the present invention can be used for the display portion, the light-emitting portion, the control portion such as a motor, or the like of the above-described electronic devices. Note that among the above electronic devices, particularly, a high-frequency heating apparatus such as a microwave oven and an electronic device such as an electric rice cooker require high power in a short time. In addition, it is required to control high power stably for a certain period of time. With use of the semiconductor device of one embodiment of the present invention, electric power can be controlled stably, whereby a highly reliable electronic device can be achieved.

This embodiment can be implemented in appropriate combination with the structures described in the other embodiments and the like.

[Example]

Figure 40:
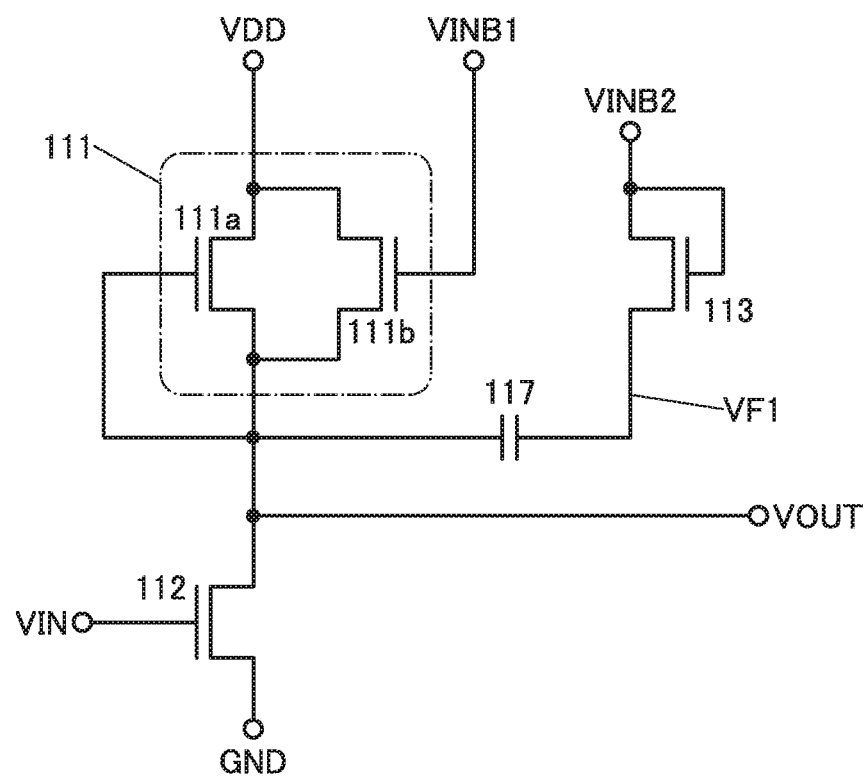
FIG. 40 is a circuit model for verifying operation of a semiconductor device.

The operation of the semiconductor device 100 was examined with a circuit simulator, SmartSpice (ver. 4.10.6.R), manufactured by Silvaco Data Systems Inc. FIG. 40 shows a circuit model used for the examination. Since the circuit simulator has no model of a transistor with a back gate, a model in which a transistor 111a and a transistor 111b are arranged in parallel to each other was used as a transistor 111.

Main parameters were set as follows: Level was 36; VTO was 0.4197 V; the thickness of a gate insulating film was 20 nm; L/W of the transistor 111a was 0.5 μm/300 μm; L/W of the transistor 111b was 0.5 μm/300 μm; L/W of the transistor 112 was 0.5 μm/1000 μm; L/W of the transistor 113 was 0.5 μm/400 μm; the capacitance of the capacitor 117 was 10 pF; $V_{DD}$ was 3.3 V; and GND and $V_{SS}$ were 0V.

In the circuit diagram in FIG. 40, $V_{IN}$ denotes a signal supplied to the terminal 102. $V_{OUT}$ denotes a signal supplied to the terminal 105. $V_{INB1}$ denotes a signal supplied to the wiring 124. $V_{INB2}$ denotes a single supplied to the wiring 123. $V_{F1}$ denotes a potential of the node 132.

Figure 41:
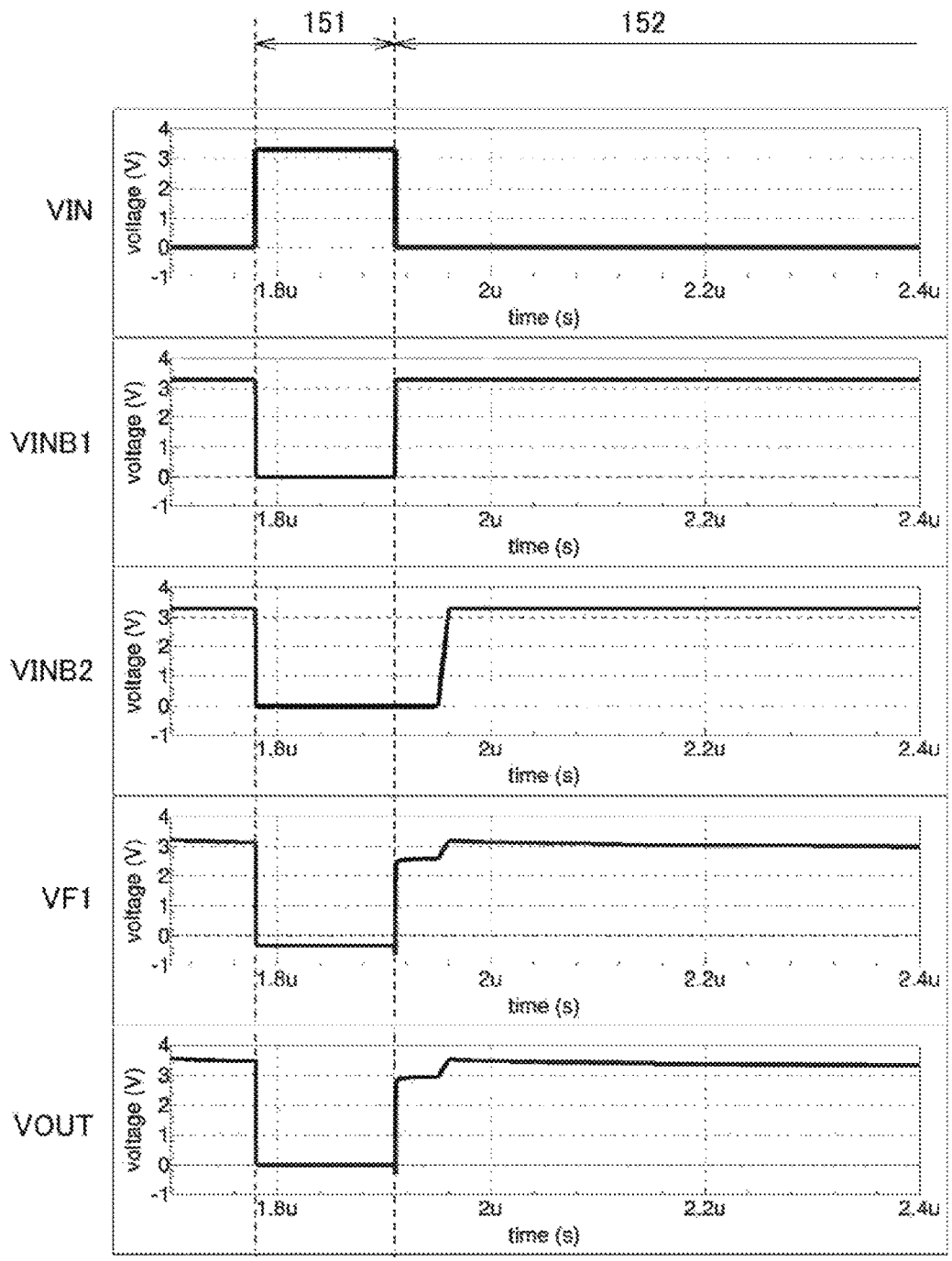
FIG. 41 shows a result of verifying operation of the semiconductor device.

FIG. 41 shows the examination results. In a period 151, when $V_{IN}$ becomes to have the H potential ($V_{DD}$), $V_{OUT}$ becomes to have the L potential (GND=$V_{SS}$). In a period 152, when $V_{IN}$ becomes to have the L potential, $V_{OUT}$ becomes to have the H potential or higher. According to the examination results, the semiconductor device 100 can function as an inverter circuit.

This application is based on Japanese Patent Application serial no. 2015-185539 filed with Japan Patent Office on Sep. 18, 2015 and Japanese Patent Application serial no. 2015-187874 filed with Japan Patent Office on Sep. 25, 2015, the entire contents of which are hereby incorporated by reference.

What is claimed is:

1. A semiconductor device having an inverter circuit, the inverter circuit comprising:
a first transistor;
a second transistor;
a third transistor;
a fourth transistor; and
a first capacitor,
wherein the first transistor includes a first gate and a second gate,
wherein one of a source and a drain of the first transistor is directly connected to the first gate of the first transistor,
wherein the other of the source and the drain of the first transistor is electrically connected to a first wiring,
wherein the second gate of the first transistor is electrically connected to a second wiring,
wherein one of a source and a drain of the second transistor is directly connected to the one of the source and the drain of the first transistor,
wherein the other of the source and the drain of the second transistor is electrically connected to a third wiring,
wherein one of a source and a drain of the third transistor is electrically connected to a fourth wiring,
wherein the other of the source and the drain of the third transistor is electrically connected to a first electrode of the first capacitor,
wherein a gate of the third transistor is electrically connected to the fourth wiring,
wherein a second electrode of the first capacitor is electrically connected to the one of the source and the drain of the first transistor,
wherein one of a source and a drain of the fourth transistor is directly connected to the other of the source and the drain of the third transistor,
wherein the other of the source and the drain of the fourth transistor is electrically connected to the third wiring,
wherein a gate of the fourth transistor is electrically connected to a gate of the second transistor,
wherein a semiconductor layer in which a channel is formed of the first transistor is positioned between the first gate and the second gate of the first transistor, and
wherein each of the first to fourth transistors is an n-channel transistor.

2. The semiconductor device according to claim 1,
wherein one of the first gate and the second gate of the first transistor functions as a gate, and
wherein the other of the first gate and the second gate of the first transistor functions as a back gate.

3. The semiconductor device according to claim 1,
wherein one of the first transistor and the second transistor includes a semiconductor layer in which a channel is formed, the semiconductor layer including an oxide semiconductor.

4. An electronic device comprising:
the semiconductor device according to claim 1; and
one of a motor, a power storage device, a high-frequency heating apparatus, and a cooling device.

5. The semiconductor device according to claim 1,
wherein the second wiring is not electrically connected to the one of the source and the drain of the second transistor.

6. The semiconductor device according to claim 1,
wherein the second electrode of the first capacitor is electrically connected to a first terminal.

7. The semiconductor device according to claim 1,
wherein each of the first transistor, the second transistor, the third transistor, and the fourth transistor includes a semiconductor layer in which a channel is formed, the semiconductor layer including an oxide semiconductor.

8. A semiconductor device having an inverter circuit, the inverter circuit comprising:
a first transistor;
a second transistor;
a third transistor; and
a first capacitor,
wherein one of a source and a drain of the first transistor is directly connected to a first gate of the first transistor and one of a source and a drain of the second transistor,
wherein a second gate of the first transistor is electrically connected to a wiring,
wherein one of a source and a drain of the third transistor is directly connected to a gate of the third transistor,
wherein the other of the source and the drain of the third transistor is electrically connected to a first electrode of the first capacitor,
wherein a second electrode of the first capacitor is electrically connected to the one of the source and the drain of the second transistor,
wherein a semiconductor layer in which a channel is formed of the first transistor is positioned between the first gate and the second gate of the first transistor,
wherein each of the first to third transistors is an n-channel transistor, and
wherein the wiring is not electrically connected to the one of the source and the drain of the second transistor.

9. The semiconductor device according to claim 8,
wherein the second electrode of the first capacitor is electrically connected to a first terminal.

10. The semiconductor device according to claim 8,
wherein each of the second transistor and the third transistor includes a semiconductor layer in which a channel is formed, and
wherein the semiconductor layers of the first transistor, the second transistor, and the third transistor each include an oxide semiconductor.

11. A semiconductor device having an inverter circuit, the inverter circuit comprising:
a first transistor;
a second transistor;
a third transistor; and
a first capacitor,
wherein the first transistor includes a first gate and a second gate,
wherein one of a source and a drain of the first transistor is directly connected to the first gate of the first transistor,
wherein the other of the source and the drain of the first transistor is electrically connected to a first wiring,
wherein the second gate of the first transistor is electrically connected to a second wiring, wherein one of a source and a drain of the second transistor is directly connected to the one of the source and the drain of the first transistor, wherein the other of the source and the drain of the second transistor is electrically connected to a third wiring, wherein one of a source and a drain of the third transistor is electrically connected to a fourth wiring, wherein the other of the source and the drain of the third transistor is electrically connected to a first electrode of the first capacitor, wherein a first gate of the third transistor is electrically connected to the fourth wiring, wherein a second electrode of the first capacitor is electrically connected to the one of the source and the drain of the second transistor, wherein a semiconductor layer in which a channel is formed of the first transistor is positioned between the first gate and the second gate of the first transistor, and wherein each of the first to third transistors is an n-channel transistor.

12. The semiconductor device according to claim 11, wherein the second transistor includes a first gate and a second gate, and wherein the second gate of the second transistor is electrically connected to the first gate of the second transistor.

13. The semiconductor device according to claim 11, wherein the second transistor includes a first gate and a second gate, and wherein the second gate of the second transistor is electrically connected to the other of the source and the drain of the second transistor.

14. The semiconductor device according to claim 11, wherein each of the second transistor and the third transistor includes a semiconductor layer in which a channel is formed, and wherein the semiconductor layers of the first transistor, the second transistor, the third transistor each include an oxide semiconductor.

* * * * *